United States Patent
Hanzawa et al.

(10) Patent No.: US 6,512,714 B2
(45) Date of Patent: Jan. 28, 2003

(54) SEMICONDUCTOR MEMORY DEVICE EQUIPPED WITH DUMMY CELLS

(75) Inventors: Satoru Hanzawa, Hachioji (JP); Takeshi Sakata, Hino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/942,558

(22) Filed: Aug. 31, 2001

(65) Prior Publication Data

US 2002/0136074 A1 Sep. 26, 2002

(30) Foreign Application Priority Data

Feb. 15, 2001 (JP) ........................................ 2001-038237

(51) Int. Cl.[7] ................................................. G11C 7/02
(52) U.S. Cl. ........................ 365/210; 365/208; 365/206
(58) Field of Search ................................. 365/187, 210, 365/208, 206

(56) References Cited

U.S. PATENT DOCUMENTS 4,408,304 A * 10/1983 Nishizawa et al. ......... 365/174
6,314,017 B1 * 11/2001 Emori et al. ................ 365/149

FOREIGN PATENT DOCUMENTS

JP 9-213812 8/1997 ......... H01L/21/8242

OTHER PUBLICATIONS

Regitz, W. M., "A Three-Transistorcell, 1024-Bit, 500 NS MOS RAM," IEEE International Solid-State Circuits Conference, Digest of Technical Papers, 1970, pp. 42–43.
Nakazato, Kazuo et al., "Phase-state Low Electron-number Drive Random Access Memory (PLEDM)," IEEE Internatianal Solid-State Circuits Conferences, Digest of Technical Papers, 2000, pp. 132–133.

* cited by examiner

*Primary Examiner*—Andrew Q. Tran

(57) ABSTRACT

There are provided a reference voltage generating method used for reading out operation of a memory cell having amplification ability, and a dummy cell. The memory cell is composed of a read NMOS transistor, a write transistor, and a coupled-capacitance. The dummy cell is made such that two memory cells are connected in series. The dummy cell is arranged at the most far end of each of the data lines against the sense amplifier. A reference voltage is generated by making a difference in an amount of current flowing in each of the read NMOS transistors of the memory cell and the dummy cell. As a result, DRAM showing a higher speed, a higher integration and a lower electrical power as compared with those of the prior art device can be realized.

18 Claims, 32 Drawing Sheets

SEMICONDUCTOR MEMORY DEVICE EQUIPPED WITH DUMMY CELLS

BACKGROUND OF THE INVENTION

This invention relates to a semiconductor device and more particularly to a semiconductor device including high reliable, high-speed and highly integrated memories using memory cells having an amplification ability.

As a dynamic random access memory (hereinafter referred to as "DRAM"), it is widely known to provide a configuration in which one transistor cell comprised of one-transistor and one-capacitor is applied as a memory cell. However, the semiconductor device in recent years shows some problems of a reduction in breakdown voltage characteristic of MOS transistor as a size of the MOS transistor is made fine and of an increased power consumption accompanied by a high density integration as the MOS transistor is processed to have a high density integration and scale down. As a result, its operative voltage becomes low to solve these problems and fulfill the requirement of further low power consumption. Due to this fact, no amplification ability is found in the memory cell itself in the DRAM having one-transistor cell. Consequently, an amount of read signals from the memory cell is low, and its operation may receive various kinds of noise and easily become unstable.

In view of this fact, as a memory cell capable of obtaining larger signal voltage through amplification ability, a memory cell, composed of three transistors, which has been employed before one-transistor cell is practically used (hereinafter referred to as "three-transistor cell") receives attention again.

The three-transistor cell has already been described in IEEE International Solid-State Circuits Conference, DIGEST OF TECHNICAL PAPERS, pp.42–43, 1970, for example. As shown in FIG. 2, this memory cell (hereinafter called as "MCT") is composed of NMOS transistors R, W, S. When a writing operation is carried out for the memory cell MCT, data is written into a memory node NS from a data bus DBUS through a transistor W. When stored information is read out, a transistor R is activated and a read bus RBUS is driven to a potential corresponding to a potential of the memory node NS.

Further, as another memory cell having an amplification ability, the capacitance-coupled type two-transistor cell composed of two transistors and one capacitor has already been described in IEEE International Solid-State Circuits Conference, DIGEST OF TECHNICAL PAPERS, pp.132–133, 2000 (hereinafter referred to as a document No.1). As shown in FIG. 3, this memory cell MC is composed of a read NMOS transistor QR, a write transistor QW and a coupled-capacitance Cc. The read NMOS transistor QR is a normal MOSFET. In addition, each of the write transistor QW and the coupled-capacitance Cc is called in the document No.1 as a stacked tunnel transistor PLEDTR and a built-in capacitor, respectively.

A feature of this memory cell MC consists in, at first, a structure in which the read NMOS transistor QR and the write transistor QW are stacked up. Thus, a cell area can be made small. That is, an area of the memory cell having the prior art one-transistor employed therein is about 8 $F^2$ (F: Feature size (minimum machining size)) and to the contrary, an area of the memory cell MC using the two-transistor is as low as 4 to 6 $F^2$.

A second feature of this memory cell MC consists in reduction of a leak current under application of the write transistor utilizing a tunneling effect. With such an arrangement as above, although a refreshing operation is also required in the same manner as that of the prior art DRAM, its frequency in operation is well decreased as compared with that of the prior art.

These elements are connected such that one end of the coupled-capacitance Cc and a gate terminal of the write transistor QW are connected to a word line WL and a source terminal of the write transistor QW is connected to a write data line DW (called as "data line" in the document No.1). The other end of the coupled-capacitance Cc and a drain terminal of the write transistor QW are connected to a gate terminal of the NMOS transistor QR, thus forming a memory node. Further, a source terminal of the read NMOS transistor QR is connected to the ground and the drain terminal is connected to the read data line DR (called as "a sense line" in the document No.1). When the stored information is read out, the read NMOS transistor QR is activated and the read data line DR is driven to a potential corresponding to a potential of the memory node.

To the contrary, a reading operation is carried out in the DRAM using the prior art one-transistor cell while a half value VDD/2 of the power supply voltage VDD is applied as a reference voltage. That is, one data line is driven to either VDD/2+VS or VDD/2−VS in response to the stored information of the memory cell selected after the pair of data lines are precharged to VDD/2. Either a small potential+VS or a small potential−VS between one data line driven to this potential and the other data line held at the precharge potential is amplified by a sense amplifier and data is readout. That is, the stored information is discriminated in reference to either a positive or negative signal generated in the pair of data lines in response to the stored information in the memory cell.

However, when the memory cell showing the amplification ability described above is used, only signals having either one of the polarities are present as the signals generated in the pair of data lines. For example, when the stored information "1" of high potential where the transistor S is brought into conduction in the memory cell MCT shown in FIG. 2 is held in the memory node NS, the word line WL is driven to the read potential. Consequently, the transistor R is brought into conduction and the one data-line precharged to VDD/2, for example, is discharged toward the ground potential. At this time, negative signals can be obtained at the pair of data lines. In turn, when a low potential stored information "0" in which the transistor S is turned off is held at the memory node NS, even if the word line WL is driven to the read potential and the transistor R is activated, the transistor S is not brought into conduction. Therefore, the data line is held at the precharge potential VDD/2. Thus, no potential is generated at the pair of data lines, so that the stored information cannot be discriminated. A similar problem may also occur in the memory cell MC shown in FIG. 3.

In view of the foregoing, as a reading method to resolve the aforesaid problems in a memory cell having amplification ability, there has already been proposed a method disclosed in Japanese Patent Laid-open No. 9-213812, for example. In this prior art, a memory cell composed of a memory MIS (Metal Insulator Semiconductor) transistor M1 and a read MIS transistor Q1 isolated by an insulation film. Further, a dummy cell is connected to each of the read data lines. As this dummy cell in the aforesaid memory cell, the dummy cell in which the gate length of the memory MIS transistor M1 is set to about twice and the stored information of "1" is written into it is used. The pair of data lines is driven under application of such a memory cell and the dummy cell to read out the stored information.

In addition, in the prior art normal DRAM, the dummy cell was arranged one by one for every word line, data of one selected memory cell was driven and read out.

However, application of the method disclosed in the aforesaid Japanese Patent Laid-open No. 9-213812 to the memory cell array composed of the memory cell MC shown in FIG. 3 causes the data line wiring for use in writing the stored information "1" to the dummy cell in some cases of the arrangement of the dummy cell and further causes a memory cell array area to be increased. For example, when the data lines of the memory cell and the power supply line for the dummy cell are formed at the same layer, it is necessary to form each of the lines so as to cause the data lines to avoid the power supply line in some cases of the arrangement of the memory cell and the dummy cell. Consequently, the memory cell array area increases. The present invention has been made in order to solve the problems described above.

Accordingly, it is an object of the present invention to provide a semiconductor device capable of reading out the stored information held at each of the memory cells in the memory cell array composed of the memory cells MC shown in FIG. 3 while generating a positive or negative small signal at a pair of read data lines.

It is another object of the present invention to provide a semiconductor device having a memory cell array of small area while keeping continuity in the arrangement of the aforesaid memory cell MC and dummy cells, and the data line wirings, respectively.

It is a further object of the present invention to realize a high speed, low electrical power and high-integrated DRAM while assuring a high reliability in operation.

It is a still further object of the present invention to provide a semiconductor device capable of concurrently driving a plurality of data lines and reading out all the data connected to one word line.

SUMMARY OF THE INVENTION

A typical aspect of the present invention will be described in brief as follows.

That is, the semiconductor device of the present invention is characterized by comprising a memory cell array including a plurality of data lines, a plurality of word lines crossing the data lines, a dummy word line crossing the data lines, and a plurality of memory cells arranged at cross-points of a plurality of word lines and data lines; a dummy cell arranged at the cross-points of the dummy word line and the data line; and a sense amplifier connected to the data line, wherein the memory cell requires a refreshing operation and the memory cell array is arranged between the dummy cell and the sense amplifier.

In addition, the semiconductor device in accordance with the present invention is provided with a dummy cell for generating a reference voltage VREF(t), wherein the reference voltage VREF(t) may generate a voltage in such a way that it may become an approximate intermediate value of a potential V1(t) and V0(t) at a data lines driven by a memory cell MC holding either the stored information "1" or the stored information "0" as shown in FIG. 4. With such an arrangement as above, it is possible to generate a positive or negative small signal at a pair of read data lines and read out the stored information of the memory cells.

In this case, the dummy cells are arranged one by one for every data line, whereby it is possible to drive concurrently a plurality of data lines.

DESCRIPTION OF THE PREFERRED EMBODIMENT

Hereinafter, a semiconductor device according to preferred embodiments of the present invention will be described with reference to the accompanying drawings.

In the present specification, "MOS transistor" is expressed in an abbreviated form meaning a field effect transistor.

<Embodiment 1>

The present invention will be described with reference to one example in which a capacitance-coupled 2-transistor cell (hereinafter simply referred to as "a memory cell MC") indicated in the aforementioned document No.1 is applied to DRAM.

Figure 1:
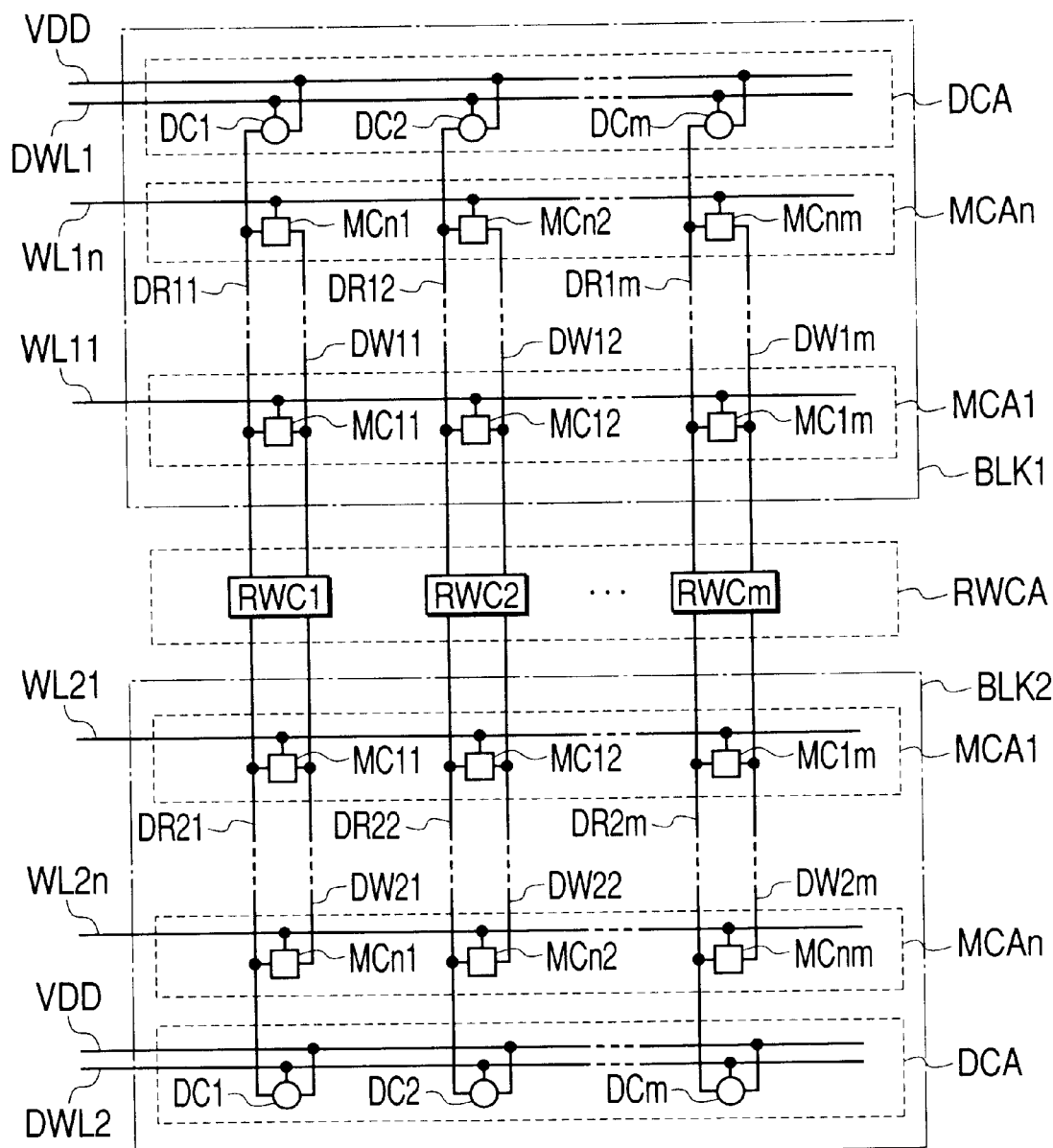
FIG. 1 is a view of configuration of a memory cell array, using capacitance-coupled type two-transistor cells, of a semiconductor device according to a first embodiment of the present invention.
Figure 2:
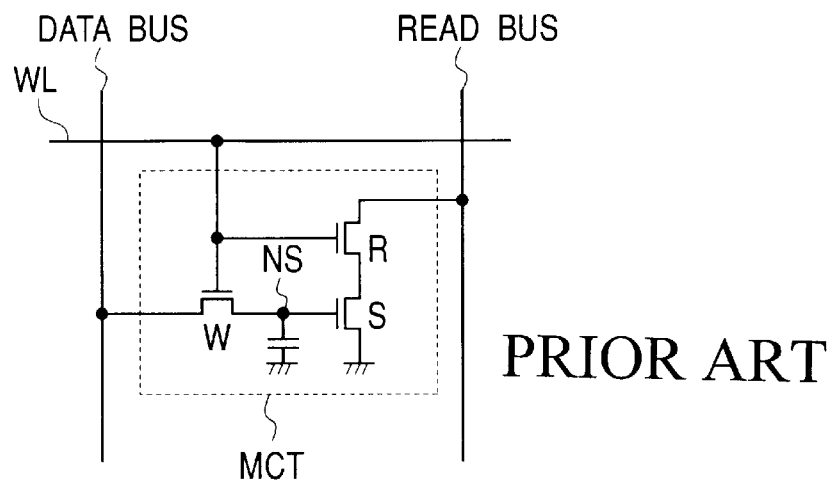
FIG. 2 is a view of a prior art memory cell composed of three transistors.

FIG. 1 is a circuit diagram showing a substantial part of a memory circuit of a semiconductor according to one embodiment of the present invention. In FIG. 1, reference character RWCA denotes a read/write control circuit array. The present embodiment has configuration of an open-data line structure in which each of blocks BLK1, BLK2 having memory cell arrays with n×m bits is arranged at both sides of the read/write control circuit array RWCA.

The read/write control circuit array RWCA includes the number of (m) of read/write control circuits RWC1, RWC2, . . . , RWCm. Each of the blocks BLK1, BLK2 includes the number of (n) of memory arrays MCA1, MCA2, . . . , MCAn and a dummy cell array DCA.

In this figure, a read data line DR and a write data line DW are indicated as a pair of data lines (DR, DW). The data line pairs of m sets (DR11, DW11), (DR12, DW12), . . . , (DR1m, DW1m) extend in a longitudinal direction in the block BLK1, and similarly the data line pairs of m sets (DR21, DW21), (DR22, DW22), . . . , (DR2m, DW2m) extend in a longitudinal direction in the block BLK2. In FIG. 1, six sets of the data line pairs are illustrated.

The m sets of the data line pairs are connected to the read/write control circuits RWCk (k=1, 2, . . . , m) in such a way that the data line pairs (DR11, DW11) and (DR21, DW21) are connected to the read/write control circuit RWC1, respectively, for example. In addition, in this figure, each of the number of (n) of word lines WL11, WL12, . . . , WL1n and the number of (n) of word lines WL21, WL22, . . . , WL2n extends in a lateral direction in such a way that they may cross at a right angle the number of sets (m) of data line pairs (DR1k, DW1k) and (DR2k, DW2k), and four of them are illustrated in the figure. Further, each of the dummy word lines DWL1, DWL2 extends in a lateral direction in the figure in such a way that the dummy word lines may cross at a right angle with the number of (m) of read data lines DR1k, DR2k. In each of the memory cell arrays MCA1, MCA2, . . . , MCAm, for example, each of the number of (m) of memory cells MC11, MC12, . . . , MC1m indicated by a square mark is arranged at each of cross-points between the word line WL11 and each of the number of sets (m) of the data line pairs (DR11, DW11), (DR12, DW12), . . . , (DR1m, DW1m), as indicated in the memory cell array MCA1, so as to form a one cross-point memory cell array.

In addition, at the dummy cell array DCA, each of the number of (m) of dummy cells DC1, DC2, . . . , DCm indicated by a round mark is arranged at a cross-point between the dummy word line DWL1 and each of the read data lines DR11, DR12, . . . , DR1m in the block BLK1, for example. Each of the elements and the circuit block in this figure are formed as LSI (Large-Scaled Semiconductor Integrated Circuit) on a semiconductor substrate such as a monolithic silicon and the like by a well-known semiconductor integrated circuit manufacturing technology.

A feature of the memory cell array in the embodiment includes the following two points in reference to a basic configuration of the block BLK2.

The first point consists in the fact that the memory cell arrays MCA1, MCA2, . . . , MCAn are arranged between the read/write control circuit array RWCA1 and the dummy cell array DCA. With this arrangement, since it is possible to form the dummy cell array DCA and the block BLK while a continuous arrangement of the memory cell MC and the dummy cell DC is being kept, increasing in a memory cell array area can be restricted as compared with that of merely applying the prior art reading method.

A second point consists in the fact that the dummy cell DC is composed of a series-connection of the two memory cells. With this arrangement, a total length of channels in the read NMOS transistors of the dummy cell DC becomes about twice of that of the memory cell MC and then the dummy cell DC can generate a reference voltage VREF(t) having such a characteristic as one indicated in FIG. 4. In this case, the reference voltage VREF(t) is such a voltage as one in which it becomes an approximate intermediate value of either the potential V1(t) or the potential V0(t) in the data line driven by the memory cell MC holding either the stored information "1" or "0". In addition, in FIG. 4, its ordinate indicates a voltage and its abscissa indicates a time (t). A feature of the aforesaid memory cell array will be described in detail below.

Figure 5:
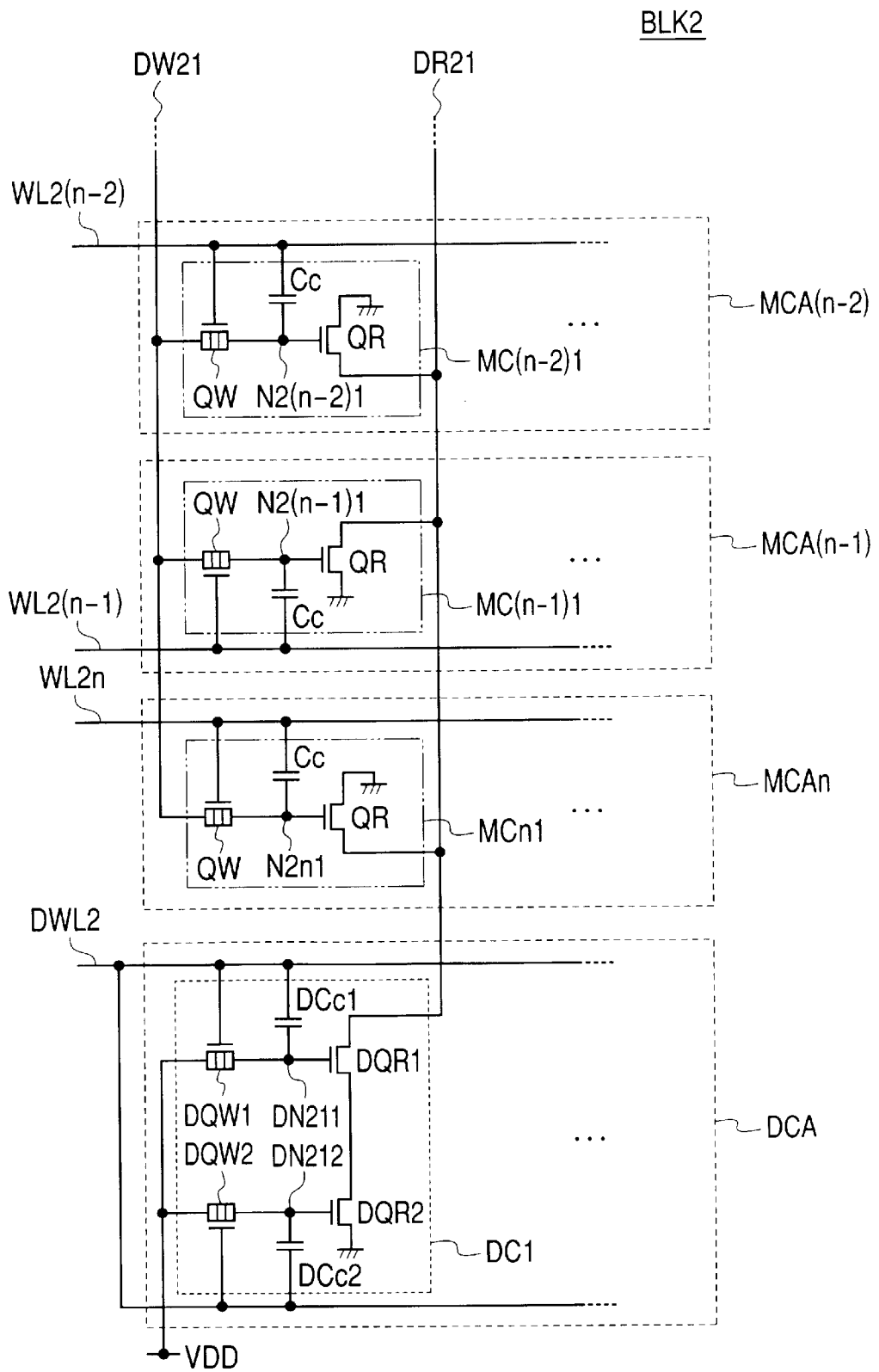
FIG. 5 is a circuit diagram showing an example of configuration of the memory cell and the dummy cell in the memory cell array shown in FIG. 1.

FIG. 5 shows practically a circuit in the block BLK2 in FIG. 1. In this figure are illustrated memory cells MC(n−2)1, MC(n−1)1 and MCn1 each of which is arranged at each of cross-points of the data line pairs (DR21, DW21) and the word lines WL2(n−2), WL2(n−1), WL2n; and a dummy cell DC1 arranged at a cross-point of the read data line DR21 and the dummy word line DWL2. The memory cell MC has the same configuration as that shown in FIG. 3. In FIG. 5, for example, a memory node N2n1 in the memory cell means a memory node at n-column and 1-row of the block BLK2.

In turn, the dummy cell DC1 includes read NMOS transistors DQR1, DQR2; write transistors DQW1, DQW2; and coupled capacitances DCc1, DCc2 for controlling the voltages of the memory nodes DN211, DN212 of the dummy cell. These elements are the same as each of the read NMOS transistor QR, the write transistor QW, and coupled-capacitance Cc for controlling the voltage of the memory node N, respectively.

The elements in the dummy cell are connected to each other as follows. That is, one end of the coupled-capacitance DCc1 and a gate terminal of the transistor DQW1 are connected to the dummy word line DWL2 and then a source terminal of the transistor DQW1 is connected to a power supply voltage VDD. The other end of the coupled-capacitance DCc1 and a drain terminal of the transistor DQW1 are connected to a gate terminal of the read NMOS transistor DQR1 to form the memory node DN211. Similarly, one end of the coupled-capacitance DCc2 and a gate terminal of the transistor DQW2 are connected to the dummy word line DWL2, and a source terminal of the transistor DQW2 is connected to the power supply voltage VDD. The other end of the coupled-capacitance DCc2 and a drain terminal of the transistor DQW2 are connected to a gate terminal of the read NMOS transistor DQR2 to form a memory node DN212. Further, a source terminal of the read NMOS transistor DQR1 and a drain terminal of the read NMOS transistor DQR2, a drain terminal of the read NMOS transistor DQR1 and the read data line DR21 are connected to each other and the source terminal of the read NMOS transistor DQR2 is connected to the ground. In FIG. 5, for example, the memory node DN211 means a memory node formed at the gate electrode of the read NMOS transistor DQR1 at the dummy cell DC1 in the block BLK2.

Figure 6:
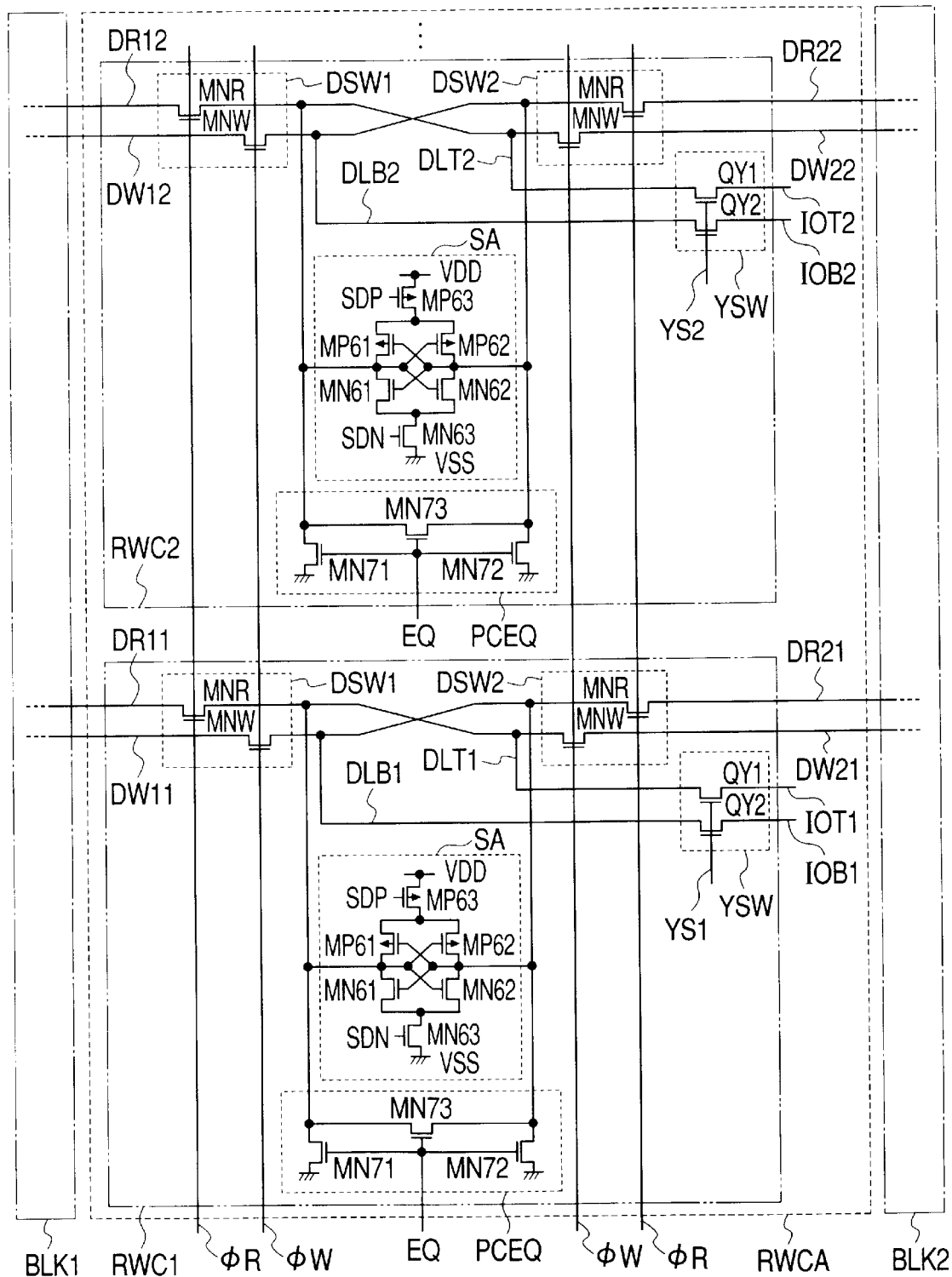
FIG. 6 shows an example of configuration of a read/write control circuit of the semiconductor device according to the first embodiment of the present invention.

Then, the read/write control circuit RWC for use in controlling a read/write operation of the memory cell array in the preferred embodiment will be described. FIG. 6 illustrates the read/write control circuits RWC1 and RWC2. The read/write control circuits RWC1 and RWC2 each include data line control circuits DSW1, DSW2; a sense amplifier SA; a pre-charging circuit PCEQ; and a data line selection circuit YSW. The data line control circuits DSW1 and DSW2 include NMOS transistors MNR, MNW.

As shown in the figure, in the data line control circuit DSW1 in the read/write control circuit RWC1, for example, a source terminal of the transistor MNR is connected to the read data line DR11 of the block BLK1 and its drain terminal is connected to the data line DLT1, and a source terminal of the transistor MNW is connected to the write data line DW11 of the block BLK1 and its drain terminal is connected to the data line DLB1. Similarly, in the data line control circuit DSW2, a source terminal of the transistor MNR is connected to the read data line DR21 of the block BLK2 and its drain terminal is connected to the data line DLB1, and a source terminal of the transistor MNW is connected to a write data line DW21 of the block BLK2 and its drain terminal is connected to the data line DLT1.

In the following, the data lines DLTk and DLBk are paired with each-other and denoted as data line pairs (DLTk, DLBk) (where, k=1, 2, ..., m, and in the following k is used in the same meaning). Similarly, the read data lines DR1k and DR2k are paired with each other and denoted as the read data line pairs (DR1k, DR2k), and, the write data lines DW1k and DW2k are paired with each other and denoted as the write data line pairs (DW1k, DW2k).

When the read control signal φR connected to the gate terminal of the transistor MNR is driven to a boosted voltage VDH, the corresponding read data line pairs (DR1k, DR2k) are connected to the data line pairs (DLT, DLB), respectively. The boosted voltage VDH can be expressed as VDH=VDD+VTH, for example, where VDD is a power supply voltage and VTH is a threshold voltage of NMOS transistor. When a write control signal φW connected to the gate terminal of the transistor MNW is driven to a boosted voltage VDH, the corresponding write data line pairs (DW1k, DW2k) are connected to the data line pairs (DLBk, DLTk), respectively.

The sense amplifier SA is a flip-flop circuit composed of PMOS transistors MP61, MP62, and NMOS transistors MN61, MN62. When a sense amplifier exciting signal SDP is driven up to a ground potential VSS and the sense amplifier exciting signal SDN is driven up to the boosted voltage VDH, the power supply voltage VDD and the ground potential VSS are supplied to the source terminal of the corresponding MOS transistor through the PMOS transistor MP63 and the NMOS transistor MN63, respectively. Since the sense amplifier SA activated in this way may amplify the small voltage generated at the data line pairs (DLTk, DLBk), it is possible to perform a high speed discrimination of stored information in the memory cell.

The precharge circuit PCEQ is composed of the NMOS transistors MN71, MN72 and MN73. When the precharge enabling signal EQ is driven by the power supply voltage VDD, the precharge voltage VDD/2 is supplied to the data line pairs (DLTk, DLBk) through the transistors MN71, MN72, respectively. In addition, the transistor MN73 can also control the data line pairs (DLT, DLB) so that they may become the same potential each other.

The data line selection circuit YSW is composed of the NMOS transistors QY1, QY2. Operation of the data line selection circuit YSW in the read/write control circuit RWC1 will be described an example of the data line selection circuit. When the data line selection signal YS1 connected to the gates of NMOS transistors QY1, QY2 is driven to the boosted voltage VDH, the data line pairs (DLT1, DLB1) are connected to the common data line pairs IOT1, IOB1 through the drain and source terminals of the transistors QY1, QY2 in the data line selection circuit YSW, respectively.

Although not shown in FIGS. 1 and 6, the sense amplifier exciting signals SDP, SDN, the precharge enable signal EQ, the read control signal φR and the write control signal φW are controlled by the array control circuit. The array control circuit includes an address input signal terminal and an address decoder for use in performing a selective control of the read/write control circuit row RWCA, wherein an inputted address signal is decoded with an address decoder to generate a decode signal. Each of the sense amplifier exciting signals SDP, SDN, the precharge enable signal EQ, the read control signal φR and the write control signal φW is excited with this decode signal in such a way that the selected memory cell may specify the stored data line pairs (DR, DW).

In addition, the word line WL and the dummy word line DWL are connected to the driver circuit controlled by a row decoder. The row decoder includes an address input signal terminal and an address decoder for use in performing a selective control of the memory cell to perform a read/write operation, wherein the inputted address signal is decoded with the address decoder to generate the decode signal. The word line WL and the dummy word line DWL are excited through the driver circuit in such a way that the selected memory cell may specify the stored memory cell and the dummy cell with this decode signal.

Further, a data line selection signal YSk is connected to the driver circuit controlled by a column decoder. The column decoder includes an address input signal terminal and an address decoder for use in performing a selective control of the memory cell for performing a read/write operation, wherein the inputted address signal is decoded with the address decoder to generate a decode signal. The data line selection signal YSk is excited through the driver circuit by this decode signal in such a way that the selected memory cell may specify the memory cell contained in it.

Figure 7:
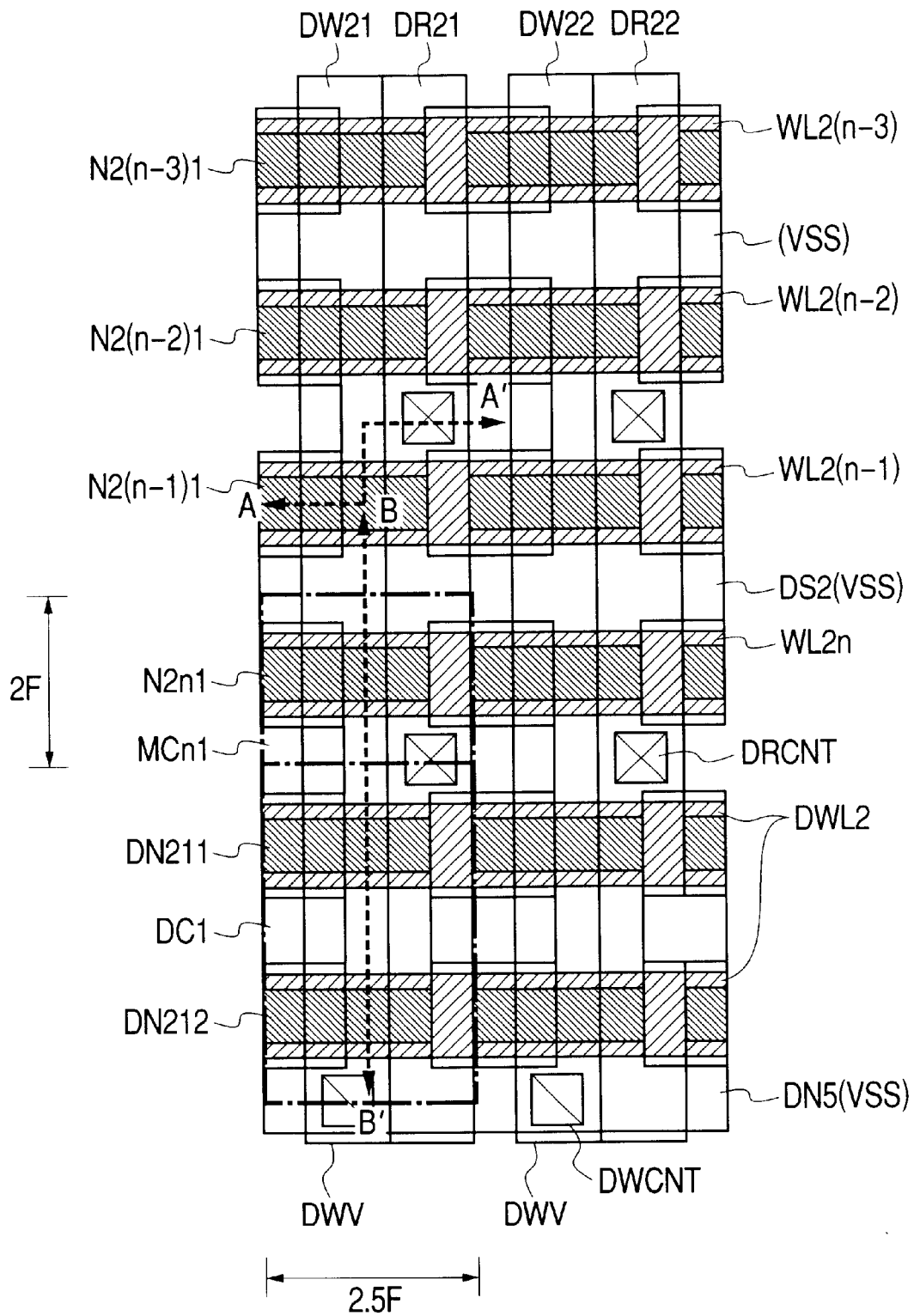
FIG. 7 is a diagram of a part of an example of layout of the memory cell array shown in FIG. 1.

FIG. 7 shows a part of the layout of the block BLK2 in the memory cell array configuration shown in FIGS. 1 and 6. In this figure, the two sets of data line pairs (DR21, DW21), (DR22, DW22) are shown in the longitudinal direction and the word lines WL2(n-3) to WL2n and the dummy word lines DWL2 are shown in the lateral direction. A memory node N is formed at cross-points of the data line pairs (DR, DW) and the word line WL, and in this figure, the memory nodes N2(n-3)1, N2(n-2)1, N2(n-1)1, N2n1 are represented there. Further, two memory nodes at the dummy cell are formed at cross-points of the read data line DR21 and the dummy word line DWL2, and in this figure, the memory nodes DN211, DN212 are represented there.

A channel region of the normal MOS transistor (the read NMOS transistor QR) and a silicon oxide film SGI for use in isolating the read NMOS transistor QR of the adjoining memory cell MC are alternately formed in the substrate layer just below the word line. A normal diffusion layer with silicon (hereinafter expressed as "n$^+$Si") having donor doped in a sufficient concentration to have a drain terminal and a source terminal of the read NMOS transistor QR is formed at a substrate layer other than the above, and the diffusion layer supplied with the ground potential VSS and the diffusion layer having the read data line contact DRCNT are alternately formed in parallel with the word line WL. In this figure, the memory cell MCn1 and the dummy cell DC1 enclosed by a dotted line are indicated.

In this figure, a value of ½ of a smaller wiring pitch selected from either the word line pitch or the data line pitch is assumed to be expressed as a feature size F. When the word line pitch and the data line pitch are equal to each other, one cross-point memory cell forms a square and its one side can be expressed as 2F where it is twice the feature size. Accordingly, its area becomes a minimum value 4F$^2$ (2F×2F). To the contrary, since the data lines are set such that two data lines DR, DW are arranged in pairs in FIG. 7, the word line pitch is smaller than the data line pitch, a length of the short side of the memory cell MCn1 can be expressed as 2F which is twice the feature size and a length of the long side can be expressed as 2.5F which is 2.5 times the feature size. Accordingly, an area of the memory cell MCn1 becomes 5F$^2$ (2F×2.5F). However, this value is a mere example and in view of the case in which an area for electrically isolating either the elements or wirings constituting each of the memory cells is required or in view of an error generated in reference to a limit in a processing technology such as a mask alignment or the like, it is sometimes found that an area of the memory cell MCn1 becomes further a large value. More specifically, although an upper limit value of the area of the memory cell MCn1 is made different in view of fabrication condition, it is preferable to keep a value between 4 to 8F$^2$ in reference to the fact that the prior art DRAM composed of one transistor and one capacitor is constituted in 8F$^2$ in general and further if it is in a value ranging from 4 to 6F$^2$, a further high integrated DRAM can be realized.

Figure 8:
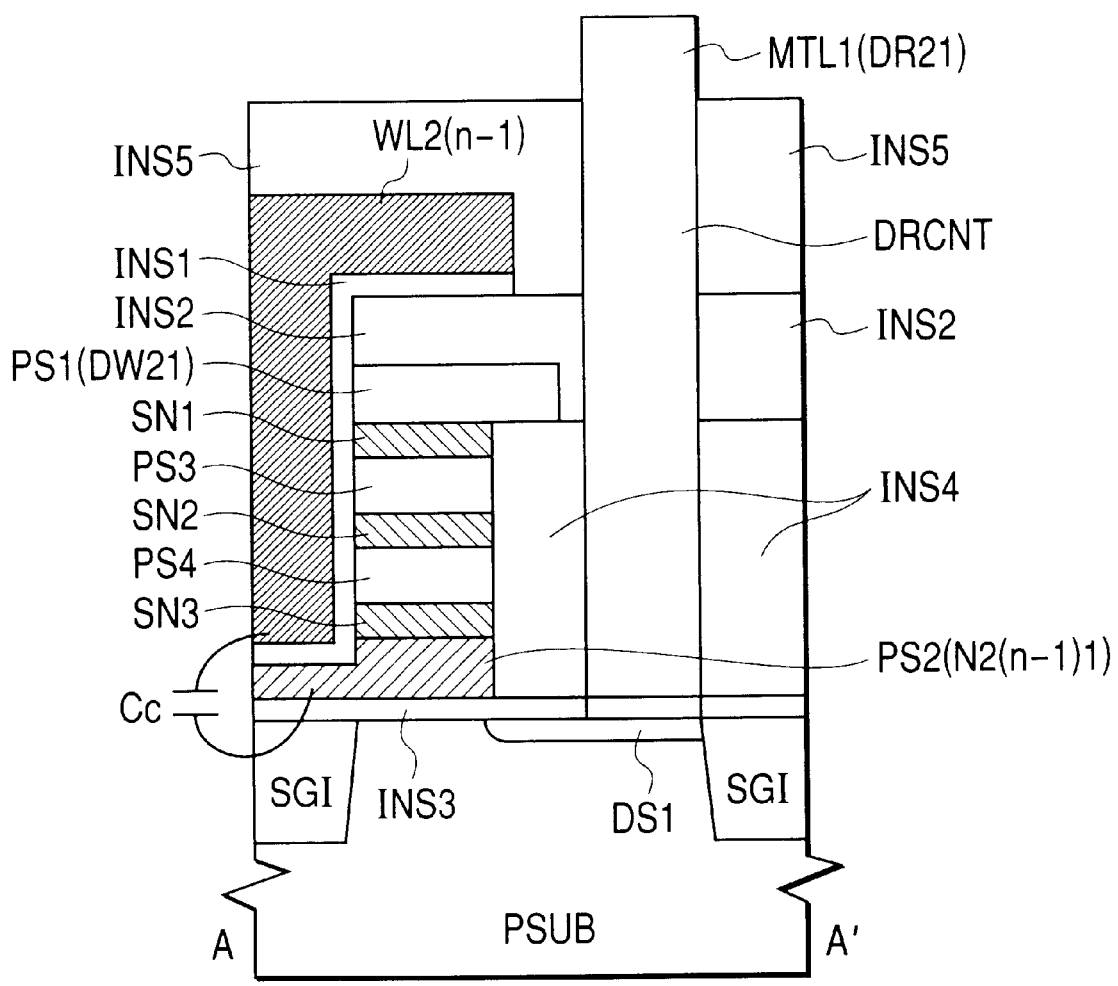
FIG. 8 is a diagram of a schematic sectional structure taken along line A–A' shown in FIG. 7.

FIG. 8 is a schematic sectional view taken along line A–A' shown in FIG. 7. A structure of the memory cell MC will be described in reference to this figure. In this case, p-type silicon substrate PSUB is employed as one example. The write transistor QW is characterized in that it is formed from a stacked transistor in which the word line WL2(n-1) acting as the gate electrode is arranged at the side walls of laminated four layers of poly-silicon PS1, PS2, PS3 and PS4 through the gate oxide film INS1. This gate electrode (the word line WL2(n-1)) is formed from the p-type poly-silicon film doped with boron.

The poly-silicon layers PS1 and PS2 are made such that phosphorus of about 10$^{20}$ cm$^{-3}$ is doped in poly-silicon and form a drain and a source of the transistor, respectively. In this figure, the poly-silicon layer PS1 is a write data line DW21 and the poly-silicon layer PS2 is a memory node N2(n-1)1. The poly-silicon layers PS3 and PS4 form a substrate for the write transistor QW with intrinsic poly-silicon doped with phosphorus of quite low concentration. Each of thin insulation films (silicon nitride films, for example) SN1, Sn2 and SN3 of 2 to 3 nm is formed between the poly-silicon layers PS1 and PS3, poly-silicon layers PS3 and PS4, and poly-silicon layers PS4 and PS2, respectively. The insulation films SN1 and SN3 may act as stoppers for preventing phosphorus of high concentration in the drain or source region from being diffused into the inside low concentration layers (of poly-silicon layers PS3 and PS4) when the transistor is formed.

In order to cause an electrical current to flow from the drain to the source in the write transistor QW, a thickness of these insulation films is set to such a value as one in which either a positive hole or an electron can pass through it. The insulation film SN2 positioned at the central part is used for restricting an off-current of the transistor low. That is, the insulation film is a stopper for preventing either a positive hole or an electron generated at the poly-silicon layers PS3 and PS4 in the transistor kept in its off-state from flowing between the drain and the source as a current. Further, applying a sufficient high voltage to the gate causes a potential barrier of the insulation film SN2 to decrease, so that a sufficient high on-current flows between the drain and the source. It is of course apparent that the central insulating film SN2 can also be deleted in accordance with a target value of the off-current. In addition, although the central tunnel film in FIG. 8 is assumed to be one layer, an insulation film composed of multi-layers may be employed as required.

The word line WL2(n−1) formed by a p-type silicon film doped with boron is arranged on the drain electrode formed by the poly-silicon layer PS1 of the write transistor QW having such a structure as above, i.e. on the write data line DW21 through a thick insulation film INS2 in such a way that the word line may cross it at a right angle. In addition, the memory node N2(n−1)1 formed by the poly-silicon PS2 is formed on the gate oxide film (the insulation film INS3 in this figure) of the normal MOS transistor so as to cover a part of silicon oxide film for isolation SGI and the read NMOS transistor QR. A read data line contact DRCNT is formed on one n+Si diffusion layer DS1 of the n+Si diffusion layers constituting either the drain or the source of the read NMOS transistor QR and then connected to a metallic wiring layer MTL1 (the read data line DR21 in this figure) on the sufficient thick insulation films (the insulation films INS2, INS4, INS5 in this figure). As shown in FIG. 8, the coupled-capacitance Cc shown in FIG. 5 is formed by a thin thermal oxide film (the gate oxidation film INS1) between the word line WL2(n−1) and the poly-silicon PS2.

Figure 9:
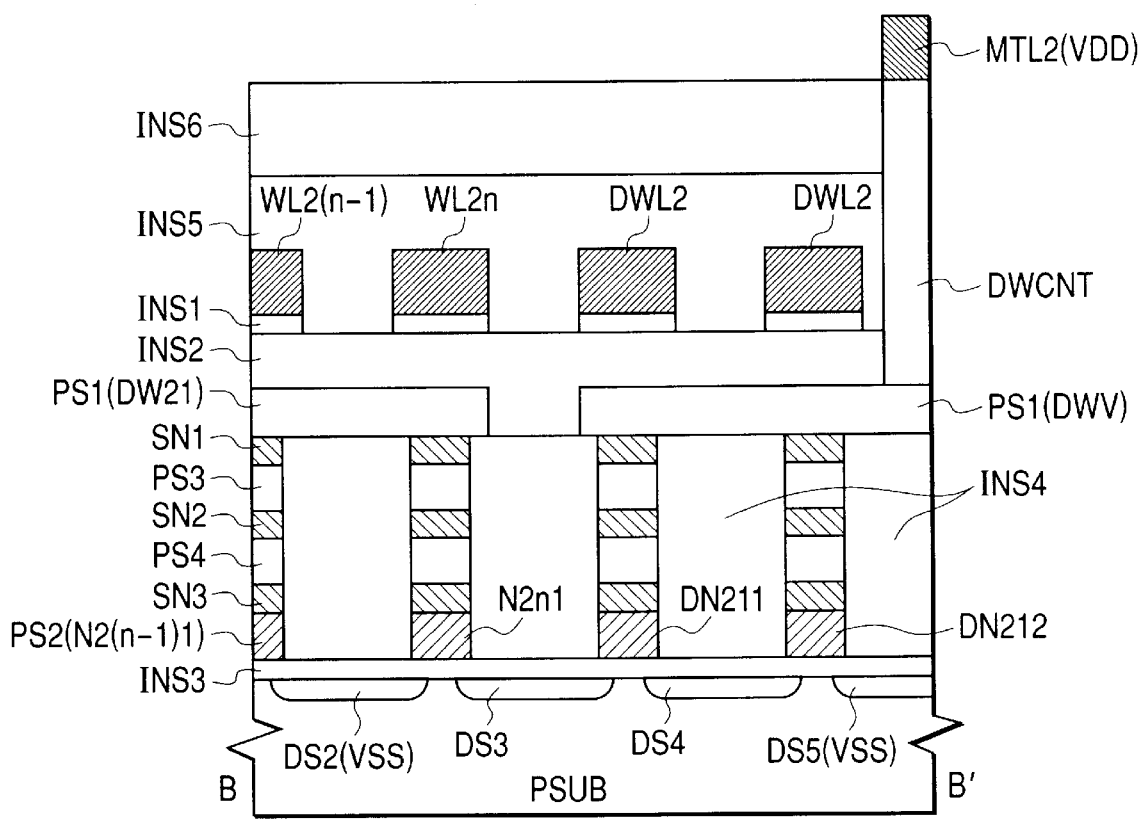
FIG. 9 is a diagram of a schematic sectional structure taken along line B–B' shown in FIG. 7.

FIG. 9 is a view showing a schematic section taken along line B–B' shown in FIG. 7. The write transistor QW is composed of four stacked layers of poly-silicon PS1, PS2, PS3 and PS4 and thin insulation films SN1, SN2 and SN3 in the same manner as that shown in FIG. 8. A ground potential VSS is supplied to n+Si diffusion layers DS2, DS5. Although not shown in FIG. 9, the read data line contact DRCNT is formed at a position shown in FIG. 7 of the n+Si diffusion layer DS3. Accordingly, the memory cell MC1 and the dummy cell DC1 in the memory cell array MCAn are connected to the read data line DR21 through the n+Si diffusion layer DS3.

Further, FIG. 9 shows two features of the dummy cell DC in accordance with the embodiment. At first, the read NMOS transistor in the dummy cell DC is connected in series through the n+Si diffusion layer DS4 as found in DQR1 and DQR2 in the dummy cell DC1, for example. Secondly, the poly-silicon layer PS1 forming the write data line is divided into between the word line WL2n and the dummy word line DWL2. As shown in this figure, the write data line DW21 is formed by the poly-silicon layer PS1 on the memory nodes N2(n−1)1 and N2n1. In addition, the power supply line DWV is formed by the poly-silicon layer PS1 on the memory nodes DN211 and DN212. Further, a contact DWCNT is formed on the power supply line DWV and connected to the metallic wiring layer MTL2 to which the power supply voltage VDD is supplied.

Following two effects can be obtained by both the constitution and the arrangement of the dummy cell DC as described above.

At first, each of the memory cell arrays MCA1, MCA2, . . . , MCAn is arranged between the read/write control circuit array RWCA and the dummy cell array DCA, whereby the dummy cell array DCA and the block BLK can be easily formed while a continuity in arrangement of the memory cell MC and the dummy cell DC is being kept and further an area of the memory cell array can be restricted. That is, since the dummy cell DC having structure similar to a three-dimensional structure memory cell MC is arranged adjacent to the three-dimensional structure memory cell MC having a stacked write transistor QW, its fabrication may easily be carried out. Further, both the read data line DR and the power supply line DWV can be formed at the dummy cell array DCA under the same pitch as that of the data line pairs (DR, DW) in the memory cell array MCA, whereby areas of the dummy cell array DCA and the block BLK can be restricted. When the write data line DW and the power supply feeding line DWV are formed at the same layer, each of the wirings may not be bypassed and it is quite effective in restriction against increasing in area. Further, since the dummy cell DC is connected to the power supply line DWV to which the power supply voltage VDD is fed, the store information "1" can be held, and each of the read NMOS transistors DQR1, DQR2 is brought into conduction. Therefore, the read data line DR precharged to VDD/2 can be electrically discharged toward the ground potential VSS.

Secondly, two memory cells MC are connected to each other in series to constitute the dummy cell DC. Thus, a total amount of channel lengths of the read NMOS transistor in the dummy cell DC becomes about twice that of the memory cell MC. Due to this fact, the dummy cell DC can generate the reference voltage VREF(t) shown in FIG. 4. That is, since a resistance value between the drain and the source of the dummy cell where the read NMOS transistors DRQ1 and DRQ2 are connected to each other in series becomes about twice that of the memory cell MC to which only one NMOS transistor of the same size is connected, if the potential difference between the gate and the source is kept constant, the current flowing in the read NMOS transistors DQR1 and DQR2 in the dummy cell DC becomes about half of that of the memory cell MC because the on-current of the transistor is in inverse proportion to the gate length. Accordingly, an electrical discharging speed at the dummy cell DC becomes slower than that of the memory cell MC and the reference voltage VREF(t) is generated. In addition, even if a variations in fabrication are produced in the memory cell MC, the variations are reproduced at the same rate at the dummy cell DC where the two memory cells are connected to each other in series at the same rate. As a result, the reference voltage VREF(t) can be generated in a high precise manner.

Figure 10:
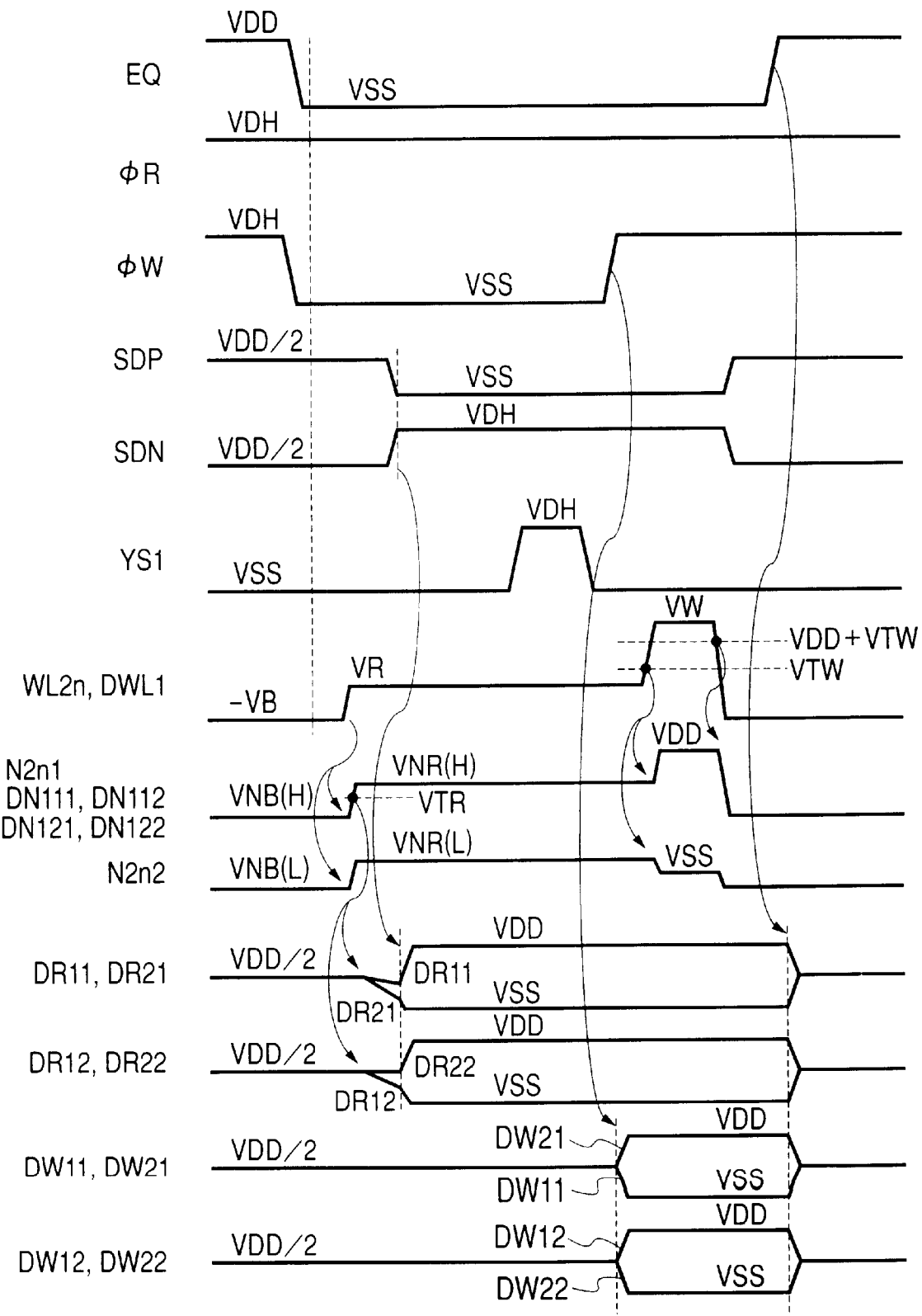
FIG. 10 is a diagram of an operation timing in reading and re-writing in the semiconductor device according to the first embodiment of the present invention.

FIG. 10 shows both a reading operation and a rewriting operation in the embodiment of the present invention. In the following description, the read data line pairs (DR11, DR21), (DR12, DR22) and the write data line pairs (DW11, DW21), (DW12, DW22) will be concentrated and described in sequence as one example in reference to the memory cell array configuration shown in FIG. 1. In this case, it is assumed that the reference voltage VREF(t) is generated at the data lines DR11, DR12, . . . , DR1m with the use of the dummy cell array DCA in the block BLK1 and then the stored information of the memory cell MC in the block BLK2 is read out. In addition, it is assumed that the memory cell MCn1 in the block BLK2 holds the stored information "1", the memory node N2n1 in the memory cell MCn1 keeps a high potential VNB(H) in its waiting state, the memory cell MCn2 holds the stored information "0", and the memory node N2n2 in the memory cell MCn2 keeps a low potential VNB(L) in its waiting state.

The reading operation will be described at first. In FIG. 10, although the data line pairs (DLT1, DLB1) and (DLT2, DLB2) in the read/write control circuits RWC1, RWC2 are omitted, they are equal to the operating waveforms of the read data line pairs (DR11, DR21), (DR12, DR22), respectively. Under the waiting state shown in FIG. 10, the precharge enabling signal EQ is driven to the power supply voltage VDD, and the read control signal φR and the write control signal φW are driven to the boosted voltage VDH. In addition, each of the read data line pairs (DR11, DR21), (DR12, DR22) and the write data lines (DW11, DW21), (DW12, DW22) is precharged to VDD/2.

At first, the write control signal φW is driven to the ground potential VSS, the write data lines (DW11, DW21), (DW12, DW22) and the data line pairs (DLB1, DLT1), (DLB2, DLT2) are shut off, the precharge enabling signal EQ is driven to the ground potential VSS and this pre-charging is finished.

Then, as the word line WL2n kept at the waiting potential −VB and the dummy word line DWL1 are driven to the read potential VR, the potential of the memory node N2n1 is coupled to the capacitance Cc to be increased up to VNR(H) and the potential of the memory node N2n2 is increased up to VNR(L), respectively. Similarly, a potential of each of the memory nodes DN111, DN112 in the dummy cell DC1 and the memory nodes DN121, DN122 of the dummy cell DC2 in the block BLK1 is also coupled to each of the capacitances DCc11, DCc12, respectively and is increased from a high level VNB(H) at the time of waiting to VNR(H) Since VNR(H) is kept at a higher potential than the threshold voltage VTR of each of the read NMOS transistors QR, DR1, DR2, each of the read NMOS transistor QR in the memory cell MCn1 in the block BLK2 and the read NMOS transistors DQR1, DQR2 of the dummy cells DC1, DC2 in the block BLK1 is brought into conduction and then each of the read data lines DR11, DR12 and DR21 is electrically discharged.

As described above, since the driveability of the dummy cell DC is lower than that of the memory cell, the read data line DR21 is always electrically discharged faster than the read data line DR11 at the read data line pairs (DR11, DR21) to cause a small potential and a negative read signal can be obtained. In turn, since the read NMOS transistor QR of the memory cell MCn2 in the block BLK2 of the read data line pairs (DR12, DR22) is kept in its off-state, the read data line DR22 is kept at the precharge potential VDD/2, the read data line DR12 is electrically discharged to cause a small potential, and the positive read signal can be obtained.

The sense amplifier exciting signal SDP keeping VDD/2 is driven to the ground potential VSS, and the sense amplifier exciting signal SDN is driven to a boosted voltage VDH at a timing in which these read signals may become a sufficient high value (about 0.1V in the prior art DRAM, for example) so as to activate the sense amplifier SA in the read/write control circuits RWC1, RWC2. Each of the above read signals is amplified by the sense amplifier SA, the read data lines DR21, DR12 are driven to the ground potential VSS and the read data lines DR11, DR22 are driven to the power supply voltage VDD. Although omitted in this figure, the data line DLT1 is driven to the power supply voltage VDD and the data line DLB1 is driven to the ground potential VSS, in the read/write control circuit RWC1. Similarly, the data line DLT is driven to the ground potential VSS and the data line DLB is driven to the power supply voltage VDD, in the read/write control circuit RWC2.

Then, the data line selection signal YS1 kept at the ground potential VSS is driven to the boosted voltage VDH to activate the data line selection circuit YSW in the read/write control circuit RWC1 and the stored information in the memory cell MCn1 in the memory cell array MCAn of the block BLK2 is read out in the common data lines IOT1, IOB1. Similarly, data in the memory cell MCn2 in the memory cell array MCAn of the block BLK2 can also be read out to the common data lines IOT2, IOB2.

Then, the rewriting operation will be described. After the data line selection signal YS1 is driven again to the ground potential VSS, the write control signal φW kept at the ground potential VSS is driven to a boosted voltage VDH, and the write data line pairs (DW11, DW21) and the data line pairs (DLB1, DLT1) in the read/write control circuit RWC1 are connected each other, and the write data line pairs (DW12, DW22) and the data line pairs (DLB2, DLT2) in the read/write control circuit RWC2 are connected to each other. At this time, since the sense amplifier SA in the read/write control circuits RWC1, RWC2 is kept in its activated state, each of the write data line pairs (DW11, DW21) and (DW12, DW22) kept at the precharge potential VDD/2 is driven to a potential corresponding to the read-out stored information. In this figure, it is shown that the write data lines DW21, DW12 are driven to the power supply voltage VDD and the write data lines DW11, DW22 are driven to the ground potential VSS in response to the stored information "1" in the memory cell MCn1 and the stored information "0" in the memory cell MCn2 of the block BLK2.

Subsequently, as the word line WL2n and the dummy word line DWL1 are driven to a higher write potential VW than a threshold voltage VTW of the write transistors QW, DQW, each of the write transistor QW in the memory cells MCn1, MCn2 of the block BLK2, and the write transistors DQW1, DQW2 in the dummy cells DC1, DC2 of the block BLK1 is brought into conduction, respectively. As a result, the memory node N2n1 is driven by the power supply VDD and the stored information "1" is stored into it and the memory node N2n2 is driven by the ground potential VSS and the stored information "0" is stored into it. That is, since a signal on the read data line DR is inverted and amplified on the write data line DW by the sense amplifier SA, an original stored information is restored in.

In turn, since the power supply voltage VDD is applied to the power supply line DWV of the dummy cell DC, the memory nodes DN1k1, DN1k2 in the dummy cell DC of the block BLK1 are driven by the power supply voltage VDD and the stored information "1" is written into it. After this operation, as the word line WL2n and the dummy word line DWL1 kept at the write potential VW are driven to a waiting potential −VB, the memory node N2n1 in the memory cell and the memory nodes DN1k1, DN1k2 in the dummy cell are coupled to the capacitance Cc and the dummy cells DCc1, DCc2, respectively, to become a high potential waiting potential VNB(H) and the memory node N2n2 becomes a low potential waiting potential VNB(L). That is, the memory cell and the dummy cell return to their original states.

Then, each of the sense amplifier exciting signal SDP kept at the ground potential VSS and the sense amplifier exciting signal SDN kept at the boosted voltage VDH is driven to VDD/2, respectively, the sense amplifier SA in the read/write control circuits RCW1, RCW2, . . . , RWCm is set to be off-state to finish the re-writing operation. Lastly, the precharge enabling signal EQ becoming the ground potential VSS is driven to the power supply voltage VDD, each of the aforesaid data lines is precharged to VDD/2, each of the data lines is precharged and returns to its waiting state. Accordingly, the waiting state has no node of floating state in the block BLK in the preferred embodiment, so that it is possible to restrict influence of noise generated when a potential of the control signal is changed over and to perform an accurate reading operation.

The read/write control circuit in accordance with the preferred embodiment is not limited to the constitution shown in FIG. 6, but another configuration may also be applicable. For example, the read data line pairs (DR1k, DR2k) and the data line pairs (DLTk, DLBk) were connected up to now through NMOS transistor MNR. However, as shown in FIG. 10, when the read/write operation is carried out while the read data line pairs (DR1k, DR2k) are being connected to the corresponding data line pairs (DLTk, DLBk), removal of the NMOS transistor MNR enables a layout area to be restricted.

The reading operation for the memory cell array in accordance with the embodiment is not limited to the operation under controlling action shown in FIG. 10, but other various kinds of controlled operations can be carried out. For example, it has been indicated up to now the operation in which the NMOS transistor MNR is brought into conduction while the read control signal φR is being fixed to the boosted voltage VDH and the minimum potential is amplified by the sense amplifier SA under a state in which the word line WL and the dummy word line DWL are driven to the read potential VR while the read data line pairs (DR1k, DR2k) are being connected to the corresponding data line pairs (DLTk, DLBk). However, it is also possible that before activation of the sense amplifier SA, the word line WL and the dummy word line DWL kept at the read potential VR are driven to the waiting potential −VB to terminate driving of the read data line, the read signal φR kept at a further high potential is driven to the ground potential VSS, the read data line pairs (DR1k, DR2k) are separated, and the corresponding data line pairs (DLTk, DLBk) are amplified with the sense amplifier. There are two effects in this case.

At first, load capacitance of the sense amplifier SA to be driven becomes only capacitance of the data line DL (hereinafter referred to as CDL) except the capacitance of the read data line DR (hereinafter referred to as CDR), so that the amplifying time becomes fast and its reading time can be shortened.

Secondly, a consumption current can be restricted by a method wherein an electrical discharging operation at the read data line DR is stopped and a rush current flowing between the power supply VDD and the ground potential VSS through the sense amplifier SA and the read NMOS transistors QR, DQR1 and DQR2 in the memory cell MC and the dummy cell DMC is prohibited to flow.

In this case, it is not necessary that the high potential of the read control signal φR is a boosted voltage VDH, and a voltage amplitude at the read data line DR is in a range from the ground potential VSS to VDD/2, so that the high potential of the read control signal can be set to the power supply voltage VDD.

In addition, there has been already illustrated the operation in which after amplifying the data line pairs (DLTk, DLBk) in the read/write control circuit RWCk, the write data line pairs (DW1k, DW2k) are connected to the corresponding data line pairs (DLBk, DLTk) and each of them is driven by the sense amplifier SA. However, the operation is not limited to this case, but the corresponding data line pairs (DLBk, DLTk) and the write data lines (DW1k, DW2k) may also be connected to each other and concurrently they may be amplified and driven. In this case, it is possible to save time required for activating the NMOS transistor MNW in the data line control circuits DSW1, DSW2, so that the write operation time can be shortened.

Since the dummy cell DC in the embodiment is arranged one by one for every read data line DR, a plurality of read data lines DR can be driven concurrently.

Application of two-transistor cell used in the preferred embodiment causes a leak current of the transistors QW, DQW1, DQW2 to become small and the load at the memory nodes N, DN11, DN12 can be held for a long period of time, so that a refresh cycle can be extended more as compared with that of the prior art DRAM using one-transistor cell. In addition, when the leak current of the transistor is sufficiently low and the load at each of the memory nodes is held for a long period of time, the re-writing operation can be eliminated.

Up to now, although the case in which the precharge potential is VDD/2 has been described, the precharge potential is not limited to this case. When the power supply voltage VDD is a low voltage equal to 1V or less, for example, an ON-current of sufficient value is allowed to flow to the read NMOS transistor QR and the write transistor QW with the precharge potential being applied to as the power supply voltage VDD. Further, it is possible to obtain sufficiently high read signals Δ(V0(t)), Δ(V1(t)) In this case, if the precharge enabling signal EQ is applied as a boosted voltage VDH, the data line pairs (DR, DW) can be precharged positively to the power supply voltage VDD.

The boosted voltage VDH and the precharge potential VDD/2 which have already been employed as above are of a voltage level used in the prior DRAM and in particular the power supply voltage generating circuit is not added, so that a chip area can be restricted.

<Embodiment 2>

Figure 11:
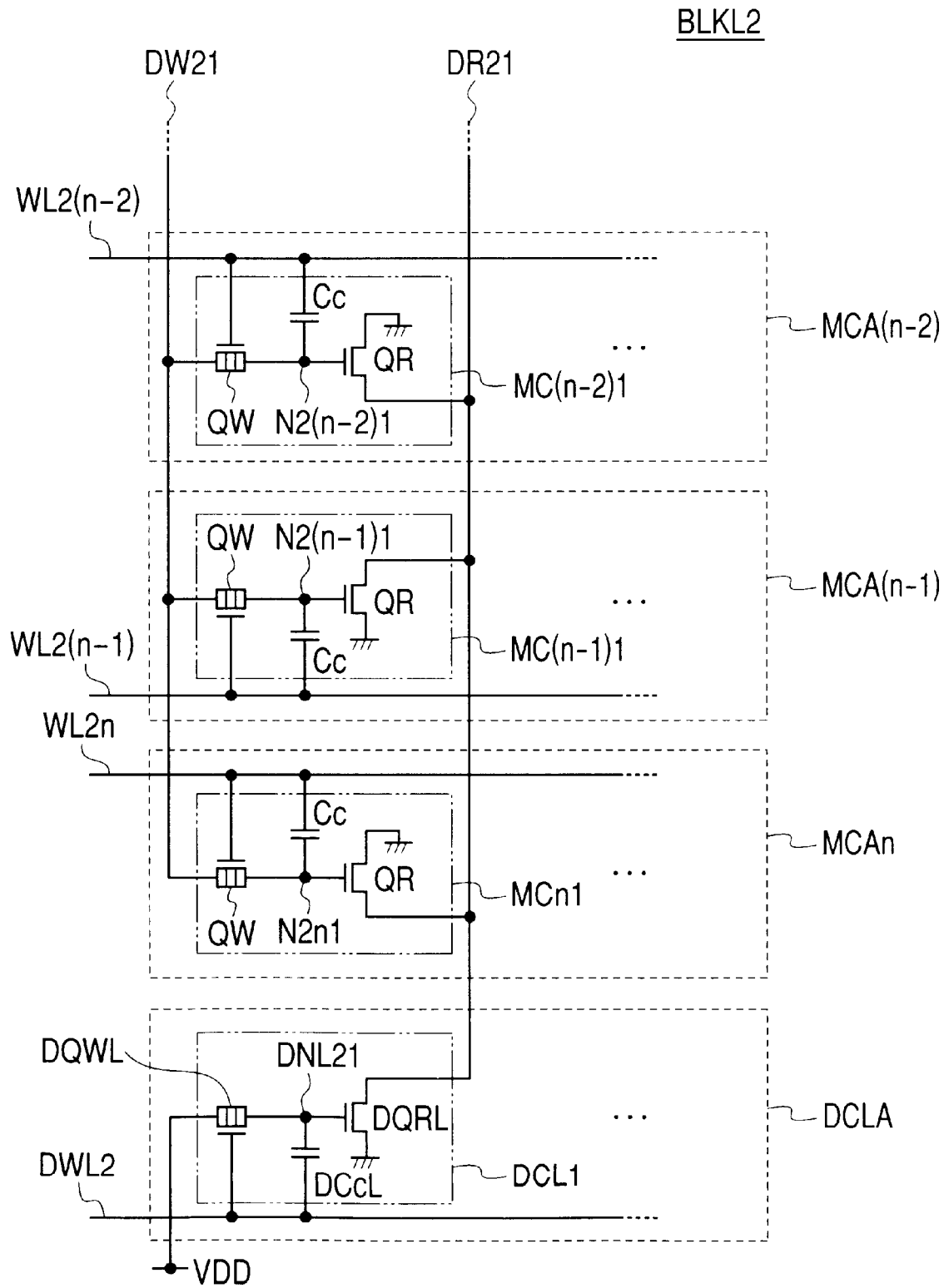
FIG. 11 is a circuit diagram of an example of configuration of a memory cell and a dummy cell in the memory cell array according to a second embodiment of the present invention.

In this embodiment, another configuration of a dummy cell will be described. FIG. 11 shows a circuit configuration when a dummy cell DCL in accordance with the embodiment is applied to the block BLK2 shown in FIG. 1. In this case, there are illustrated memory cells MC(n−2)1, MC(n−1)1, MCn1 arranged at each of the cross-points between the data line pairs (DR21, DW21) and word lines WL2(n−2), WL2(n−1), W2n and the dummy cell DCL1 arranged at a cross-point of the data line DR21 and the dummy word line DWL2, respectively. In order to discriminate between the block BLK2 and the dummy cell array DCA shown in FIG. 5, each of them is expressed as a block BLKL2 and a dummy cell array DCLA in FIG. 11, respectively.

As compared with the dummy cell DC shown in FIG. 5, a feature of the dummy cell DCL different from that of the dummy cell DC consists in the fact that only one read NMOS transistor DQRL is present and its gate length is twice of the gate length of the read NMOS transistor QR in the memory cell MC. This feature will be described as follows in reference to a layout and a sectional view of the memory cell array.

Figure 12:
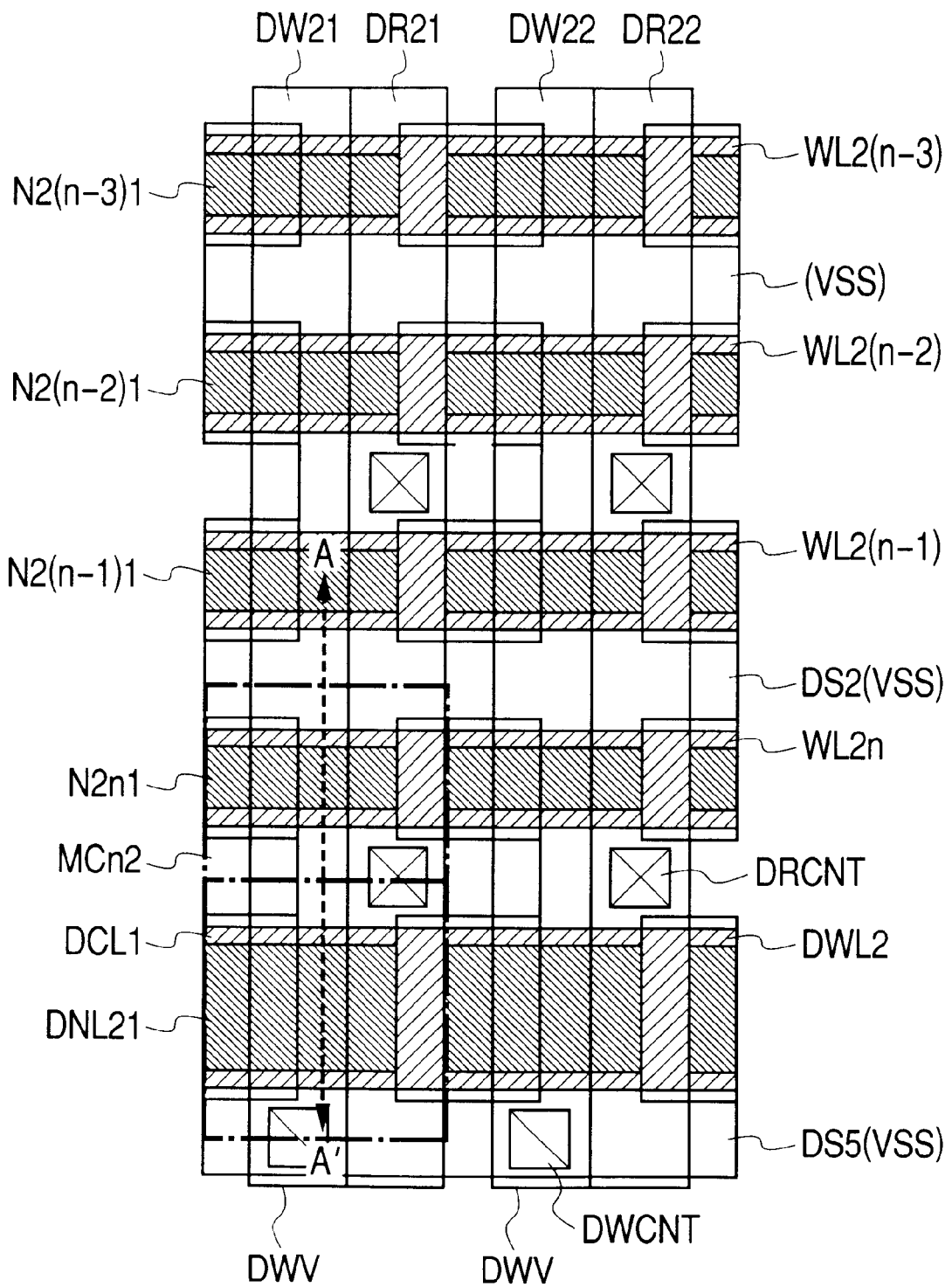
FIG. 12 is a diagram of a part of layout of the memory cell array shown in FIG. 11.

FIG. 12 is the layout showing a part of the block BLKL2. In this figure, each of the two sets of data line pairs (DR21, DW21) and (DR22, DW22) in a vertical direction, and each of four word lines WL2(n−3) to WL2n and a dummy word line DWL2 in a lateral direction are illustrated. Memory nodes N and DNL are formed at cross-points of the data line pairs (DR2, DW2) and the word line WL, and at cross-points of the read data line DR and the dummy word line DWL2, respectively, and in this figure, the memory nodes N2(n−3)1, N2(n−2)1, N2(n−1)1, N2n1 and DNL21 are represented.

Each of channel regions of a normal MOS transistor (a read NMOS transistor QR in this case) and a silicon oxide film SGI for isolating the read NMOS transistor QR in an adjoining memory cell MC are alternately formed at the substrate layer just below the word line. A normal diffusion layer with n$^+$Si having donor doped in a sufficient concentration to have a drain terminal and a source terminal of the read NMOS transistor QR is formed at a substrate layer other than the above, and the diffusion layer supplied with the ground potential VSS and the diffusion layer having the read data line contact DRCNT are alternately formed in parallel with the word line WL2k. The portion enclosed by a dotted line indicates a memory cell MC2n1 and the dummy cell DCL1. Although described in detail later, a layer of the write data line DW2k is isolated between the memory cell MCn1 and the dummy cell DVL1, for example. In addition, a write data line contact DWCNT is formed on the layer DW2k in the dummy cell and is connected to a metallic wiring layer MTL2 supplied with the power supply voltage VDD.

Figure 13:
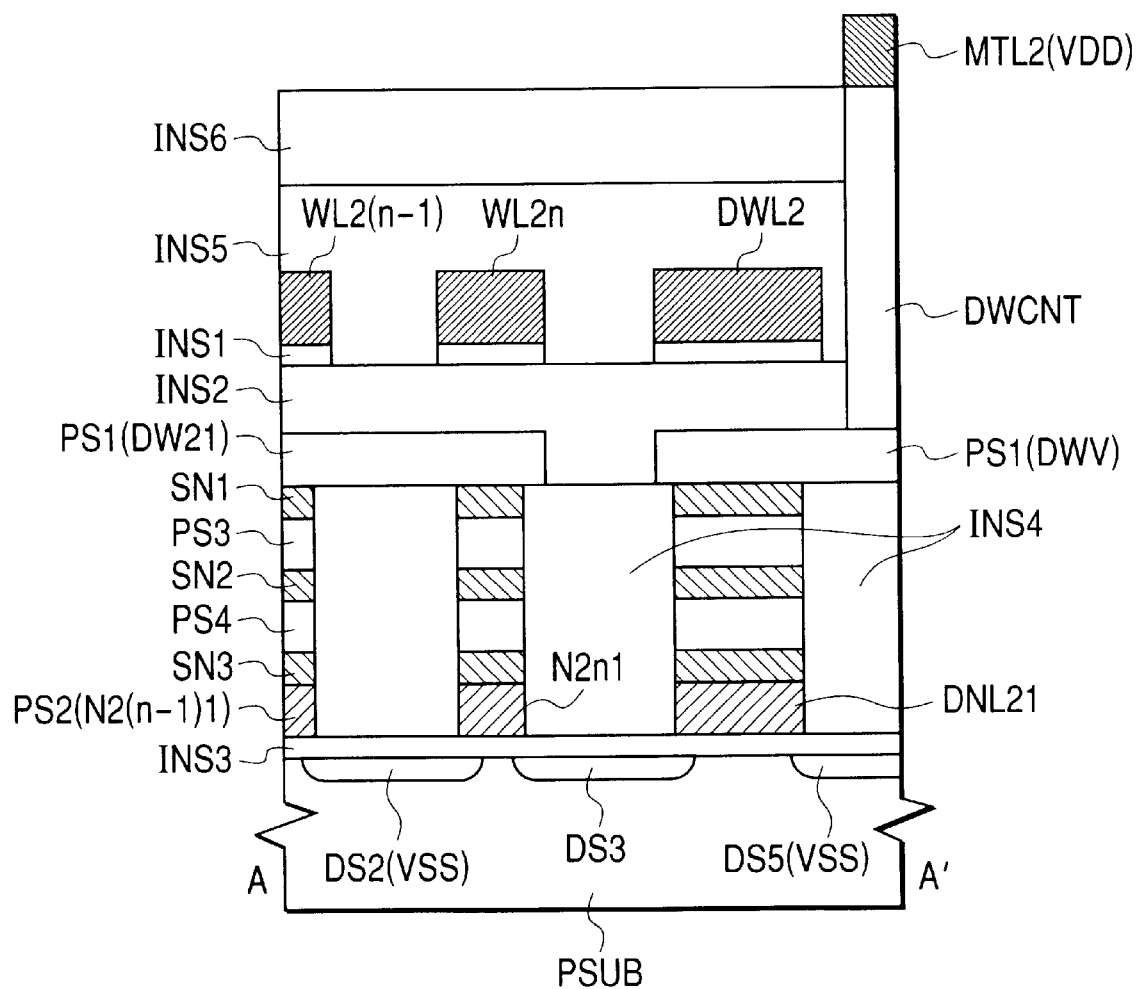
FIG. 13 is a diagram of a schematic sectional structure taken along A–A' shown in FIG. 12.

FIG. 13 is a schematic section taken along line A—A in FIG. 12. Its feature different from the structure of the dummy cell shown in FIG. 9 consists in the following two points. At first, a width of the write transistor DQWL and the dummy word line DWL2 is twice in correspondence with a twice setting of channel length of the read NMOS transistor DQRL. An effect of this structure will be described in reference to the feature of its operation. Secondly, the read NMOS transistor is set to one DQRL, whereby a region DS4 in n+Si diffusion layer in FIG. 9 is eliminated. Therefore, an area of the dummy cell DCL1 can be restricted correspondingly.

Figure 4:
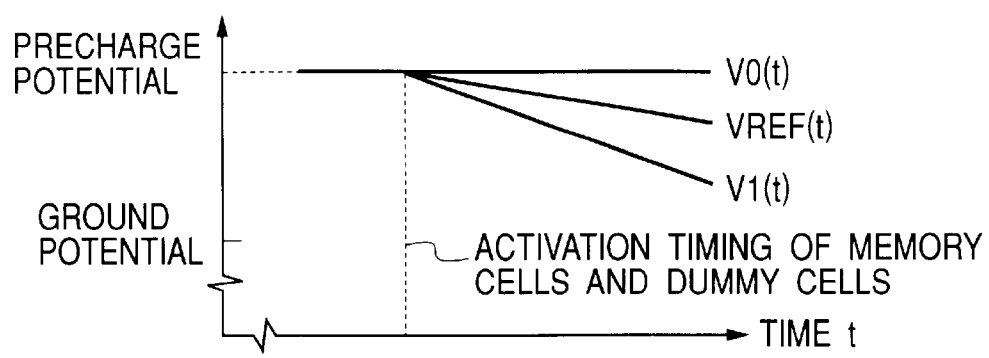
FIG. 4 is a diagram showing relation between a memory cell and a read data line potential driven by a dummy cell in a semiconductor device of the present invention.

Then, a feature of the dummy cell DCL in the embodiment in its operation will be described below. The write transistor DQWL is enlarged in the same multiplicity in the same direction as that of the channel of the read NMOS transistor DQRL in the dummy cell DCL as compared in the plane shown in FIG. 12. That is, as the channel length at the read NMOS transistor DQRL becomes twice and its gate area becomes twice, a channel sectional area in the write transistor also becomes twice. Thus, when the operation shown in FIG. 10 is applied, a load having the same density as the load density charged with the memory node N in the memory cell MC can be charged in the memory node DNL of the dummy cell DCL. Accordingly, when the dummy cell DCL is selected as a reading state and the read NMOS transistor is brought into conduction, a potential difference between the gate and the source of the read NMOS transistor DQRL becomes equal to that of the memory cell MC and the current flowing between the drain and the source can be set to about a half of the memory cell MC in correspondence with the channel length. With such an operating mechanism as described above, the reference voltage VREF(t) as shown in FIG. 4 can be generated.

<Embodiment 3>

In this embodiment, another embodiment of configuration of the memory cell array will be described. As already described in the first embodiment, two data lines DR, DW are formed by another wiring layer in the memory cell MC applied to this embodiment so as to realize a memory cell having a small area. In turn, when the normal sense amplifier SA as shown in FIG. 6 is applied to the memory cell array of an open data-line structure, the two data lines pass over the sense amplifier SA, so that it is difficult to perform an efficient arrangement in the same space as that of the memory cell MC. In view of this fact, a configuration of the memory cell array is applied as shown in FIG. 14 to avoid the aforesaid problems.

A feature of the memory cell array configuration can be described in reference to the block BLKST1, for example. At first, both the read/write control circuit arrays RWCAS0 and RWCAT1 are arranged at both ends of the block BLKST1. Secondly, the number of (m) of memory cell arrays MCA1, MCA2, . . . , MCAm are arranged between the dummy cell arrays DCAS and DCAT. In this figure, although the read/write control circuit arrays RWCAS0, RWCAS1, RWCAT1 and blocks BLKST1, BLKST2 are shown, further this embodiment will be described in detail under an assumption that a plurality of the read/write control circuit arrays RWCAS, RWCAT and block BLKST are arranged in a vertical direction.

At first, the read/write control circuit array RWCAS0 is composed of a plurality of (1 to s) read/write control circuits RWC1, RWC2, . . . , RWCs as shown in FIG. 6. These read/write control circuits RWC are connected for every one set of data line pairs (DR, DW) in such a way that the data line pairs (DR02, DW02) and (DR12, DW12) are connected to the read/write control circuit RWC1, and the data line pairs (DR04, DW04) and (DR14, DW14) are connected to the read/write control circuit RWC2, for example. Similarly, the read/write control circuit array RWCAT1 is composed of a plurality of (1 to t) read/write control circuits RWC1, RWC2, . . . , RWCt as shown in FIG. 6. These read/write control circuits RWC are connected for every one set of data line pairs (DR, DW) in such a way that the data line pairs (DR11, DW11) and (DR21, DW21) are connected to the read/write control circuit RWC1, and the data line pairs (DR13, DW13) and (DR23, DW23) are connected to the read/write control circuit RWC2, for example. Thus, s and t have a relation with m of m=s+t.

Figure 14:
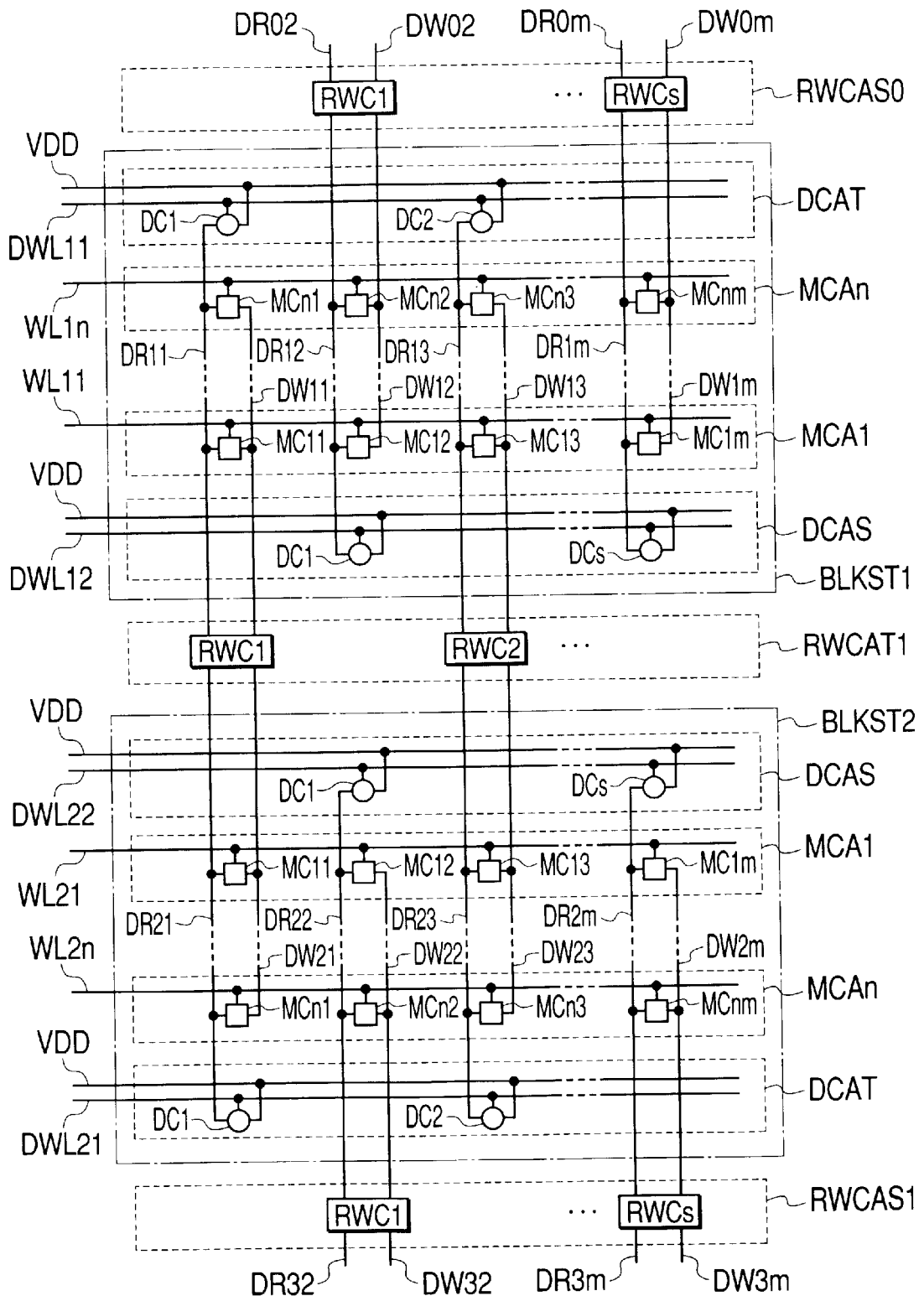
FIG. 14 is a diagram of configuration of a memory cell array of a semiconductor device according to a third embodiment of the present invention.

Then, the dummy cell array DCAS is composed of a plurality of (1 to s) dummy cells DC1, DC2, . . . , DCs as shown in FIG. 14. These dummy cells DC correspond to the read/write control circuit RWCAS0, and they are connected for every one read data line DR such that the read data line DR12 is connected to the dummy cell DC1 and a read data line DR14 is connected to the dummy cell DC2, for example. Similarly, the dummy cell array DCAT corresponds to the read/write control circuit RWCAT1 and is composed of a plurality of (1 to t) dummy cells DC1, DC2, . . . , DCt as shown in FIG. 14. These dummy cells DC are connected for every one read data line DR such that the read data line DR11 is connected to the dummy cell DC1 and the read line DR13 is connected to the dummy cell DC2.

A reading operation in the memory cell array configuration in this embodiment is carried out as follows.

For example, when the stored information in the memory cell MC within the block BLKST1 is read out, the dummy cell array DCAS in the block BLKST0 (not shown) connected to the read/write control circuit array RWCAS0, and the dummy cell array DCAT in the block BLKST2 connected to the read/write control circuit array RWCAT1 are selected to generate the reference voltages VREF(t) respectively and then the stored information is discriminated from each other.

In turn, when the stored information in the memory cell MC within the block BLKST2 is read out, for example, the dummy cell array DCAT in the block BLKST1 connected to the read/write control circuit array RWCAT1, and the dummy cell array DCAS in the block BLKST3 (not shown) connected to the read/write control circuit array RWCAS1 are selected to generate the reference voltages VREF(t) and then the stored information is discriminated.

In addition, when the stored information in the memory cell MC within the block BLKST0 (not shown) is read out, for example, the dummy cell array DCAS in the block BLKST1 connected to the read/write control circuit array RWCAS0 is selected to generate the reference voltage VREF(t) and the stored information is discriminated from each other.

With such an arrangement as above, two effects described below can be obtained.

At first, the read/write control circuit arrays RWCAS, RWCAT composed of the read/write control circuit RWC connected for every one set of data line pairs are arranged at both ends of the memory cell array block BLKST, whereby an area required for the read/write control circuit arrays RWCAS, RWCAT can be restricted.

Secondly, since dummy cells DC are arranged for every one at cross-points of the dummy word lines DWLS, DWLT and the read data line DR, a coupling capacitance formed between the dummy word line DWL and the dummy cell DC is reduced and a delay time generated when the dummy word line DWL is driven can be restricted.

Figure 15:
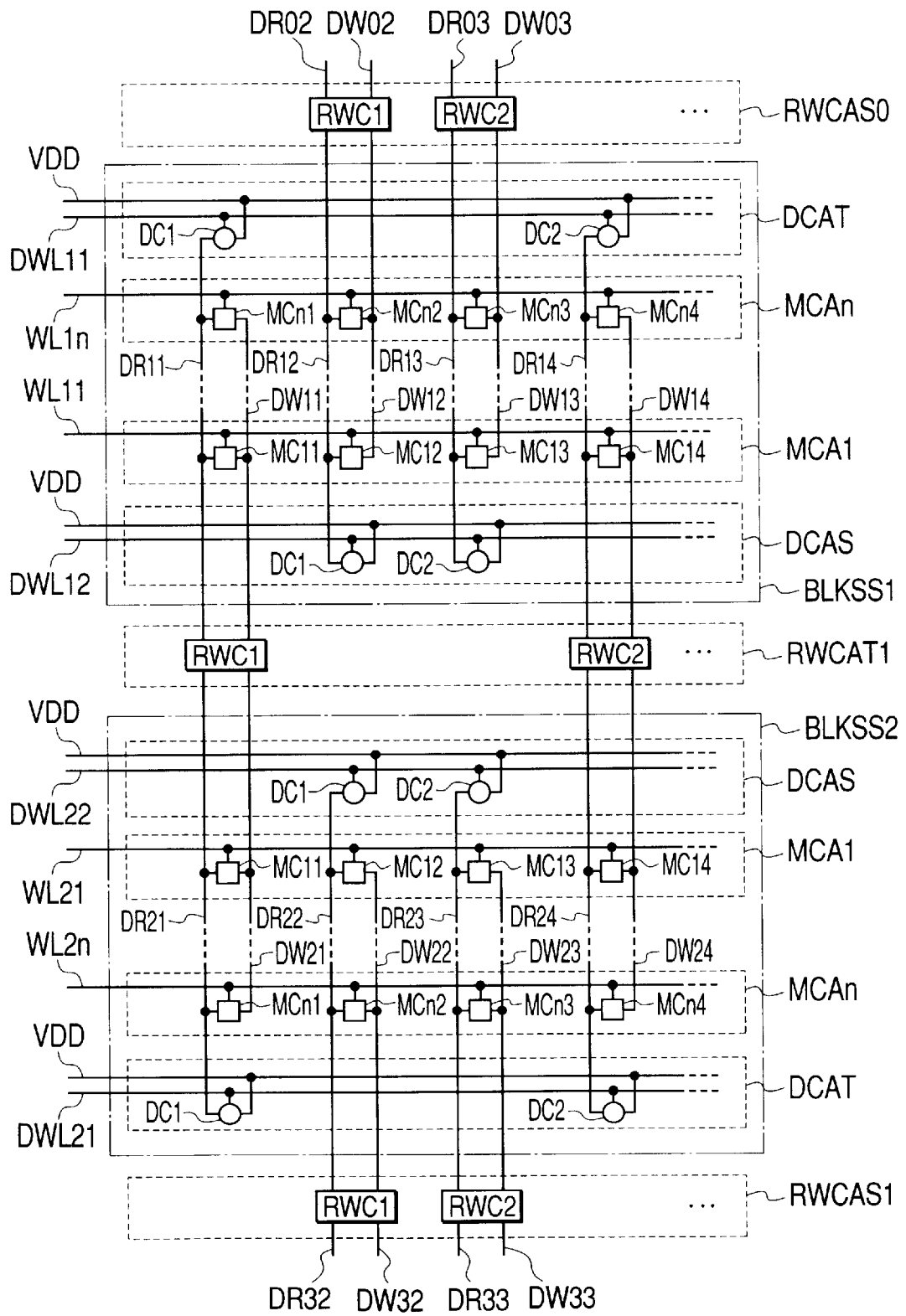
FIG. 15 is a diagram of another configuration of the memory cell array of the semiconductor device according to the third embodiment of the present invention.

FIG. 14 shows the configuration in which the read/write control circuit RWC is connected for every one set of data line pairs in the read/write control circuits RWCAS and RWCAT. However, the memory cell array configuration is not limited to this configuration, and various kinds of configuration can be applied. For example, as shown in FIG. 15, the read/write control circuit RWC may be connected for every two sets of data line pairs in the read/write control circuit array RWCAS0 such that the data line pairs (DR02, DW02) and (DR12, DW12) are connected to the read/write control circuit RWC1, and the data line pairs (DR03, DW03) and (DR13, DW13) are connected to the read/write control circuit RWC2, respectively. In response to this arrangement, as found in the dummy cell array DCAS in the block BLKSS1, for example, the dummy cell DC is connected for every two read data lines such that the read data line DR12 is connected to the dummy cell DC1 and the read data line DR13 is connected to the dummy cell DC2. Arrangement of such a memory cell array as above enables an effect similar to that of the memory cell array configuration shown in FIG. 14 to be obtained.

In addition, although the dummy cell DC shown in FIG. 5 is employed as the dummy cell arrays DCAT and DCAS, the dummy cell DCL shown in FIG. 11 may also be used and in this case, an area of the dummy cell array can be reduced as described in the second embodiment 2.

<Embodiment 4>

In the present embodiment, another configuration and operation of the memory cell array will be described. A feature of the present example consists in an arrangement in which a system having twice data line length is driven under application of the dummy cell having the same configuration as that of the memory cell to generate a reference voltage.

Figure 16:
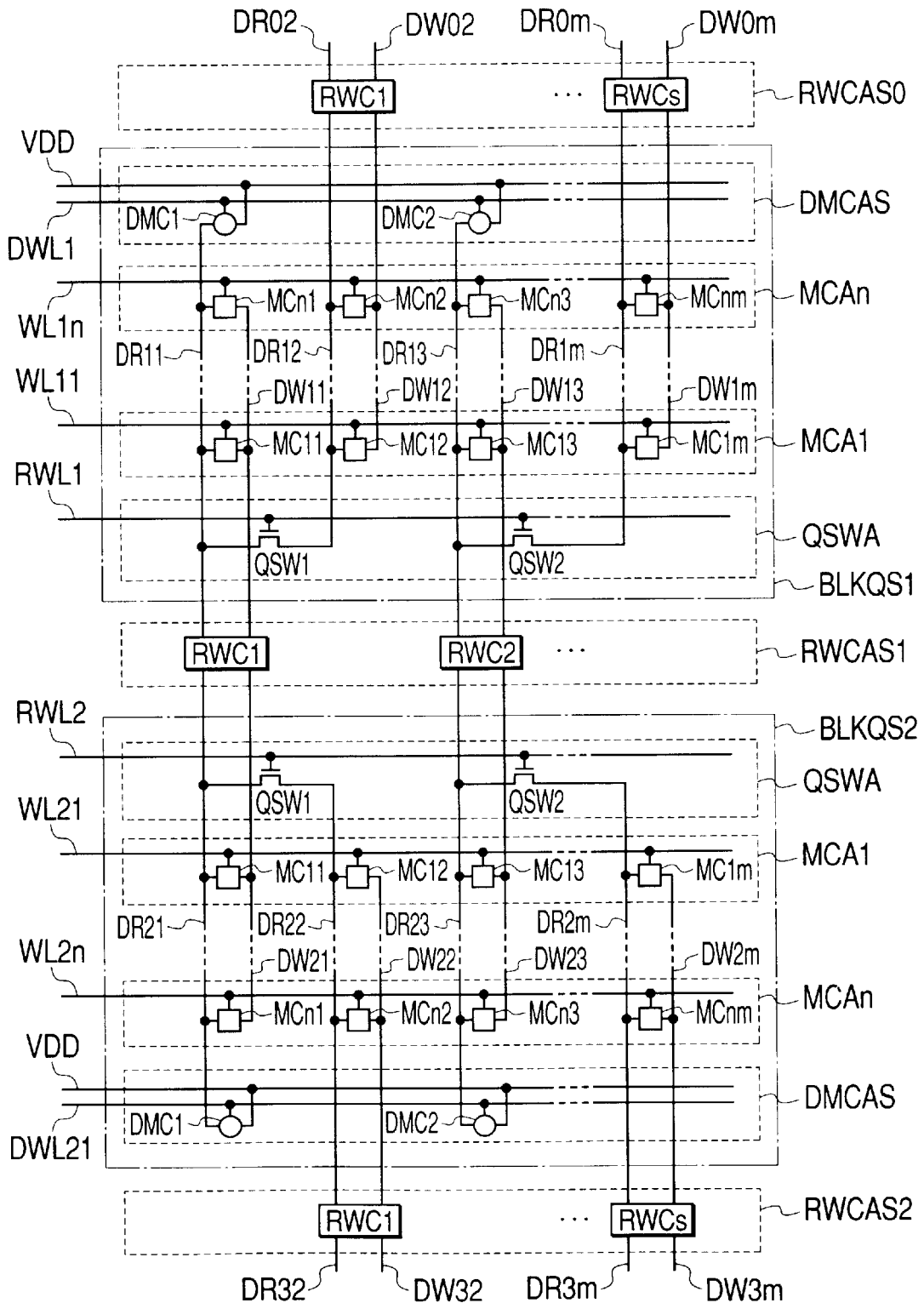
FIG. 16 is a diagram of configuration of a memory cell array of a semiconductor device according to a fourth embodiment of the present invention.

FIG. 16 shows the blocks BLKQS1, BLKQS2 and the read/write control circuit arrays RWCAS0, RWCAS1, and RWCAS2 in accordance with the embodiment of the present invention. Although eliminated in this figure, it is assumed that a plurality of read/write control circuits and blocks are arranged in a vertical direction.

As compared with the block BLKST shown in FIG. 14, two different features of the block BLKQS in accordance with the embodiment can be described in reference to the block BLKQS1.

Figure 3:
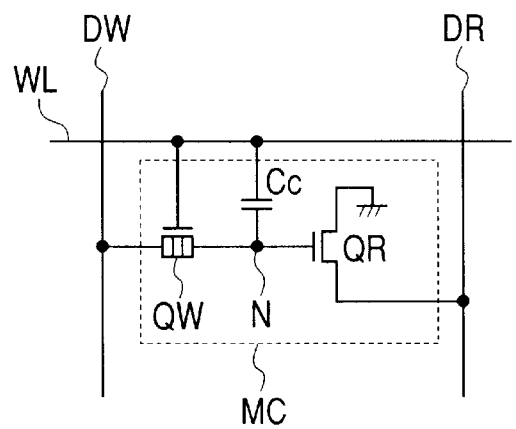
FIG. 3 is a view of a memory cell composed of two transistors and one capacitor used in the semiconductor device of the present invention.

At first, the feature consists in the fact that the block BLKQS1 has one dummy cell array DMCAS composed of the dummy cells DMC1, DMC2, . . . , DMCs having the same configuration as that of the memory cell MC shown in FIG. 3.

In FIG. 16, the power supply voltage VDD is connected to each of the dummy cells DMC, this fact indicates that the power supply voltage VDD is fixedly inputted to the power supply line in each of the dummy cells DMC as shown in FIG. 5 or FIG. 11.

Secondly, its feature consists in the fact that the memory cell arrays MCA1, MCA2, . . . , MCAn and the read data line connection switch array QSWA are arranged between the dummy cell array DMCAS and the read/write control circuit array RWCAS. The read data line connection switch array QSWA is composed of the NMOS transistors QSW1, QSW2, . . . , QSWs, for example. Each of the switch control lines RWL is connected to the gate of the NMOS transistor QSW. In addition, each of the adjoining read data lines DR11 and DR12 as found in NMOS transistor QSW1, for example, is connected to the drain and the source of the NMOS transistor QSW. Accordingly, affixed letters (m) and (s) have a relation of m=2s.

Then, referring to FIG. 17, a reading operation in the memory cell array configuration in accordance with the embodiment will be described. In this figure, it is assumed that each of the read/write control circuits RWC1 to RWCs in the read/write control circuit arrays RWCAS1, RWCAS2 is activated, a reference voltage is generated at each of the read data line (DR11, for example) in the block BLKQS1 or the read data line (DR32, for example) of the block BLKQS3 (not shown) so as to read out the stored information in the block BLKQS2. In this case, in particular, the read/write control circuit RWC1 in the read/write control circuit array RWCAS1 is focused on under an assumption that the memory cell MCn1 is read out. It is assumed that the memory cell MCn1 holds the stored information "1" and the memory node N2n1 is kept at a high potential VNB(H) under a waiting state. In turn, the memory node in the dummy cell DMC1 in the dummy cell array DMCAS of the block BLKQS1 is denoted as DN11.

In addition, it is assumed that the affixed letters 0, 1, 2 of the precharge enabling signal EQ, the read control signal φR, the write control signal φW and the sense amplifier exciting signals SDP, SDN correspond to the affix letters in the read/write control circuit array RWCAS and each of them is connected to each of the read/write control circuit RWC in the corresponding read/write control circuit array RWCAS.

Further, for the sake of clarity and simplicity, a reading operation for the common data line pairs IOT1, IOB1 is omitted and an operating waveform of the data line selection signal YS1 is omitted.

At first, under a waiting state, the precharge enable signals EQ0, EQ1, EQ2, the read control signals φR0, φR1, φR2, and the switch control lines RWL1, RWL2 are driven to the power supply voltage VDD, and the write control signals φW0, φW1, φW2 are driven to the boosted voltage VDH, and each of the read data line pairs (DR11, DR21), (DR12, DR22) and the write data lines (DW11, DW21), (DW12, DW22) is precharged to VDD/2.

At first, after the switch control line RWL is driven to the ground potential VSS, the read data lines DR21, DR22 are shut off, the write control signal φW1 is driven to the ground potential VSS, and the write data lines (DW11, DW21) and the data line pairs (DLB1, DLT1) are shut off, the precharge enabling signal EQ1 is driven to the ground potential VSS and the pre-charging operation is completed. In this case, since the switch control line RWL1 is kept at the power supply voltage VDD, the NMOS transistors QSW1, QSW2, . . . , QSWs in the read data line connecting switch array QSWA of the block BLKQ1 are brought into conduction, wherein the adjoining two read data lines DR such as read data lines DR11, DR12, for example, are connected. On the other hand, since the NMOS transistors QSW1, QSW2, . . . , QSWs in the read data line connection switch arrays QSWA of the block BLKQS2 are brought to an off-state, the adjoining read data lines DR are shut off. Accordingly, the read data line having a data line length with a ratio of 2:1 is formed.

Then, when the dummy data line DWL1 and the data line DL2n kept at the ground potential −VB are driven to the read potential VR, the read transistors QR in the dummy cell DMC1 in the block BLKQS1 and in the memory cell MCn1 in the block BLKQS2 are brought into conduction and then each of the read data lines DR11, DR12 and DR21 is electrically discharged. In this case, let a wiring capacitance of the read data line DR be CDR, a wiring capacitance of the data line DL be CDL, and an ON-current flowing in the read NMOS transistors QR in the memory cell MC be IDS under an assumption that an inter source-drain voltage dependency is sufficiently low. Under application of the foregoing symbols, a potential at the read data line DR21 can be expressed as $$V1(t)=VDD/2-(IDS\times t)/(CDR+CDL) \quad (1)$$

In turn, a potential of each of the read data lines DR11, DR12 can be expressed as $$VREF(t)=VDD/2-(IDS\times t)/(\alpha\times CDR+CDL) \quad (2)$$

In reference to this equation, a value of α becomes approximately 2 in consideration of a wiring parasitic capacitance generated by connecting the read data lines DR21, DR22. If it is assumed that CDL is sufficiently low and ignitable, an amount of signal when the stored information "1" is read out can be expressed as follows in reference to the aforesaid equations (1), (2)

$$\Delta(V1(t))=-(IDS\times t)/(2\times CDR) \quad (3)$$

Each of the sense amplifier exciting signals SDP, SDN kept at VDD/2 is driven to the ground potential VSS and the boosted voltage VDH under a timing in which this read signal becomes a sufficient high value (about 0.1V in the prior art DRAM, for example), and the sense amplifier SA in the read/write control circuit RWC1 in the read/write control circuit array RWCAS1 is activated to amplify the read signal generated in the data line pairs (DLT1, DLB1).

Figure 17:
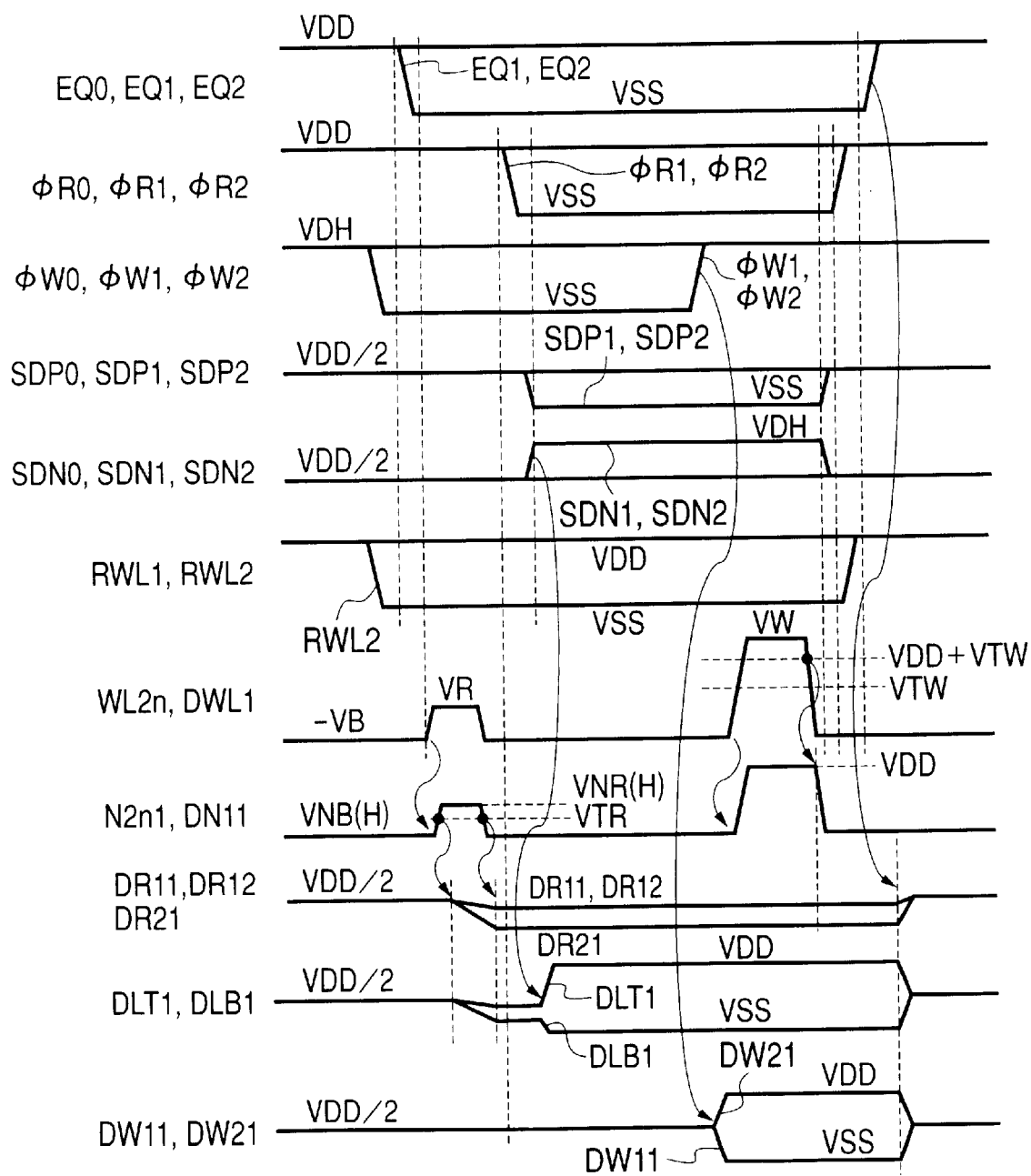
FIG. 17 is a diagram showing an operation timing in reading and re-writing in the semiconductor device according to the fourth embodiment of the present invention.

However, in FIG. 17 is shown the fact that the following two types of operation are carried out before performing the activation of the sense amplifier.

At first, the dummy data line DWL1 and the data line DL2n kept at the read potential VR are driven to the ground potential −VB and the read NMOS transistor is turned off. Thus, since the electrical discharging of each of the read data lines is stopped, respectively, its consumption current can be restricted.

Secondly, the read control signal φR1 kept at the power supply voltage VDD is driven to the ground potential VSS and the read data line pairs (DR11, DR21) and the data line pairs (DLT, DLB) are shut off. Thus, each of the load capacitances of the sense amplifier is reduced to CDL, and an amplifying time can be reduced.

When a re-writing operation is carried out, at first, the write control signal φW1 kept at the ground potential VSS is driven to the boosted voltage VDH and then the data line pairs (DLB1, DLT1) and the write data lines (DW11, DW21) are connected. After the write data lines (DW11, DW21) are driven to the potential corresponding to the read-out stored information, the dummy word line DWL and the word line WL2n kept at the waiting potential −VB are driven to the write potential VW to write original data. After performing the re-writing operation, each of the read control signal φR1 kept at the ground potential VSS and the switch control line RWL2 is driven to the power supply voltage VDD, and each of the read data lines DR11, DR12, DR21, the write data lines DW11, DW21 and the data lines DLT1, DLB1 is precharged to finish the reading operation.

Although omitted in FIG. 17, the read data line when the stored information "0" is read out is kept at the precharge potential VDD/2, so that an amount of signal at this time can be expressed as $$\Delta(V0(t))=(IDS\times t)/(2\times CDR) \quad (4)$$

in reference to the aforesaid equation (2).

With the foregoing configuration, the following four effects can be obtained.

At first, in reference to the equations (3), (4), the reference voltage VREF(t) can be generated at an approximate intermediate potential of the read data line potential driven in response to the stored information as shown in FIG. 4, whereby both positive and negative read signals can be obtained.

Secondly, each of the dummy cells DMC has the same structure as that of the memory cell MC shown in FIG. 3, so that an area of the dummy cell array DMCA is restricted. Further, only one dummy cell array DMCA is sufficiently provided in the block BLKQS, so that an area of the block BLKQS is restricted.

Thirdly, the dummy cell DMC is arranged at a rate of one dummy cell for two read data lines, so that a coupling capacitance formed between the dummy word line DWL and the dummy cell DMC can be reduced and it is possible to restrict a delay generated when the dummy word line DWL is driven.

Fourthly, the dummy cell composed of the read NMOS transistor having the same channel length as that of the memory cell is used, so that the reference voltage VREF(t) can be generated at an intermediate potential between the two-value read potentials V1(t) and V0(t) while avoiding a short channel effect at the read NMOS transistor.

With the foregoing, the reading operation for the memory cell MC connected to the data line pairs (DR21, DW21) in the block BLKQS2 has been described. However, also when the memory cell MC connected to the data line pairs (DR22, DW22) is read out, this operation can be similarly carried out while the precharge enabling signal EQ2, the read control signal φR2, the write control signal φW2 and the sense amplifier exciting signals SDP2, SDN2 are being properly driven.

For example, in order to read out the memory cell MCn2 in the block BLKQS2, the read data line-DR32 and the read data line arranged adjacent to the read data line DR32 omitted in FIG. 16 are connected to each other by the NMOS transistor QSW to double a data line length, they are driven by the dummy cell DMC in the block BLKQS3 to generate the reference voltage VREF(t). Then, the stored information is discriminated by the read/write control circuit RWC1 in the read/write control circuit array RWCAS2.

Up to now in this specification, the memory cell array configuration has been described in which the read/write control circuits RWC in the read/write control circuit array RWCAS1 are connected for every one read data line DR as shown in FIG. 16. However, the memory cell array configuration is not limited to this arrangement, various kinds of configuration can be provided.

Figure 18:
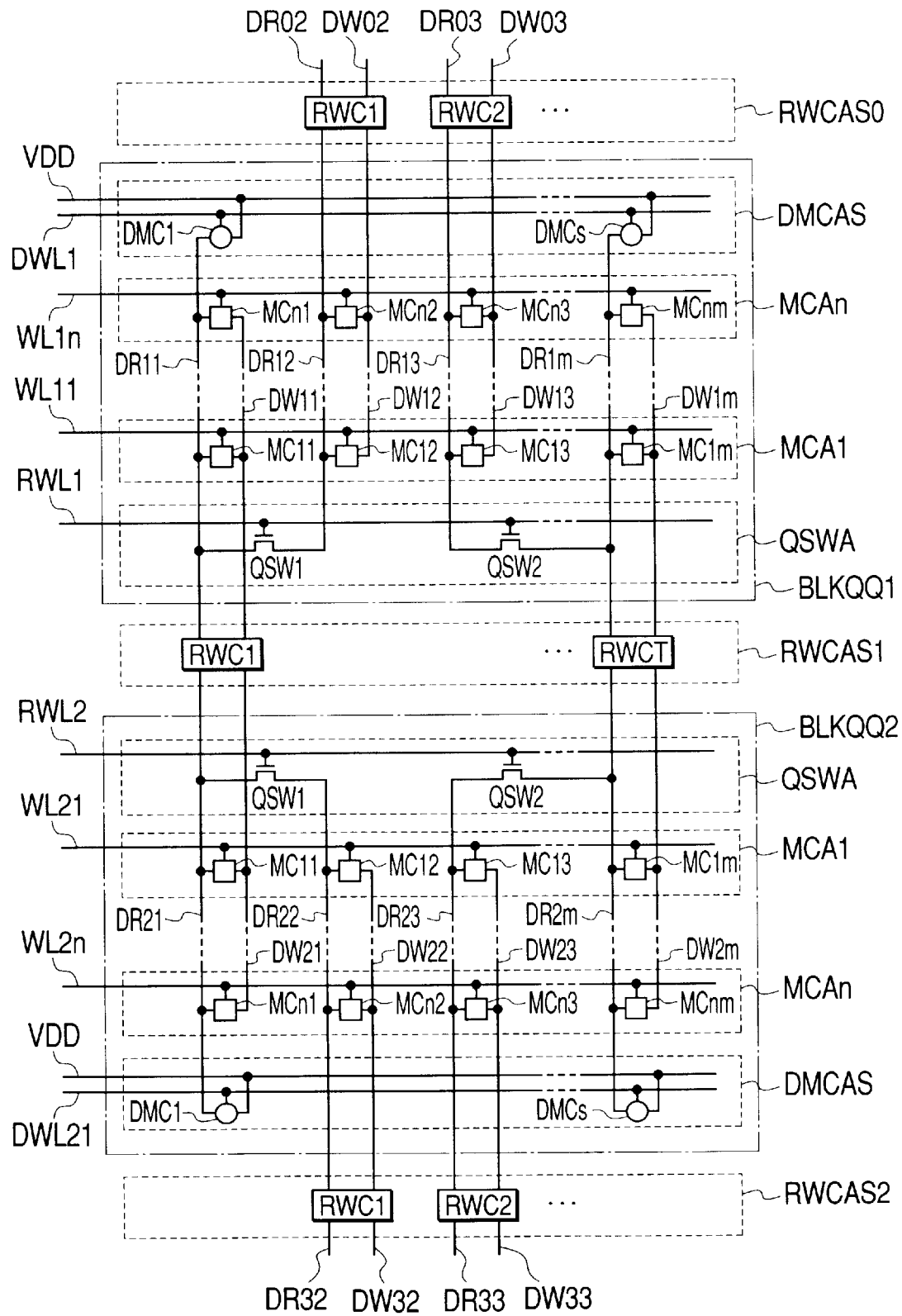
FIG. 18 is a diagram of another configuration of the memory cell array of the semiconductor device according to the fourth embodiment of the present invention.

For example, as shown in FIG. 18, each of the read/write control circuits RWC may also be connected for every two sets of data line pairs in the read/write control circuit array RWCAS0 such that the data line pairs (DR02, DW02) and (DR12, DW12) are connected to the read/write control circuit RWC1, and the data line pairs (DR03, DW03) and (DR13, DW13) are connected to the read/write control circuit RWC2. In correspondence with this arrangement, the dummy cells DMC are connected at a rate of one dummy cell for two read data lines as found in the dummy cell array DMCAS in the block BLKQQ1, for example, such that the read data line DR11 is connected to the dummy cell DMC1, the read data line DR14 is connected to the dummy cell DMC2 and the read data line DR15 is connected to the dummy cell DMC 3. Arrangement of such a memory cell array configuration may also enable the similar effects as that of the memory cell array configuration shown in FIG. 16 to be obtained.

Up to now in the specification of the present invention, although the case in which the precharge potential is kept at VDD/2 has been described, the precharge potential is not limited to this value.

When the power supply voltage VDD is a low voltage such as 1V or less, the precharge potential may also be applied as the power supply voltage VDD. In this case, if the precharge enable signal EQ, the switch control line RWL and the read control circuit φR are driven to the boosted voltage VDH, the adjoining two read data lines can be precharged to the power supply voltage VDD and the ON-current of sufficient high value is allowed to flow to the read NMOS transistor QR. Accordingly, it is possible to obtain sufficient high read signals Δ(V0(t)), Δ(V1(t))

<Embodiment 5>

In this embodiment, another configurations of the memory cell and the dummy cell used for the memory cell array configuration shown in the previous embodiment of the present invention will be described.

Figure 19:
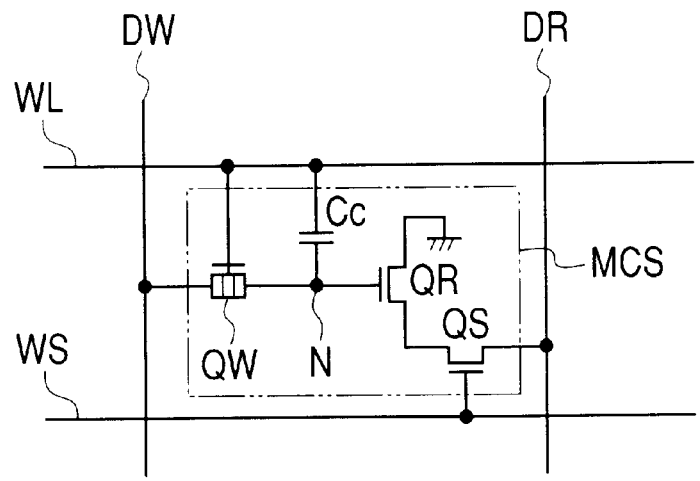
FIG. 19 is a diagram of a memory cell composed of three-transistors used in the semiconductor device according to a fifth embodiment of the present invention.

FIG. 19 shows a configuration of a capacitance-coupled type three-transistor cell (hereinafter referred to as a memory cell MCS) in which the write transistor QW shown in FIG. 3 is applied to the write transistor of the memory cell composed of the well-known three-transistor.

Its feature differing from the memory cell MC shown in FIG. 3 consists in the fact that a selective NMOS transistor QS is added to. A current flow path between the drain and the source of the selective NMOS transistor QS is inserted into the current flow path between the read data line DR and the drain (or the source) of the read NMOS transistor QR, and a selective word line WS is connected to the gate of the selective NMOS transistor QS. In such a configuration as above, the transistors QR, QW have a stacked structure as illustrated in FIG. 3, so that it is possible to realize the three-transistor memory cell having a smaller cell area than that of the prior art.

Then, an example of configuration of the dummy cell used when the stored information in the aforesaid memory cell is discriminated will be described.

Figure 20:
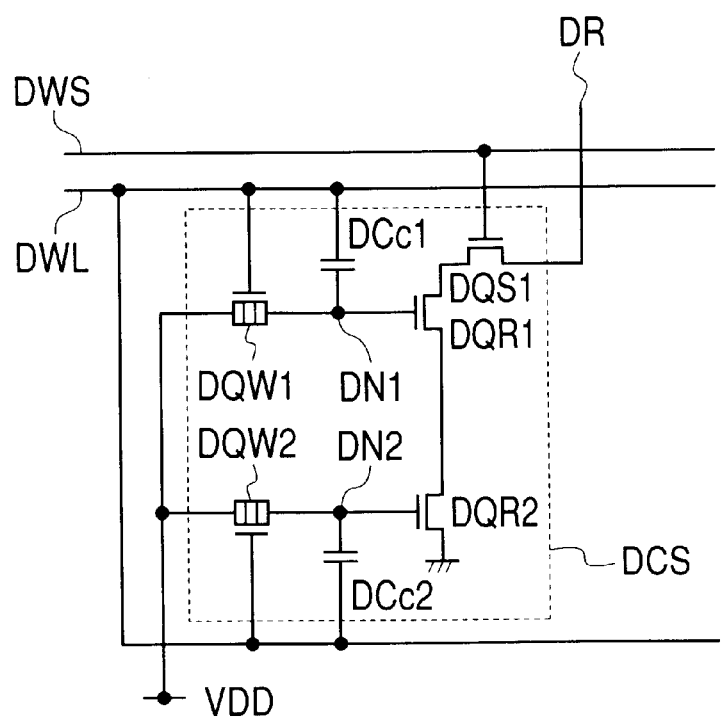
FIG. 20 is a diagram of a dummy cell used in a semiconductor device according to the fifth embodiment of the present invention.

FIG. 20 shows the dummy cell DCS having a configuration in which the dummy cell DC shown in FIG. 5 is applied. Its feature different from that of the dummy cell DC consists in the fact that the selective NMOS transistor DQS1 is added. The selective NMOS transistor DQS1 is the same as the selective NMOS transistor QS in the memory cell MCS. A current path between the drain and the source of the selective NMOS transistor DQS1 is inserted into a current path between the read data line DR and the drain (or the source) of the read NMOS transistor DQR1, and a dummy selective word line DWS is connected to the gate of the selective NMOS transistor DQS1.

Figure 21:
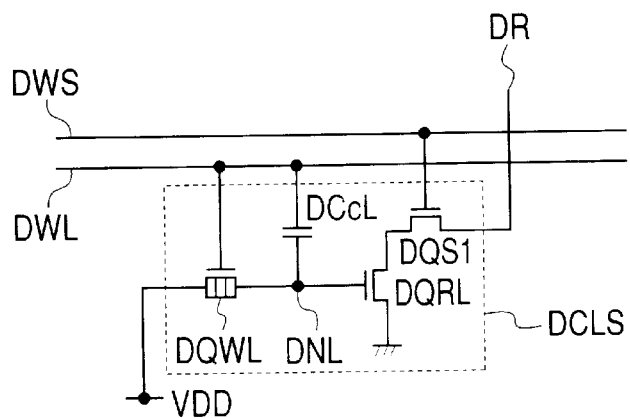
FIG. 21 is a diagram of another dummy cell used in the semiconductor device according to the fifth embodiment of the present invention.

Further, FIG. 21 shows a dummy cell DCLS having a configuration in which the dummy cell DCL shown in FIG. 11 is applied. Its feature differing from that of the dummy cell DCL consists in the fact that the selective NMOS transistor DQS1 is added. The selective NMOS transistor DQS1 is the same as the selective NMOS transistor QS in the memory cell MCS. A current path between the drain and the source of the selective NMOS transistor DQS1 is inserted into a current path between the read data line DR and the drain (or the source) of the read NMOS transistor DQRL, and a dummy selective word line DWS is connected to the gate of the selective NMOS transistor DQS1.

Figure 22:
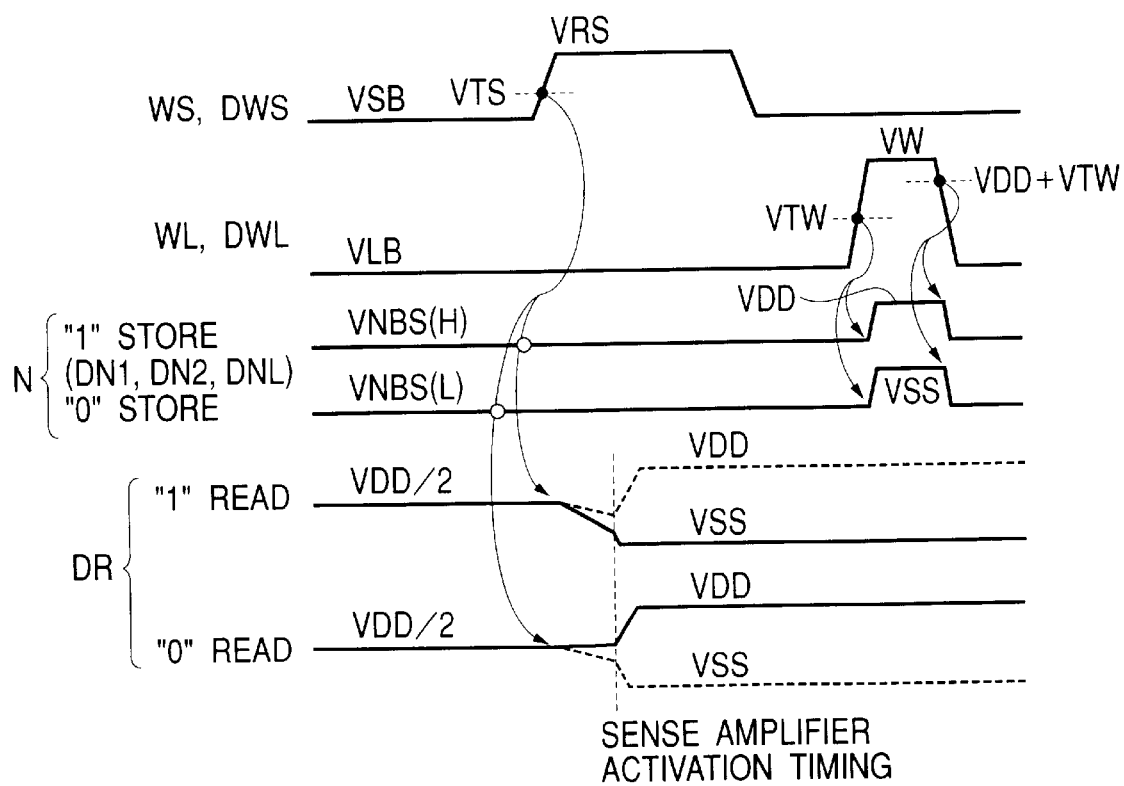
FIG. 22 is a diagram showing reading operation timing in the semiconductor device according to the fifth embodiment of the present invention.

In the following, an operation waveform of each of the memory cell MCS, and the dummy cells DCS and DCLS will be described on the basis of the operation described in reference to FIG. 10. FIG. 22 shows each of the operation waveforms in the selective word line WS, the dummy selective word line DWS, the word line WL, the dummy word line DWL, the memory node N of the memory cell MCS holding information of either "1" or "0", and the read line DR to which the memory cell MCS is connected. In this case, the operation waveform of the read data line DR having the reference voltage VREF(t) generated therein is indicated by a dotted line together with the operation waveform at the read line DR. The operation waveforms at the memory nodes DN1, DN2 and DNL in the dummy cells DCS and DCLS are the same as that of the memory node N holding information "1" as already described in the first and second embodiment.

A feature of this operation differing from that shown in FIG. 10 consists in the fact that potentials in the word line WL and the dummy word line DWL are driven to two values, i.e. the waiting potential VLB and the write potential VW. The waiting potential VLB is lower potential than a threshold voltage VTW of the write transistor QW and at the same time it is set such that the potential VNBS(H) of the memory node N holding information "1" is higher than a threshold potential VTR of the read NMOS transistor QR, and a potential VNBS(L) of the memory node N holding information "0" is lower than the threshold potential VTR of the read NMOS transistor QR.

At first, its reading operation will be described bellow.

The selective word line WS and the dummy selective line DWS kept at the waiting potential VSB are driven to the higher selective potential VRS than the threshold potential VTS of each of the selective NMOS transistors QS, DQS1 and then the selective NMOS transistors QS, DQS1 are brought into conduction. At this time, since the read NMOS transistors QR, DQR1, DQR2 and DQRL are brought into conduction, the memory cell MCS and the dummy cells DCS and DCLS holding information "1" electrically discharge the read data line DR toward the ground potential VSS to generate the read signals V1(t) and VREF(t) shown in FIG. 4.

In turn, since the read NMOS transistor QR is kept at its off-state, the read data line DR having the memory cell MCS holding information "0" is held at the precharge potential VDD/2. That is, the read signal V0(t) is kept at the precharge potential VDD/2. With such an arrangement as above, since the positive or negative small signal is generated in response to the stored information, information can be discriminated by amplifying them by the sense amplifier in the same manner as that shown in FIG. 10.

Then, a rewriting operation will be described below.

At first, the selective word line WS and the dummy selective word line DWS kept at the selective potential VRS are driven to the waiting potential VSB to bring the selective NMOS transistors QS, DQS1 into the off-state.

Then, the word line WL and the dummy word line DWL kept at the waiting potential VLB are driven to the write potential VW to bring the write transistors QW, DQW1, DQW2 and DQWL into conduction and then the memory nodes N, DN1, DN2 and DNL are driven to the potential corresponding to the original stored information.

Although the operation of the dummy cells DCS, DCLS in FIGS. 19 and 20 has been described, the configuration of the dummy cell is not limited to them. Three examples of other configuration will be described below.

Figure 23:
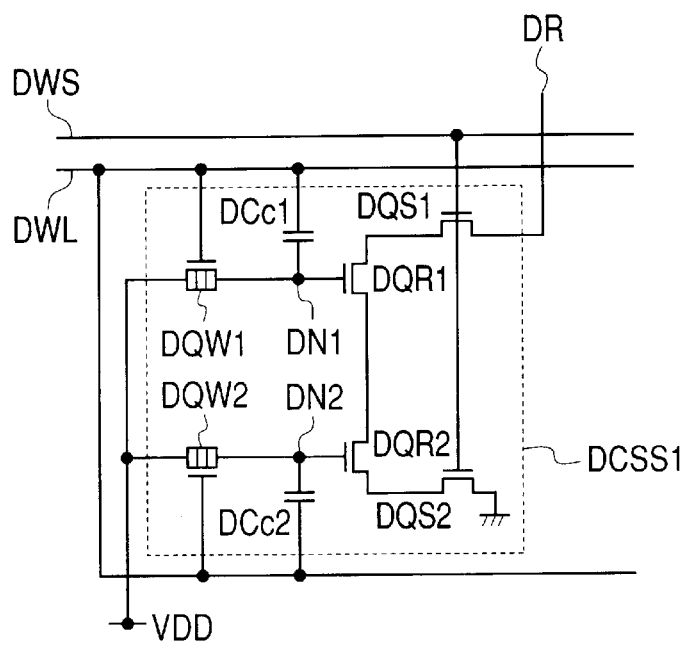
FIG. 23 is a diagram of another dummy cell used in the semiconductor device according to the fifth embodiment of the present invention.

FIG. 23 shows the dummy cell DCSS1 in which the selective NMOS transistor DQS2 is added to the dummy cell DCS shown in FIG. 20. The selective NMOS transistor DQS2 is the same as the selective NMOS transistor QS in the memory cell MCS. A current path between the drain and the source of the selective NMOS transistor DQS2 is inserted into a current path between the drain (or the source) of the read NMOS transistor DQR2 and the ground potential, and the dummy selective word line DWS is connected to the gate of the selective NMOS transistor DQS2.

Figure 24:
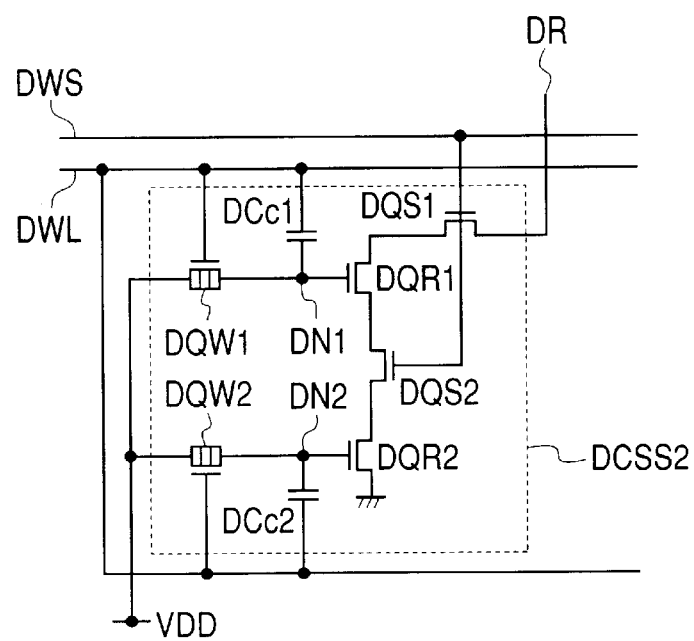
FIG. 24 is a diagram of another dummy cell used in the semiconductor device according to the fifth embodiment of the present invention.

FIG. 24 shows a dummy cell DCSS2 having a configuration in which a connection in the dummy cell DCSS1 shown in FIG. 23 is modified. A current path between the drain and the source of the selective NMOS transistor DQS2 is inserted into a current path between the drain (or the source) of the read NMOS transistor DQR1 and the drain (or the source) of the read NMOS transistor DQR2.

In the aforesaid two examples of the configuration, adding of the selective NMOS transistor DQS2 causes a total channel length of the selective NMOS transistor to become twice the channel length of the selective NMOS transistor QS in the memory cell MCS. Thus, influence of the selective NMOS transistor over the ON-current flowing between the drain and the source of each of the read NMOS transistors DQR1, DQR2 can be reduced. In addition, fabrication variation generated at the memory cell MCS is replicated in the dummy cells DCSS1, DCSS2, so that the reference voltage VREF(t) can be generated in a high precision manner.

Figure 25:
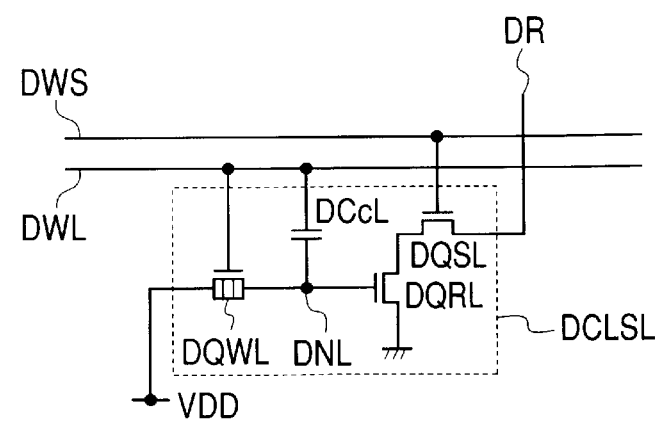
FIG. 25 is a diagram of another dummy cell used in the semiconductor device according to the fifth embodiment of the present invention.

FIG. 25 shows a modification of the dummy cell DCLS shown in FIG. 21, wherein a dummy cell DCLSL having the configuration using the selective NMOS transistor DQSL is shown. A channel length of the selective NMOS transistor DQSL is set to be twice the selective NMOS transistor QS in the memory cell MCS shown in FIG. 19. With such an arrangement, influence of the selective NMOS transistor over the ON-current flowing between the drain and the source of the read NMOS transistors DQRL can be reduced. As a result, the reference voltage VREF(t) can be generated in a high precision manner. An area where the two selective NMOS transistors are connected to each other is deleted as compared with the dummy cell DCSS1 shown in FIG. 23 and the dummy cell DCSS2 shown in FIG. 24, so that the dummy cell area can be restricted.

<Embodiment 6>

In this embodiment, another configuration and operation in the memory cell array will be described below.

Figure 26:
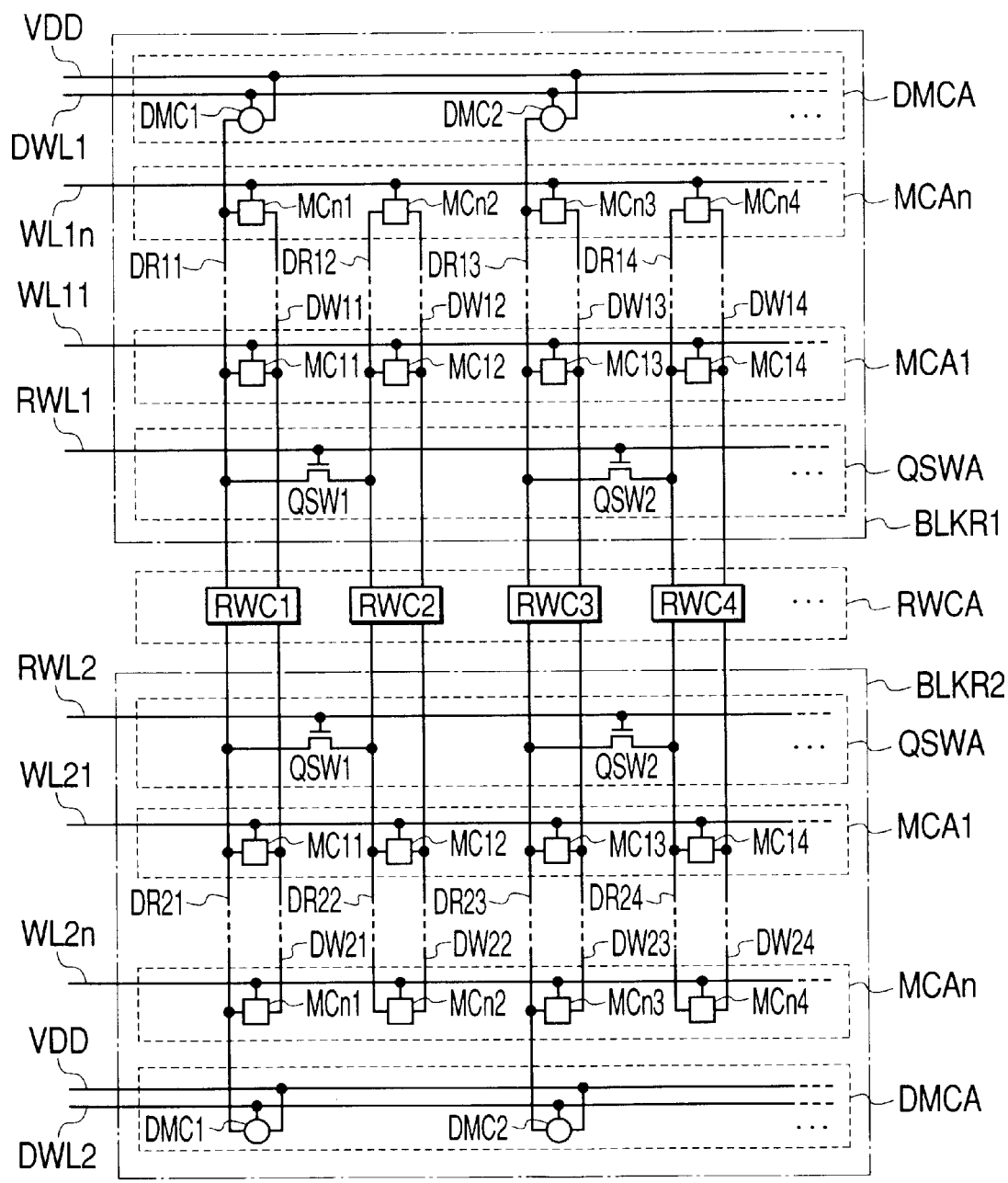
FIG. 26 is a diagram of configuration of a memory array of a semiconductor device according to a sixth embodiment of the present invention.

FIG. 26 shows blocks BLKR1 and BLKR2 and the read/write control circuit array RWCA in accordance with this embodiment. Although omitted in this figure, it is assumed that a plurality of read/write control circuit arrays and blocks are arranged in a vertical direction. The block BLKR in accordance with this embodiment has a memory cell array with bits of (n)×(m) in the same manner as that found in the embodiment described above.

Its feature in the configuration of the embodiment differing from that described above as compared with the memory cell array shown in FIG. 16 consists in the fact that each of the two sets of adjoining data line pairs, such as the data line pairs (DR11, DW11) and (DR12, DW12), capable of short-circuiting the read data lines by the read data line switch QSW is connected to each of the two read/write control circuits RWC in the same read/write control circuit array. Accordingly, the read/write control circuit array RWCA in this figure is composed of the number of (m) of the read/write control circuits RWC (m is an even number).

An operation of the embodiment is basically the same as that described in reference to FIGS. 16 and 18 of the fourth embodiment, the read data line having twice of the data line length under application of the dummy cell DMC having the same configuration as that of the memory cell DC is driven and the reference voltage VREF(t) shown in FIG. 4 can be generated.

In the following description, assumption used in the description in reference to the fourth embodiment is applied and the read/write control circuits RWC1, RWC2 in the read/write control circuit array RWCA are focused. In order to generate the reference voltage, as the dummy word line DWL1 is driven to the read potential VR and the dummy cell DMC1 is activated. The read NMOS transistor may drive the read data lines DR11, DR12 and the data lines DLT1, DLT2 short circuited by each of the NMOS transistor QSW, and the NMOS transistor MNR in the data line control circuit DSW1 within the read/write control circuits RWC1, RWC2, respectively. Accordingly, the reference voltage VREF(t) can be expressed as follow.

$$VREF(t)=VDD/2-(IDS \times t)/[\beta \times (CDR+CDL)] \qquad (5)$$

In this case, considering the wiring capacitance generated because the read data lines DR21 and DR22 are connected, a value of $\beta$ is about 2. This reference voltage is inputted to the read/write control circuits RWC1, RWC2 and used for reading out the stored information in the memory cell of 2 bits connected to each of the read data lines DR21, DR22.

Following two effects can be obtained in reference to such a configuration and operation as described above.

At first, as compared with the equation (2) of the fourth embodiment, the equation (5) in the embodiment has twice each of the read data line DR and the data line DLT. And therefore, a reference voltage can be generated more accurately.

Secondly, the two read data lines have been driven to read out the stored information of 1 bit in the fourth embodiment and to generate a reference voltage. In turn, the reference voltage generated by driving the two read data lines in the embodiment is used for reading operation for 2 bits, so that the consumption current for use in generating the reference voltage can be reduced to its half value.

In the dummy cell array DMCA shown in FIG. 26, the dummy cells are arranged at a rate of one dummy cell for two read data lines such that the dummy cells DMC1, DMC2, DMC3 and DMC4 in the block BLKR1 are connected to the read data lines DR11, DR13, DR15 and DR17. However, the arrangement of the dummy cells is not limited to this arrangement and various kinds of arrangement can be realized. For example, it is also possible to arrange the two dummy cells while being adjacent to each other in such a way that the dummy cells DMC1, DMC2, DMC3 and DMC4 are connected to the read data lines DR12, DR13, DR16 and DR17. Also in this case, the same effect as that described above can be obtained.

Figure 27:
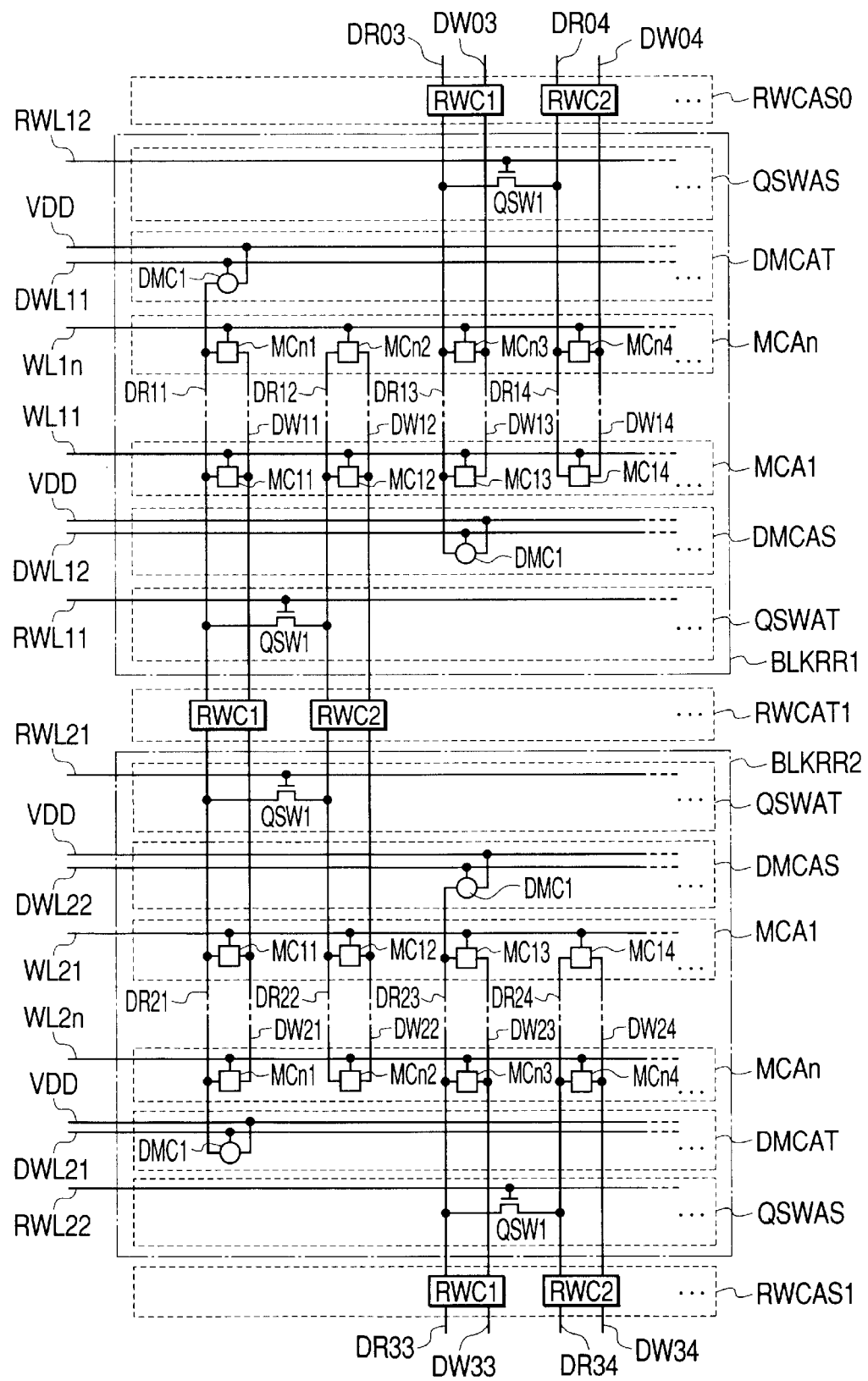
FIG. 27 is a diagram of another configuration of the memory array of the semiconductor device according to the sixth embodiment of the present invention.

There has been illustrated the memory cell array configuration in which each of the data line pairs (DR, DW) in the block BLKR1, for example, is connected to the read/write control circuits RWC1, RWC2, . . . , RWCm arranged on one side of the block BLKR1. However, the memory cell array configuration is not limited to this configuration and various kinds of configuration can be realized. For example, as shown in FIG. 27, it may also be applicable that the read/write control circuit arrays RWCAS0, RWCAT1 are arranged at both sides of the block BLKRR1; each of the data line pairs (DR03, DW03) and (DR13, DW13) is connected to the read/write control circuit RWC1 in the read/write control circuit array RWCAS0; each of the data line pairs (DR04, DW04) and (DR14, DW14) is connected to the read/write control circuit RWC2; each of the data line pairs (DR11, DW11) and (DR21, DW22) is connected to the read/write control circuit RWC1 in the read/write control circuit array RWCAT1; and each of the data line pairs (DR12, DW12) and (DR22, DW22) is connected to the read/write control circuit RWC2.

In correspondence with this configuration, the block BLKRR1 is configured such that the dummy cell arrays DMCAS, DMCAT are arranged at both ends of the memory cell arrays MCA1, MCA2, . . . , MCAn, the read data line DR13 is connected to the dummy cell DMC1 in the dummy cell array DMCAS, and the read data line DR11 is connected to the dummy cell DMC1 in the dummy cell array DMCAT. Also in this case, the arrangement of the dummy cell is not limited to this arrangement and if this arrangement is set at a rate of one dummy cell for two read data lines as described above, various kinds of arrangement can be performed. For example, it may also be arranged such that the dummy cell DMC1 in the dummy cell array DMCAT is connected to the read data line DR12.

In addition, in this figure is illustrated a configuration in which the read data line connection switch arrays QSWAT, QSWAS are arranged at both ends of the dummy cell arrays DMCAS, DMCAT; the read data line pairs (DR11, DR12) are connected to the source and the drain in the NMOS transistor in the read data line connection switch array QSWAT; and each of the read data line pairs (DR13, DR14) is connected to the source and the drain of the NMOS transistor in the read data line connection switch array QSWAS. Since the arrangement of the read data line connection switch array QSWA is not limited, one read data line connection switch array is satisfactory as shown in FIG. 26; however, the arrangement shown in FIG. 27 maintains a symmetrical characteristic of the memory cell arrays and facilitate its fabrication as well as its design. As described above, the read/write control circuits RWC are arranged in each of the read/write control circuit arrays RWCAS0, RWCAT1, RWCAS1 of the memory cell array configuration in FIG. 27 at a rate of two read/write control circuits for four read data lines, so that this configuration has some effects that their layout becomes easy and an increasing in layout area in the read/write control circuit array RWCA.

<Embodiment 7>

In this embodiment, assuming operating characteristics of a read MOS transistor different from that described in the previous embodiments, an example of configuration and operation of a memory array suitable for the operating characteristics will be described below.

Figure 28:
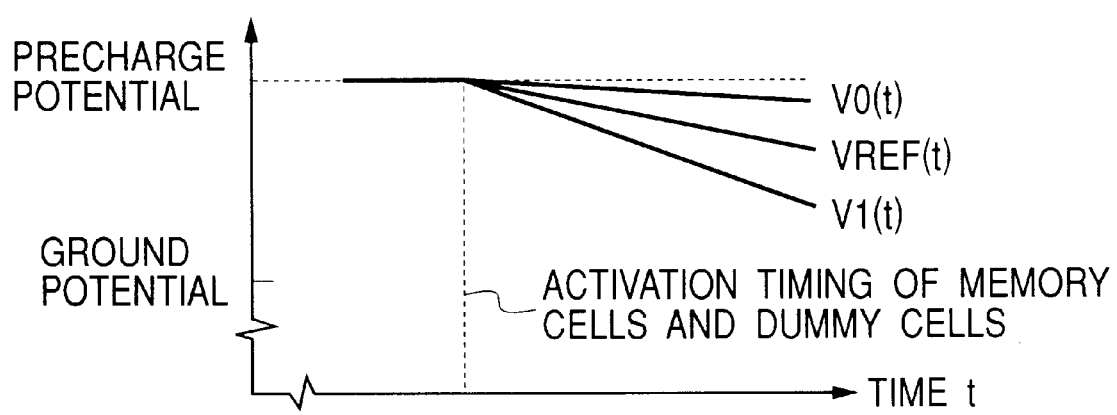
FIG. 28 is a diagram showing relation between a memory cell and a reading data line potential driven by a dummy cell in a semiconductor device according to a seventh embodiment of the present invention.

At first, it is assumed that variations in threshold voltage in a read NMOS transistor is high, a memory node potential VNR(L) at a memory cell holding stored information "0" becomes a higher potential than a threshold voltage VTR of a read NMOS transistor QR when a word line WL is driven to a read potential VR and then the read NMOS transistor QR is brought into conduction. In this case, the read data line having the memory cell holding the stored information "0" connected thereto is gradually discharged from a precharge voltage to decrease its potential as shown in FIG. 28. Applying a reference voltage generating method in accordance with the previous embodiments to such memory cell characteristics as above decrease an amount of signals when the stored information "0" is read out less than an amount of signals when the stored information "1" is read out.

Figure 29:
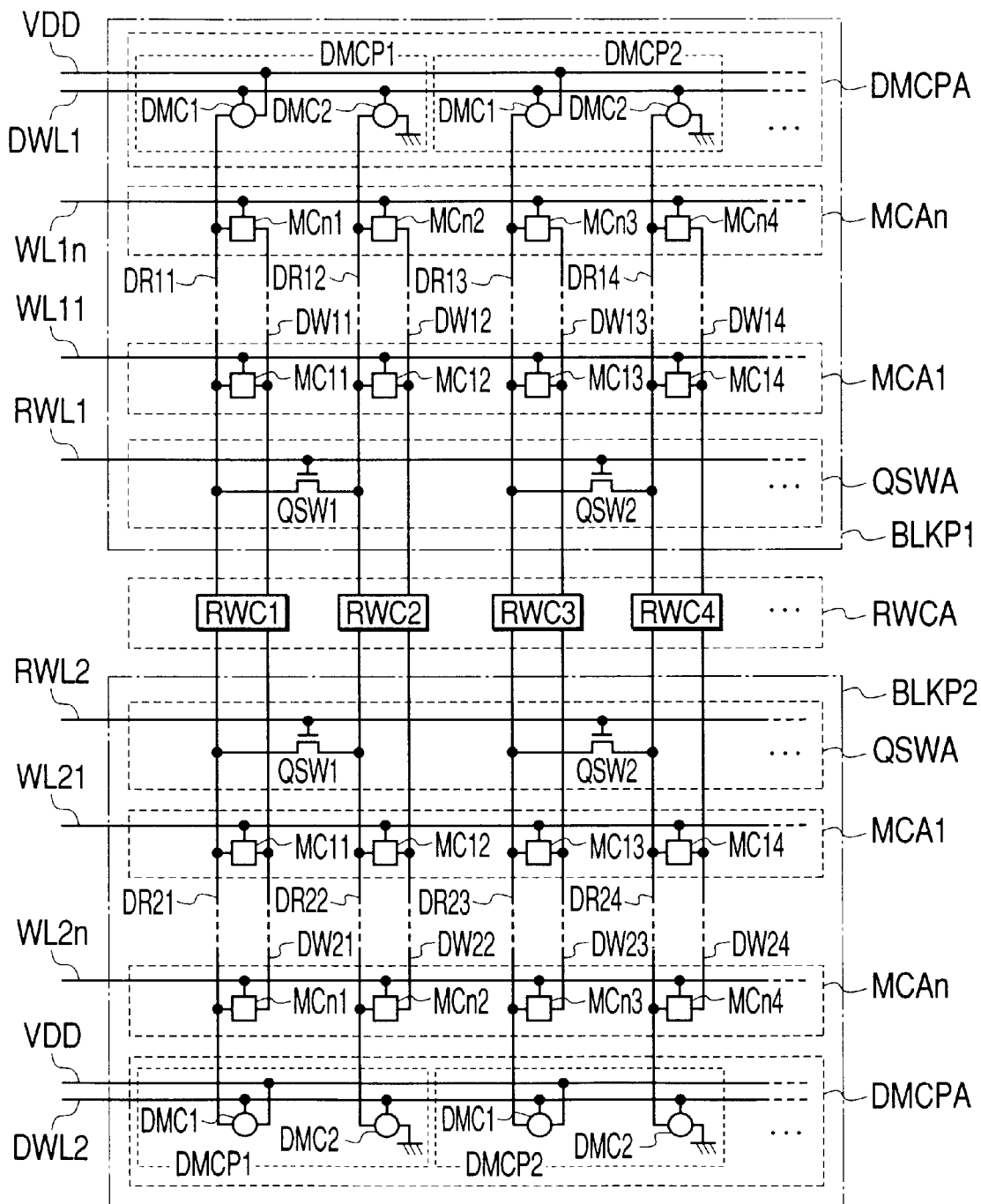
FIG. 29 is a diagram of configuration of a memory cell array of the semiconductor according to the seventh embodiment of the present invention.

In view of the foregoing, an object of the present embodiment is to generate a reference voltage VREF(t) at an intermediate potential between the read data line potentials V1(t) and V0(t) corresponding to the stored information in such a way that equal amount of signals may be obtained which stored information "0" or "1" is read out. FIG. 29 shows the blocks BLKP1, BLKP2 and the read/write control circuit array RWCA in accordance with this embodiment. The block BLKP has a memory cell array of (n×m) bits in the same manner as that of the previous embodiment.

A feature in configuration of this embodiment different from that of the memory cell array shown in FIG. 26 consists in the fact that each of the blocks BLKP has dummy cell pairs array DMCPA in place of the dummy cell array DMCA. The dummy cell pairs array DMCPA has the number of (s) of dummy cell pairs DMCP1, DMCP2, . . . , DMCPs. Each of the dummy cell pairs DMCP is composed of the dummy cells DMC1, DMC2 having the same configuration as that of the memory cell MC shown in FIG. 3. These dummy cell pairs are arranged for every two sets of read data line pairs such that each of the dummy cell pairs DMCP1 in the block BLKP1 is connected to the read data line pairs (DR11, DR12) and each of the dummy cell pairs DMCP2 is connected to the read data line pairs (DR13, DR14). Thus, the real numbers (m) and (s) have a relation of m=2s.

Figure 30:
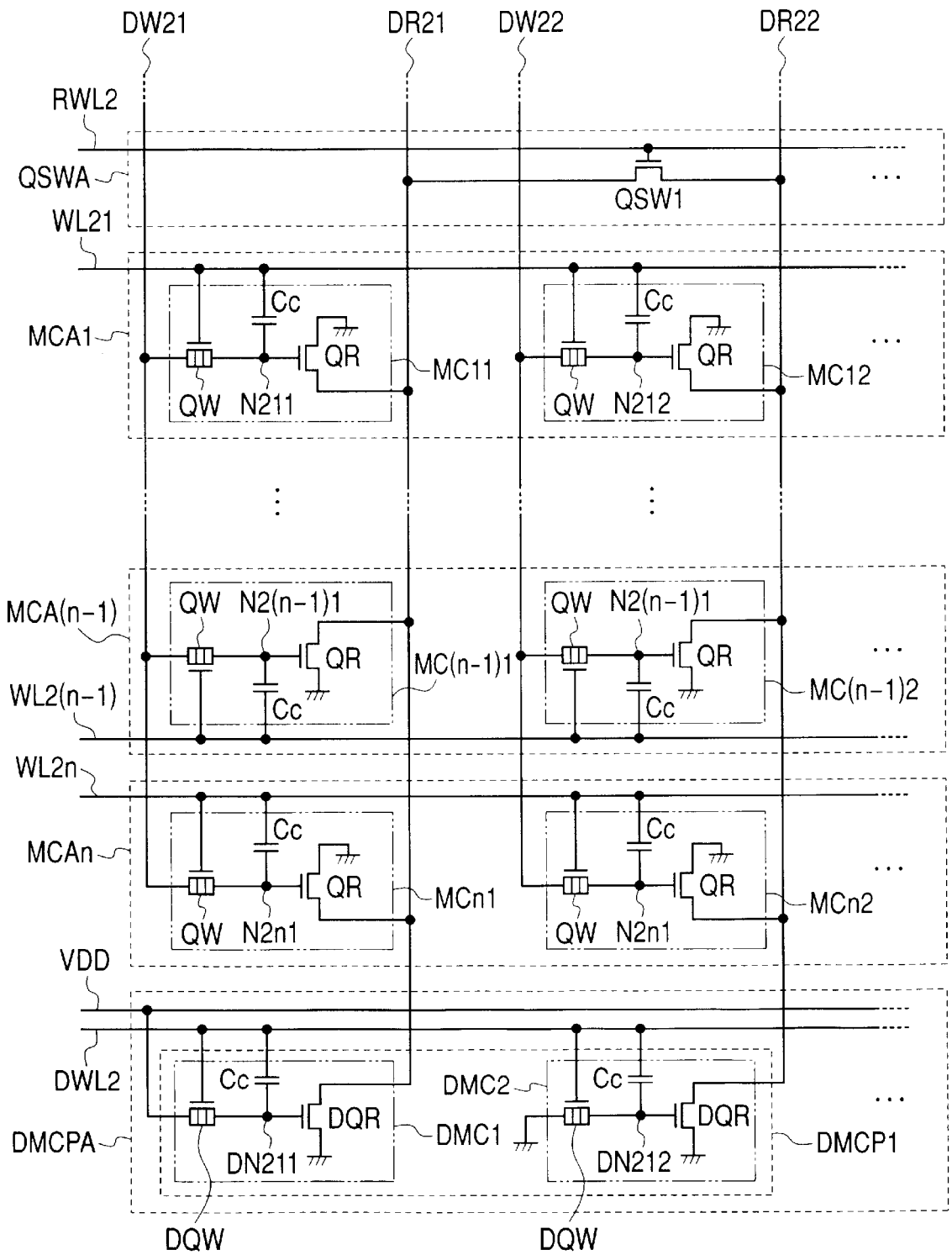
FIG. 30 is a circuit diagram of configuration of memory cells and dummy cells in the memory cell array according to seventh embodiment of the present invention.

Each of the dummy cells DMC1 and DMC2 constituting the dummy cell pairs DMCP is connected to each of the read data lines DR21, DR22 in the dummy cell pairs DMCP1 in the block BLKP2. Each of the potentials inputted to the power supply lines of the dummy cells DMC1, DMC2 is made different from each other. In order to describe these connections, FIG. 30 shows a substantial part of the block BLKP2 in the configuration of memory cell array of the embodiment.

The power supply voltage VDD is inputted to the source of the write transistor DQW in the dummy cell DMC1 through the power supply line, and the ground potential VSS is inputted to the source of the write transistor DQW in the dummy cell DMC2 through the power supply line. The gates of the read NMOS transistor and the write transistor QW in each of the dummy cells DMC1, DMC2 are connected to the same dummy word line DWL2.

Figure 31:
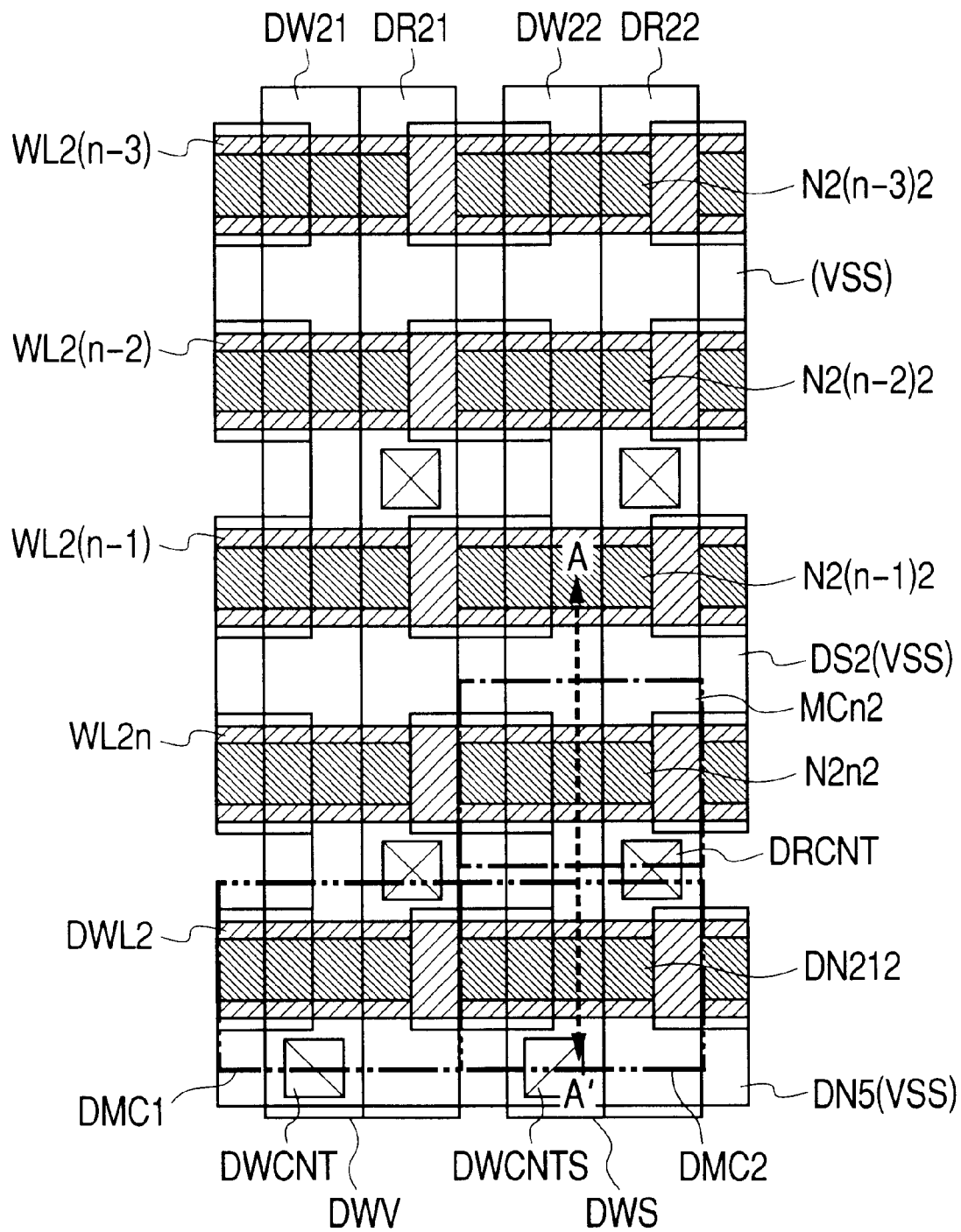
FIG. 31 is a diagram showing a part of layout of the memory cell array of the semiconductor device according to the seventh embodiment of the present invention.

FIG. 31 shows a part of the layout of the block BLKP2 in the memory cell array configuration shown in FIG. 29. In this figure, each of the two sets of data line pairs (DR21, DW21), (DR22, DW22) is shown in a vertical direction and each of the word line WL2(n−3) to WL2n and the dummy word line DWL2 is shown in a lateral direction. In addition, a memory node N is formed at cross-points of the data line pairs (DR, DW) and the word line WL, and in this figure, the memory nodes N2(n−3)2, N2(n−2)2, N2(n−1)2, N2n2 are shown as representative one. Similarly, each of the memory nodes DN211, DN212 is formed at cross-points of the read data lines DR21, DR22 and the dummy word line DWL2, and in this figure the memory node DN212 is shown as its representative manner. Further, in this figure are shown the memory cell MCn2 enclosed by a dotted line and the dummy cells DMC1, DMC2 enclosed by a two-dotted line forming the dummy cell pairs DMCP1.

The layout in the present embodiment has the two different features in reference to the dummy cell DMC2 as compared with that of the layout shown in FIG. 7.

At first, since the dummy cell DMC has the same configuration as that of the memory cell MC, its area becomes a half of it and the n$^+$Si diffusion layer (DS4 in FIG. 9) having two read NMOS transistors connected in series is removed.

Secondly, the write data line contact DWCNTS is arranged to input the ground potential VSS to the dummy cell DMC2.

Figure 32:
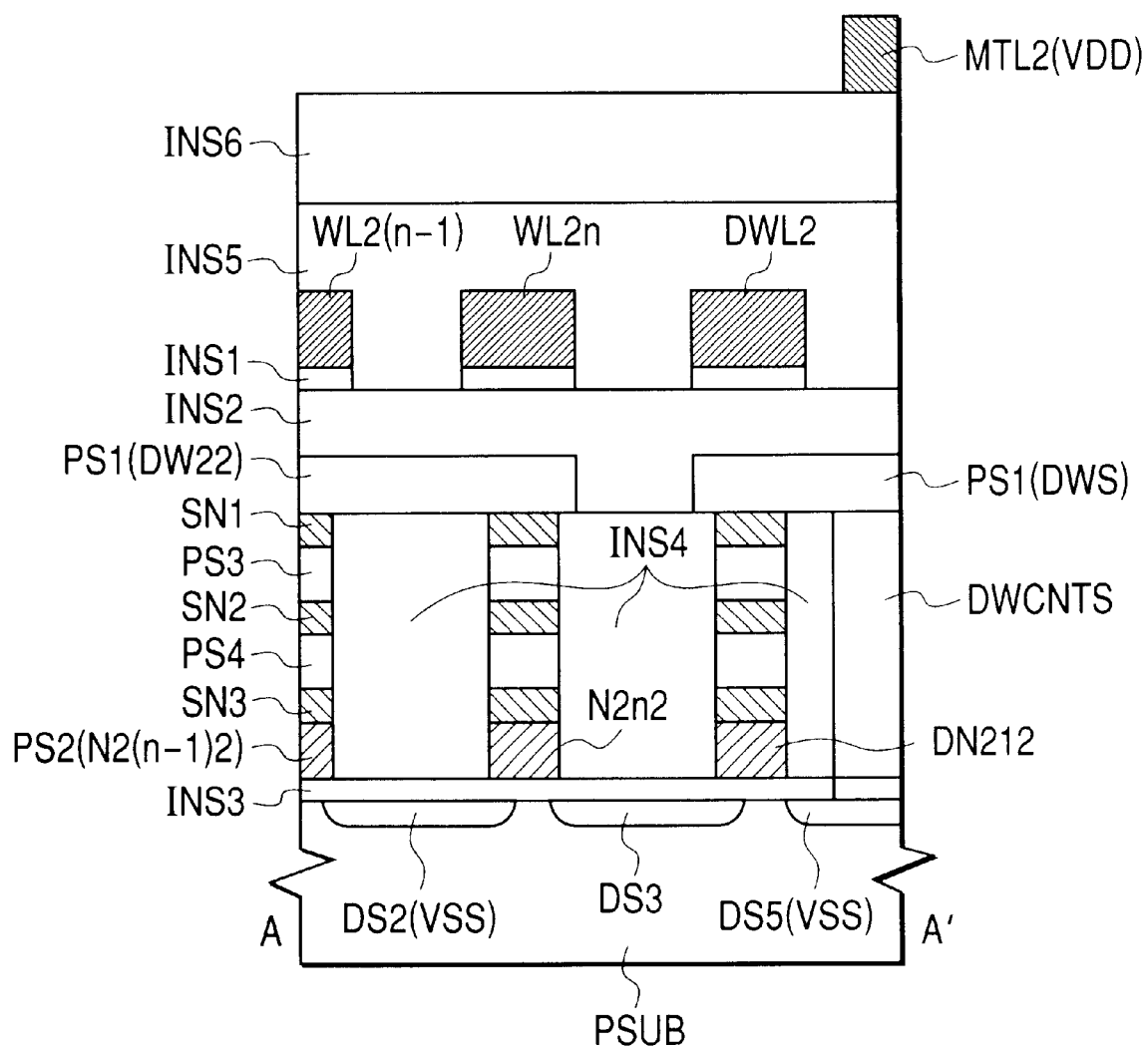
FIG. 32 is a diagram of a schematic sectional structure taken along line A–A' shown in FIG. 31.

This cubic structure can be understood in reference to a schematic sectional view taken along line A—A in FIG. 31 shown in FIG. 32. That is, the write data line contact DWCNTS is formed in such a manner as to be brought into contact with the n+Si diffusion layer DS5 having the ground potential VSS fed therewith and the power supply feeding line DWS of the dummy cell DMC2.

With this configuration, stored information "1" can be written into one dummy cell (DMC1 in this case) of the dummy cell pairs DMCP in the embodiment, and the stored information "0" can be written into the other dummy cell (DMC2 in this case).

Operation of the embodiment is basically the same as that described in reference to FIG. 26 of the sixth embodiment, wherein the reference voltage VREF(t) shown in FIG. 28 is generated on the read data line having the twice data line length. However, the feature in which the read data line having the twice length is driven under application of the dummy cell pairs DMCP is different from the previous case.

In the following, assumption used in the description of the fourth embodiment is applied and it is assumed that each of the memory cells MCn1, MCn2 holds the stored information "1", "0". Further, a current flowing in the NMOS transistor QR when the cell holding the stored information "1" is selected is denoted by IDS(1) under an assumption that dependability of inter-source-drain voltage is sufficiently low. Further, a current flowing in the read NMOS transistor QR when the cell holding the stored information "0" is selected is denoted by IDS(0). A reference voltage generating mechanism will be described in reference to the read/write control circuits RWC1, RWC2 in the read/write control circuit array RWCA under these assumptions.

At first, when the word line WL2n is driven to the read potential VR to activate the memory cell MCn1 holding the stored information "1", the potential of the read data line DR21 can be expressed as $$VDR21(t) = VDLB1(t) \qquad (6)$$
$$= VDD/2 - [IDS(1) \times t]/[CDR + CDL]$$

In addition, since the memory cell MCn2 holding the stored information "0" is activated, the potential of the read data line DR22 can be expressed as $$VDR22(t) = VDLB2(t) \qquad (7)$$
$$= VDD/2 - [IDS(0) \times t]/[CDR + CDL]$$

Further, when the dummy word line DWL1 is driven to the read potential VR to activate the dummy cell pairs DMCP1 holding the stored information "1" and "0" therein, the read data lines DR11, DR12 short-circuited by each of the NMOS transistor QSW and the NMOS transistor MNR in the data line control circuit DSW1 in the read/write control circuits RWC1, RWC2, and the data lines DLT1, DLT2 are driven. At this time, the potentials in the data lines DL11, DL12 can be expressed as $$VREF(t) = VDR11(t) = VDLT1(t) \qquad (8)$$
$$= VDR12(t) = VDLT2(t)$$
$$= VDD/2 - [(IDS(1) + IDS(0)) \times t]/[\gamma \times (CDR + CDL)]$$
$$= VDD/2 - [\{(IDS(1) + IDS(0))/\gamma\} \times t]/(CDR + CDL)$$

where, $\gamma$ is about 2 under consideration of a wiring parasitic capacitance generated due to connection between the read data lines DR11, DR12.

Thus, each of the read data lines DR11, DR12 is electrically discharged at an approximate average current of IDS(1), IDS(0). The reference voltage VREF(t) obtained here is inputted to the read/write control circuits RWC1, RWC2 and used for reading out the stored information of the memory cell of 2-bits connected to each of the read data lines DR21, DR22.

Assuming that a value of $\gamma$ is 2, an amount of signal when the stored information "1" is read out can be expressed as follows in reference to the equations (6) and (7);

$$\Delta(v1(t)) = VDR21(t) - VREF(t) \qquad (9)$$
$$= -[\{IDS(1) - IDS(0) \times t]/[2 \times (CDR + CDL)]$$

On the other hand, an amount of signal when the stored information "0" is read out can be expressed as follows in reference to the equations (6) and (8);

$$\Delta(v0(t)) = VDR22(t) - VREF(t) \qquad (10)$$
$$= [\{IDS(1) - IDS(0) \times t]/[2 \times (CDR + CDL)]$$

In the foregoing configuration and operation of the embodiments, the reference voltage VREF(t) can be generated at an approximate intermediate potential of the potential generated at the read data line in response to the stored information, resulting in that a positive or a negative read signal can be obtained as shown in FIG. 28 under application of the dummy cell pairs DMCP holding the stored information "1" and "0" even in the case where the read NMOS transistor in the memory cell holding the stored information "0" is brought into conduction.

In the dummy cell pairs array DMCPA shown in FIG. 29, the dummy cells DMC1, DMC2 are alternately arranged such that each of the dummy cell DMC1 holding the stored information "1" is connected to the data lines DR11, DR13, DR15 and DR17, and the dummy cell DMC2 holding the stored information "0" is connected to each of the read data lines DR12, DR14, DR16, DR18.

However, the dummy cell arrangement is not limited to this one, and it is also possible that the two dummy cells holding the same memory data are arranged adjacent to each other in such a way that the dummy cells DMC1, DMC2, DMC3, DMC4 are connected to the read data lines DR12, DR13, DR16, DR17, respectively; the dummy cell DMC1 holding the stored information "1" is connected to each of the read data lines DR12, DR13, DR16, DR17; and the dummy cell DMC2 for holding the stored information "0" is connected to each of the read data lines DR11, DR14, DR15, Dr18, for example. Also in this case, the same effect as that described above can be obtained.

The memory cell array configuration has been shown in which each of the data line pairs (DR, DW) in the block BLKP1, for example, is connected to the read/write control circuits RWC1, RWC2, . . . , RWCm arranged on one side of the block BLKP1. However, the memory cell array configuration is not limited to this arrangement, and various kinds of configuration can be carried out. For example, as shown in FIG. 33, there may be configured such that the read/write control circuit arrays RWCAS0, RWCAT1 are arranged on both sides of the block BLKPP1; the data line pairs (DR03, DW03) and (DR13, DW13) are connected to the read/write control circuit RWC1 in the read/write control circuit array RWCAS0; each of the data line pairs (DR04, DW04) and (DR14, DW14) is connected to the read/write control circuit RWC2; each of the data line pairs (DR11, DW11) and (DR21, DW21) is connected to the read/write control circuit RWC1 in the read/write control circuit array RWCAT1; and each of the data line pairs (DR12, DW12) and (DR22, DW22) is connected to the read/write control circuit RWC2.

In correspondence with this arrangement, the block BLKPP1 is configured to have dummy cell pairs array DMCPAS, DMCAPT at both ends of the memory cell arrays MCA1, MCA2, ..., MCAn,; the read data line pairs (DR13, DR14) are connected to the dummy cell pairs DMCP1 in the dummy cell pairs array DMCPAS; and the read data line pairs (DR11, DR12) is connected to the dummy cell DMCP1 in the dummy cell pairs array DMCPAT.

Figure 33:
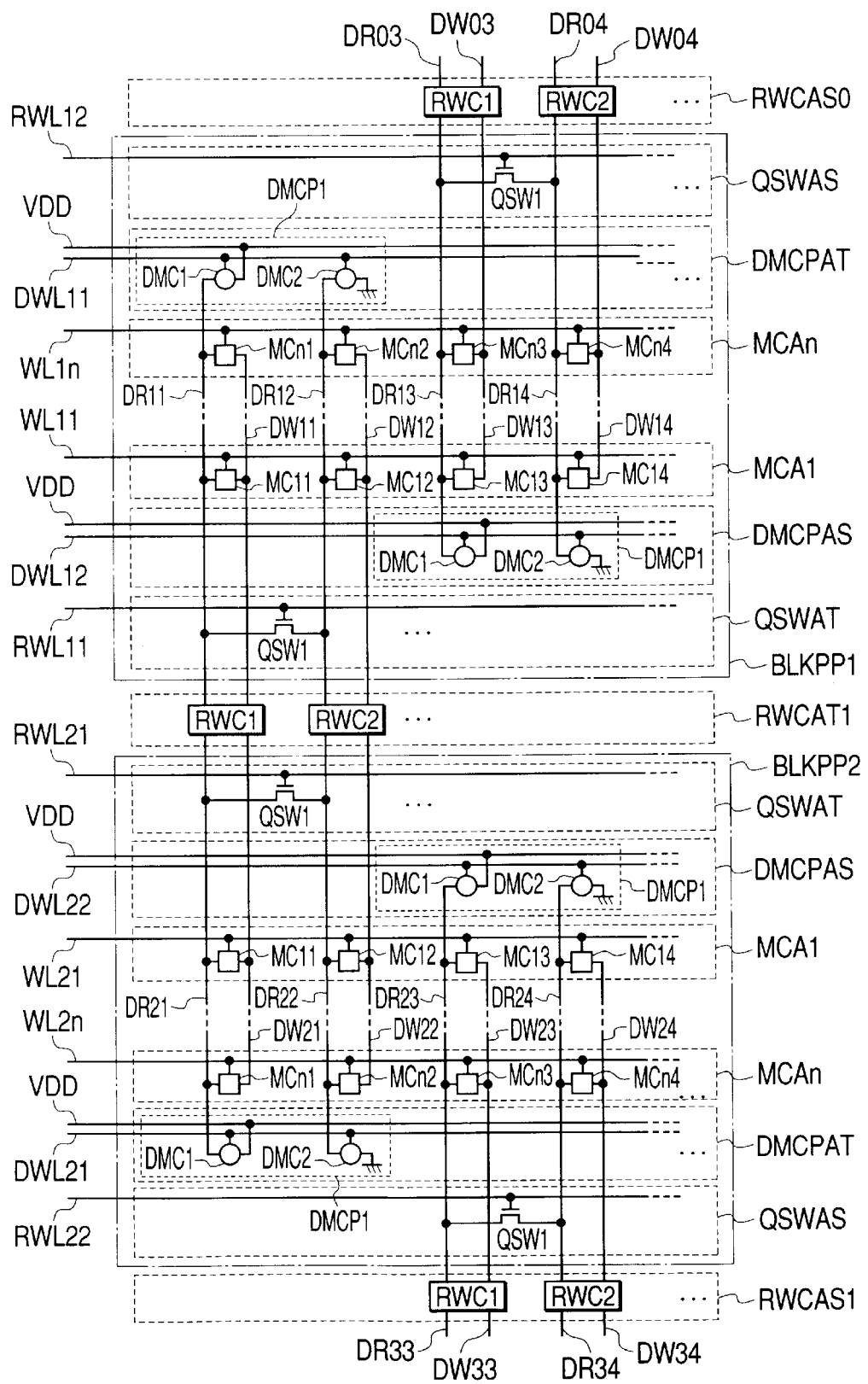
FIG. 33 is a diagram showing another configuration of the memory cell array of the semiconductor according to the seventh embodiment of the present invention.

In FIG. 33 is illustrated one example in which the dummy cells DMC1 and DMC2 are alternately arranged such that the dummy cell DMC1 holding the stored information 1 is connected to each of the read data lines DR11, DR13, DR15 and DR17; dummy cell DMC2 holding the stored information "0" is connected to each of the read data lines DR12, DR14, DR16 and DR18. However, the dummy cell arrangement is not limited to this arrangement, and it is also possible to provide an arrangement as described above, for example, in which the dummy cells holding the same stored data are connected to the adjoining read data line pairs in such a way that the dummy cells DMC1, DMC2, DMC3 and DMC4 are connected to the read data lines DR12, DR13, DR16 and DR17, for example; the dummy cell DMC1 holding the stored information "1" is connected to the read data lines DR12, DR13, DR16 and DR17; the dummy cell DMC2 holding the stored information "0" is connected to each of the read data lines DR11, DR14, DR15 and DR18. Also in this case, the same effect as that described above can be obtained.

In addition, in FIG. 33 is illustrated a configuration in which the read data line connecting switch arrays QSWAT, QSWAS are arranged at both ends of the dummy cell pairs arrays DMCPAS, DMCPAT; the read data line pairs (DR11, DR12) are connected to the source and the drain of the NMOS transistor in the read data line connecting switch array QSWAT; and the read data line pairs (DR13, DR14) are connected to the source and the drain of the NMOS transistor in the read data line connecting switch array QSWAS. Since the arrangement of the read data line connecting switch array QSWA is not limited, one memory cell array may sufficiently be applied as shown in FIG. 29 and the arrangement shown in FIG. 33 maintains a symmetrical characteristic of the memory cell arrays to facilitate its fabrication and design. In the memory cell array configuration shown in FIG. 33, the read/write control circuits RWC are arranged at each of the read/write control circuit arrays RWCAS0, RWCAT1, RWCAS2 at a rate of two read/write control circuits for four read data lines, so that this arrangement has some effects that their layout becomes easy and an increasing in layout area of the read/write control circuit array RWCA is restricted.

A method for generating a reference voltage under application of the dummy cell pairs described in reference to the preferred embodiment can also be applied to the memory cell array configuration shown in FIG. 16 or 18 of the example 4 in accordance with the preferred embodiment. That is, this arrangement is set such that the dummy cell DMC holding the stored information "0" is connected to the read data line DR where the dummy cell DMC holding the stored information "1" is not connected, and so concurrent driving of these two dummy cells obtain the similar effects.

Figure 34:
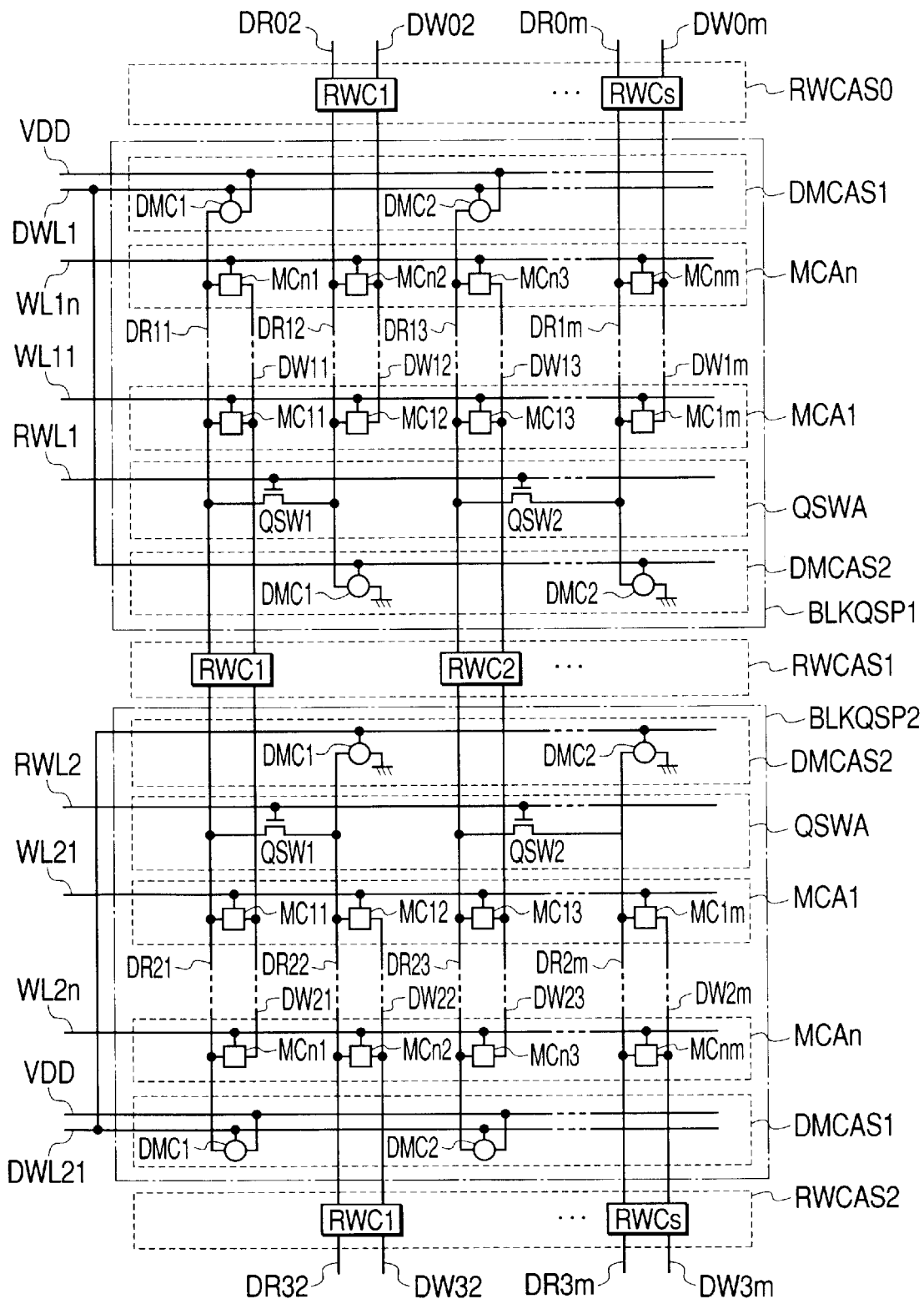
FIG. 34 is a diagram showing another configuration of the memory cell array of the semiconductor according to the seventh embodiment of the present invention.

FIG. 34 shows its one example. In reference to the block BLKQSP1, a feature differing from that of the block BLKQS1 shown in FIG. 16 consists in an arrangement in which the memory cell arrays MCA1, MCA2, ..., MCAn and the read data line connecting switch array QSWA are arranged between the dummy cell arrays DMCAS1 and DMCAS2. Each of the dummy cells DMC constituting the dummy cell array DMCAS1 is arranged to be connected in the same manner as that of the dummy cell array DMCAS shown in FIG. 16 at a rate of one dummy cell for two read data lines DR. Then, the power supply voltage VDD is connected to the power supply line to hold the stored information "1".

On the other hand, each of the dummy cells DMC constituting the dummy cell array DMCAS2 is arranged to be connected to the read data line DR to which the dummy cell DMC constituting the dummy cell array DMCAS1 is not connected. Since the dummy cell array DMCAS2 is arranged between the read/write control circuit RWCAS0 and the read data line connecting switch array QSWA, the ground potential VSS can be connected to the power supply line separated from the write data line and then the stored information "0" can be held at the dummy cell. Each of the dummy cells arranged in this way is driven by the dummy word line DWL1, whereby the reference voltage shown in FIG. 28 can be generated.

In addition, although this description has been performed with the use of the memory cell shown in FIG. 3, it is also possible to employ the memory cell shown in FIG. 19.

<Embodiment 8>

In this embodiment, another configuration and operation of the read/write control circuit used for the memory cell array described in reference to FIGS. 26 and 27 of the sixth embodiment and FIGS. 29 and 33 of the seventh embodiment will be described below. The present embodiment is characterized in that a current flowing in the read NMOS transistors in the memory cell MC and the dummy cell DMC is received by a current mirror circuit to charge the load capacitance at the input terminal of the sense amplifier, whereby a reference voltage is generated at an intermediate potential of the data line potential corresponding to the stored information.

Figure 35:
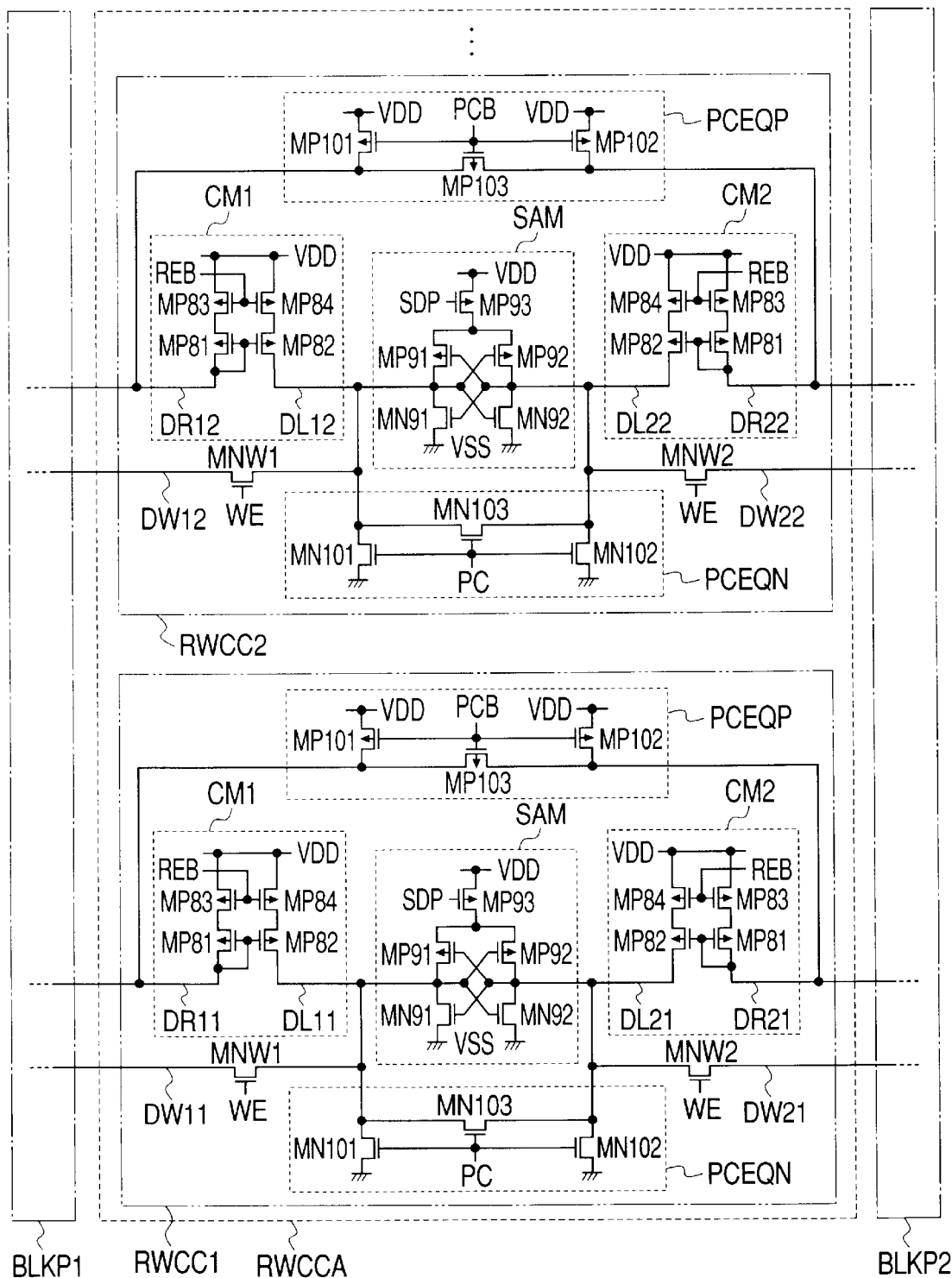
FIG. 35 is a diagram showing configuration of a read/write control circuit of a semiconductor device according to in eighth embodiment of the present invention.

FIG. 35 shows the read/write control circuit RWCC of the embodiment. This figure assumes a case that the read/write control circuit of this embodiment is applied, as one example, to the read/write control circuit in the memory cell array configuration shown in FIG. 29, wherein it is assumed that the read/write control circuit array RWCCA is arranged between the blocks BLKP1 and BLKP2. In the following description, the read/write control circuit RWCC1 connected to the data line pairs (DR11, DW11), (DR21, DW21) will be mainly described.

The read/write control circuit RWCC1 includes current mirror circuits CM1, CM2; a sense amplifier SAM; NMOS transistors MNW1, MNW2; and precharge circuits PCEQP, PCEQN. In this figure, for the sake of clarity, the data line selection circuit YSW shown in FIG. 6 is omitted. In the read/write control circuit RWCC1, the source of the NMOS transistor MNW1 is connected to the write data line DW11 of the block BLKP1 and its drain is connected to the data line DL11. Similarly, the source of the NMOS transistor MNW2 is connected to the write data line DW21 of the block BLKP2 and its drain is connected to the data line DL21.

In the following description, the data lines DL1t and DL2t are applied as one set and expressed as the data line pairs (DL1t, DL2t), where t is 1, 2, ..., m. When the write control signal WE connected to the gates of the NMOS transistors MNW1 and MNW2 is brought into conduction, each of the corresponding write data line pairs (DW1t, DW2t) is connected to the data line pairs (DL1t, DL2t).

Each of the current mirror circuits CM1, CM2 is a current mirror circuit composed of PMOS transistors MP81, MP82. As the read control signal REB is driven to the ground potential VSS, the power supply voltage VDD is supplied to the source of the PMOS transistor through the PMOS transistors MP83, MP84. In this case, it is assumed that the gate sizes of the PMOS transistors MP81, MP82 are the same to each other. In addition, it is assumed that the gate sizes of the PMOS transistors MP83, MP84 are also the same to each other. In the current mirror circuit activated in this way, the current mirror circuit CM1, for example, since the current of the same value as that of the current flowing through the PMOS transistor MP81 is allowed to flow in the data line DR11 through the PMOS transistor MP82, the data line DL11 is electrically charged to a voltage level corresponding to the stored information of the memory cell. In this figure, when the read control signal REB is driven to the power supply voltage VDD to bring the current mirror circuit CM to an OFF-state, each of connected states between the sources of the PMOS transistors MP81, MP82 and the VDD power supply is controlled using the PMOS transistors MP83, MP84 so as not to cause the read data line DR11 and the data line DL11 to short-circuit through the PMOS transistors MP81, MP82.

The sense amplifier SAM is a flip-flop circuit comprised of the PMOS transistors MP91, MP92 and the NMOS transistors MN91, MN92. When the sense amplifier exciting signal SDP is driven to the ground potential VSS, the power supply voltage VDD is supplied to the sources of the PMOS transistors MP91, MP92 through the PMOS transistor MP93. Since the sense amplifier SAM activated in this way may amplify the small potential difference generated at the data line pairs (DL1t, DL2t), it is possible to discriminate the stored information in the memory cell at a high speed. Although described later, since the data line pairs (DL1t, DL2t) are precharged to the ground potential VSS, the inter-gate-source voltage of the NMOS transistors MN91, MN92 during waiting time becomes 0V. Accordingly, the NMOS transistors MN91, MN92 become an OFF-state, the NMOS transistor corresponding to the NMOS transistor MN63 in the sense amplifier shown in FIG. 6 can be eliminated and an area of the sense amplifier SAM can be reduced.

The precharge circuit PCEQN is composed of the NMOS transistors MN101, MN102 and MN103. When the precharge enabling signal PC is driven to the power supply voltage VDD, the data line pairs (DL1t, DL2t) are driven to the ground potential VSS through the transistors MN71, MN72. In addition, it is possible to control the data line pairs (DL1t, DL2t) with the transistor MN103 in such a way that they may have the same potential.

The precharge circuit PCEQP is composed of the PMOS transistors MP101, MP102 and MP103. When the precharge enabling signal PCB is driven to the ground potential VSS, the read line pairs (DR1t, DR2t) are driven to the power supply voltage VDD through the transistors MP71, MP72. In addition, it is possible to control the data line pairs (DR1t, DR2t) to have the same potential with the transistor MP103.

Although not shown in FIG. 35, the sense amplifier exciting signal SDP, the precharge enabling signals PC, PCB, the read control signal REB and the write control signal WE are controlled by the array control circuit. The array control circuit includes an address input signal terminal for selectively controlling the read/write control circuit row RWCCA and an address decoder, wherein the inputted address signal is decoded by the address decoder to generate a decode signal. Each of the sense amplifier signal SDP, the precharge enabling signals PC, PCB, the read control signal REB and the write control signal WE is activated in such a way that the data line pairs (DR, DW) containing the selective memory cell may be specified by the decode signal.

Figure 36:
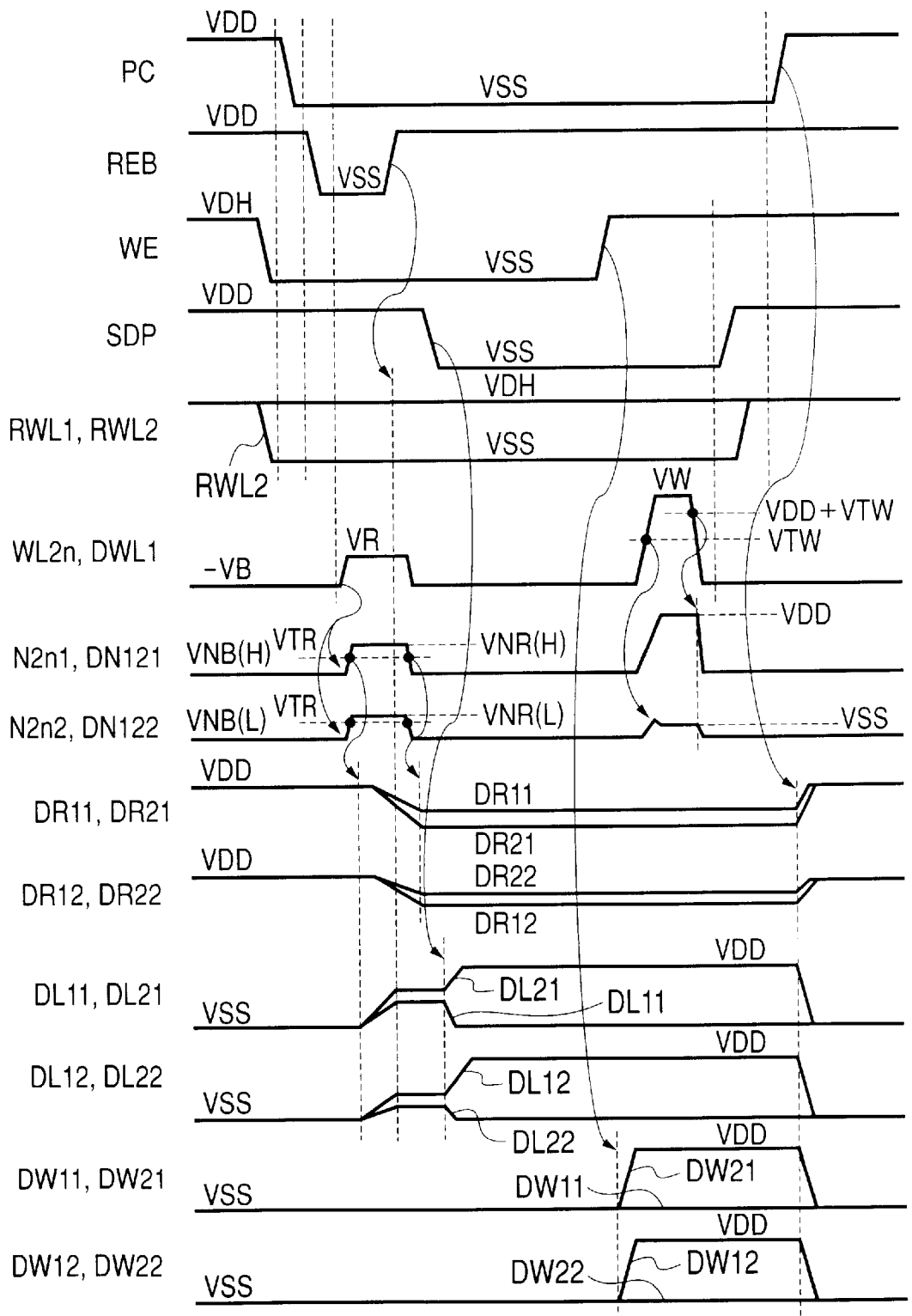
FIG. 36 is a diagram showing operation timing in reading and re-writing in the semiconductor device according to the eighth embodiment of the present invention.

FIG. 36 shows the reading-out operation in the memory cell array configuration in the embodiment. In this figure, the precharge potentials in the data line pairs (DL1t, DL2t) and the write data line DW are set to the ground potential VSS. This setting is carried out for generating a read signal through an electrical charging of the data line pairs (DL1t, DL2t) under application of the current mirror circuit CM having the PMOS transistor configuration. In addition, the precharge potential at the read data line DR is set to the power supply voltage VDD. This setting is carried out for delivering the current corresponding to the driving capability of the read NMOS transistor just after activation of the memory cell. It is assumed that other operating conditions are the same as that of the seventh embodiment and the memory cells MCn1, MCn2 in the block B1KP2 hold the stored information "1", "0", respectively.

In addition, it is assumed that the current flowing in the read NMOS transistor QR when the cell holding the stored information "1" is selected has sufficient low inter-source-drain voltage dependability and this is defined as I(1). Further, the current flowing in the read NMOS transistor QR when the cell holding the stored information "0" is selected is defined as I(0).

A reference voltage generating mechanism will be described in reference to the read/write control circuits RWC1, RWC2 in the read/write control circuit array RWCA on these assumptions.

At first, the control signal RWL2 kept at the boosted voltage VDH is driven to the ground potential VSS to bring the NMOS transistor QSW1 into the OFF-state and further to shut off (DR21, DR22). On the other hand, since the control signal RWL1 is held at the boosted voltage VDH, the NMOS transistor QSW1 is brought into conduction and the read data line pairs (DR11, DR12) are kept in the short-circuited state. Accordingly, the read data line with a data line length of 2:1 is formed.

Then, the write control signal WE kept at the boosted voltage VDH is driven to the ground potential VSS to shut off the write data line pairs (DW11, DW21), (DW12, DW22) and the data line pairs (DL11, DL21), (DL12, DL22), the precharge enabling signal PC kept at the power supply voltage VDD is driven to the ground potential VSS, and the precharge circuit PCEQN is stopped. In this case, since the precharge enabling signal PCB has a complementary relation with PC, it is driven from the ground potential VSS to the power supply voltage VDD and subsequently the precharge circuit PCEQP is stopped.

Further, the read control signal REB kept at the power supply voltage VDD is driven to the ground potential VSS and the current mirror circuit is activated. However, since the read data line DR is precharged to the power supply voltage VDD, the PMOS transistor MP81 in the current mirror circuit CM is not brought into conduction and no current flows in the current mirror circuit CM.

Then, when the dummy word line DWL and the word line WL2n kept at the waiting potential −VB are driven to the read potential VR, and each of the dummy cells DMC1, DMC2 in the block BLKP1 and the memory cells MCn1, MCn2 in the block BLKP2 is activated. In this case, when the read data line DR21 to which the memory cell MCn1 holding the stored information "1" is connected is electrically discharged to cause its potential to decrease, a current flows from the current mirror circuit through the read NMOS transistor QR to the ground potential. Although this current becomes a specified value in response to ON-resistance of the read NMOS transistor as a sufficient time elapses, it is assumed that this value is I(1) on the aforesaid assumption.

Since the data line DL21 is electrically charged with a current flowing through the current mirror circuit CM2 of the read/write control circuit RWCC1, its potential can be expressed as follows:

$$VDL21(t)=[I(1)\times t]/CDl \tag{11}$$

Similarly, the data line DL21 is electrically charged by reading out the memory cell MC2n2 holding the stored information "0" and this potential can be expressed as follows:

$$VDL22(t)=[I(0)\times t]/CDL \tag{12}$$

On the other hand, a current flowing in the ground potential from the read data lines DR11, DR12 short-circuited by the NMOS transistor QSW1 through the read transistor QR of the dummy cell pairs DMCP1 can be expressed as $$ISUM=I(1)+I(0) \tag{13}$$

This current is a sum of currents flowing in each of the PMOS transistors MP83 in the current mirror circuit CM1 in the read/write control circuits RWCC1, RWCC2. In this case, since the same current mirror circuit is used, current having ISUM divided into two segments flows in each of the PMOS transistors MP84 and then each of the data lines DL11, DL12 is electrically charged. Thus, the potentials of the data lines DL11, DL12 can be expressed as follows:

$$\begin{aligned}VREF(t) &= VDL11 \\ &= VDL12 \\ &= [\{(I(1)+I(0)/2\}\times t]/CDL\end{aligned} \tag{14}$$

From the forgoing, an amount of signal when the stored information "1" is read out can be expressed as follows in reference to the equations (11) and (14):

$$\begin{aligned}\Delta(v1(t)) &= VDL21(t) - VREF(t) \\ &= [(I(1)-I(0))\times t]/(2\times CDL)\end{aligned} \tag{15}$$

In turn, an amount of signal when the stored information "0" is read out can be expressed as follows in reference to the equations (12) and (14):

$$\begin{aligned}\Delta(v0(t)) &= VDL22(t) - VREF(t) \\ &= -[(I(1)-I(0))\times t]/(2\times CDL)\end{aligned} \tag{16}$$

Accordingly, a positive or negative reading signal can be obtained in the data line pairs (DL11, DL21), (DL12, DL22).

Then, both an amplifying operation of a reading signal and a rewriting operation for the same will be described below.

At first, the reading control signal REB kept at the ground potential VSS is driven to the power supply voltage VDD at a timing in which a small reading signal indicated in the equations (15), (16) becomes a sufficient high value (about 0.1V in the prior art DRAM, for example). The current mirror circuit becomes off-state, supplying of the power supply voltage VDD is stopped and an electrical charging for the data line pairs is stopped, so that the data line pairs are kept at the potentials indicated in the equations (11), (12).

After this operation, in FIG. 36, the dummy word line DWL1 and the word line WL2n kept at the read potential VR are driven to the waiting potential −VB to bring the read NMOS transistor QR into an off-state. Accordingly, the electrical discharging of the read data line DR is stopped to thereby restrict a consumption current.

Thereafter, the sense amplifier exciting signal SDP kept at the power supply voltage VDD is driven to the ground potential VSS to activate the sense amplifier SAM in the read/write control circuit RWCC in the read/write control circuit array RWCCA and to thereby amplify the read signals generated at the data line pairs (DL11, DL21), (DL12, DL22).

After the reading operation, the write control signal WE kept at the ground potential VSS is driven to a boosted voltage VDH to bring the NMOS transistors MNW1, MNW2 into become conductive and further the write data lines (DW11, DW21), (DW12, DW22) are driven to the potential corresponding to the stored information.

Further, the write transistor QW is brought into conduction while the word line WL2n and the dummy word line DWL1 kept at the waiting potential −VB are being applied as the write potential VW and the original information is written again in the memory cell.

After performing the writing operation, the dummy word line DWL1 and the word line WL2n are driven to the waiting potential −VB, and the sense amplifier exciting signal SDP is driven to the power supply voltage VDD to bring the sense amplifier SAM into a waiting state.

Finally, the switch control line RWL2 kept at the ground potential VSS is driven to the boosted voltage VDH to connect the read line pairs DR21, DR22 to each other, thereafter the precharge enabling signal PCB kept at the power supply voltage VDD is driven to the ground potential VSS, the precharge enable signal PC kept at the ground potential VSS is driven to the power supply voltage VDD, the read data line DR is precharged to the power supply voltage VDD, and the data line pairs (DL1t, DL2t) and the write data line DW are precharged to the ground potential VSS, whereby a series of reading operations is finished.

With the foregoing configuration and operation, the read/write control circuit of the embodiment can obtain the following two effects.

At first, the read data line having twice length is driven using the dummy cell pairs and a small current flowing in each of the read NMOS transistors is received by the two current mirror circuits, whereby each of the two data lines DL (the data lines DL11, DL12 in this case) can be electrically charged with an average current of the drive current corresponding to binary stored information and then the reference voltage can be generated at an intermediate potential of the data line potentials corresponding to the stored information.

Secondly, since the data line DL is driven through the current mirror circuit, the load capacitance of the sense amplifier SAM becomes CDL together and the sense amplifier SAM can amplify the read signal certainly. In addition, in general, the data line DL has a smaller wiring capacitance than that of the read data line DR, so that an electrical charging time and an amplifying time of the data line DL can be shortened.

In the previous embodiments, the operation has been described in which the corresponding write data line pairs (DW1t, DW2t) are connected after amplifying the data line pairs (DL1t, DL2t), and each of them is driven by the sense amplifier SA. However, it is also applicable that each of the NMOS transistors MNW1, MNW2 is removed and the data line pairs (DL1t, DL2t) and the corresponding write data lines (DW1t, DW2t) are short-circuited and they are concurrently amplified and driven. In this case, since it is possible to eliminate time required for bringing the NMOS transistors MNW1, MNW2 into conduction, it is possible to shorten the time required for performing a re-writing operation.

In the foregoing description, the embodiment has been described under application of the memory cell array shown in FIG. 29. However, this embodiment can be applied to various types of memory cell arrays. For example, it can be expressed from the seventh embodiment that the present embodiment can be applied to the memory cell array shown in FIG. 33 which is the modification shown in FIG. 29.

In addition, it can be expressed that the present embodiment can be applied to the memory cell array shown in FIG. 26 or FIG. 27 of the example 6 if a relation of I(0)=0 is set in the equations (12) to (16).

Further, the read/write control circuit RWCC of the embodiment can be applied to the memory cell array shown in FIGS. 1 and 5 of the first embodiment for generating the reference voltage under application of the driving current difference or the memory cell array shown in FIG. 11 of the second embodiment while the gate length of the read NMOS transistor in the dummy cell is being twice that of the memory cell.

<Embodiment 9>

In this embodiment, configuration and operation of another memory cell array will be described. The embodiment is characterized in that a reference voltage is generated at an intermediate potential of the data line potential corresponding to the stored information under application of the dummy cell pairs connected in parallel with the read data line and further under application of the current mirror circuit having a different mirror ratio. These two configurations will be described in sequence.

Figure 37:
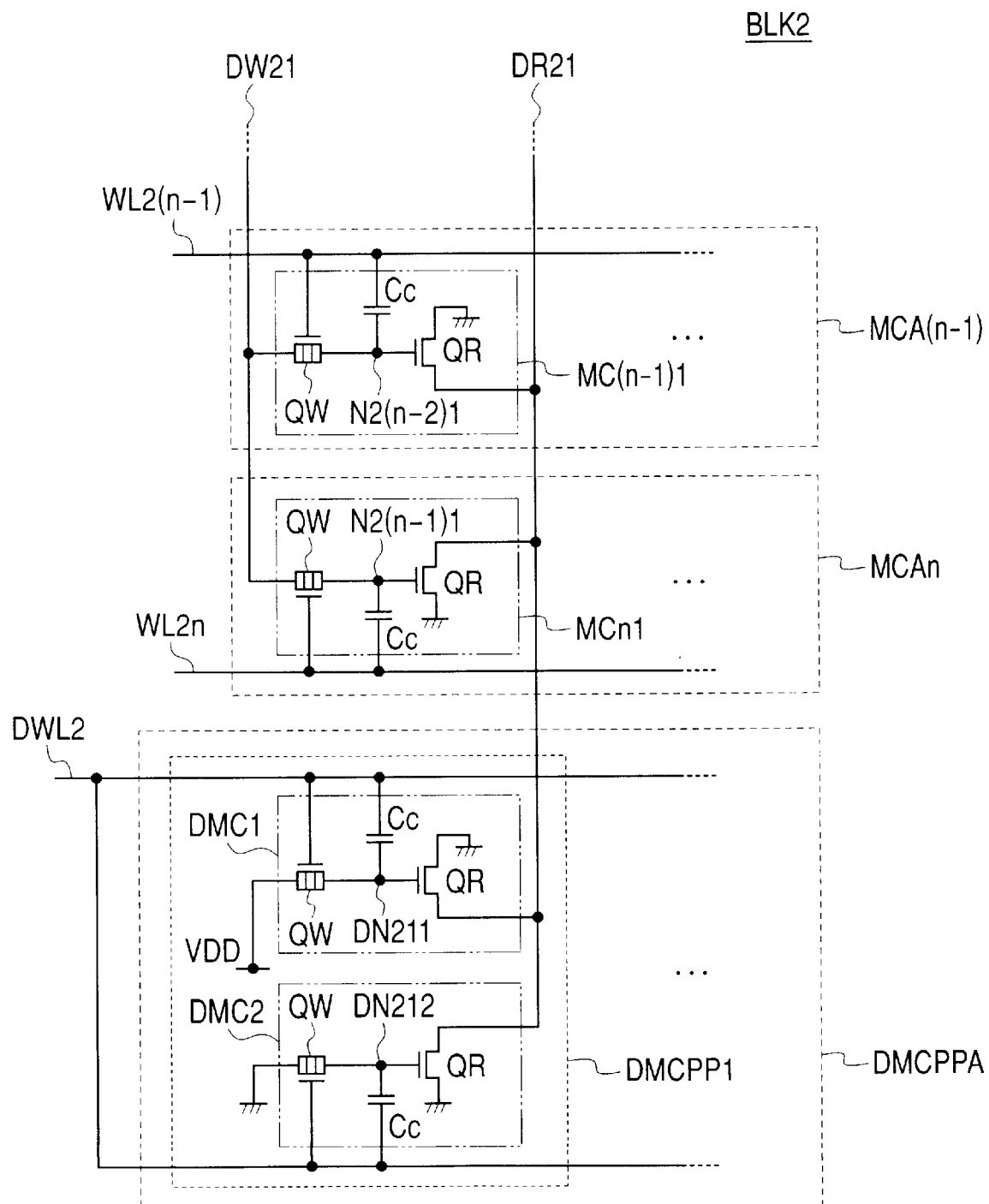
FIG. 37 is a circuit diagram of configuration of memory cells and dummy cells in a memory cell array of a semiconductor device according to ninth embodiment of the present invention.

At first, the dummy cell pairs of this embodiment will be described. A block diagram of the memory cell array of the embodiment can be expressed by FIG. 1. Although reference character DC in this figure denotes a dummy cell in which two memory cells are connected in series in the first embodiment, the reference character DC in this embodiment denotes the dummy cell pairs. As one example of this modification, the memory cell and the dummy cell pairs in the block BLK2 are shown in FIG. 37. In FIG. 30 showing the seventh embodiment, each of the dummy cells holding the stored information "1", "0" constituting the dummy cell pairs is connected to the different read data line, whereas in this embodiment, each of the dummy cells is connected to the same read data line.

Figure 38:
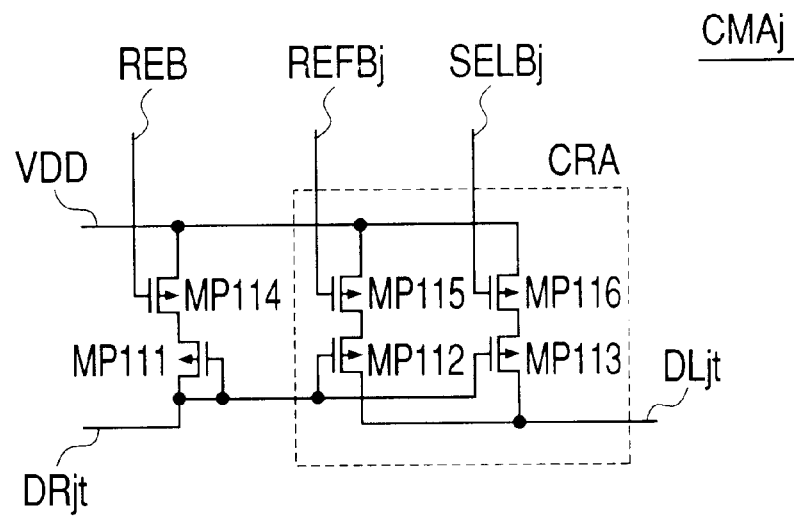
FIG. 38 is a diagram of configuration of a current mirror circuit used for the semiconductor device according to the ninth embodiment of the present invention.

Then, a current mirror circuit of this embodiment will be described. FIG. 38 shows a current mirror circuit CMAj of this embodiment. In this embodiment, the current mirror circuit CMAj is applied to the read/write control circuit RWCC shown in FIG. 35 and further this read/write control circuit RWCC is applied to the memory cell array shown in FIG. 1.

In this figure, MP111, MP112 and MP113 denote PMOS transistors for delivering current and these gate widths are designed to have a relation of 2:1:2. Gate and drain of the PMOS transistor MP111 are connected and they are connected to each of the gates of the PMOS transistors MP112, MP113 and the read data line DRjt (j=1, 2, wherein this number indicates the number of the block BLK. Further, t=1, 2, . . . , m, and this number denotes the column number in the memory cell array).

The control signals REFBj, SEBj are connected to the gates of the PMOS transistors MP115, MP116 to control supplying of the power supply voltage VDD. Each of the drains of the PMOS transistors MP115, MP116 is connected to a data line DLjt. The gate widths of the PMOS transistors MP114, MP115, MP116 are also designed to have a relation of 2:1:2. Accordingly, as current flows in the PMOS transistor MP111, current corresponding to the potentials of the control signals REFBj, SEBj and the gate sizes of the transistors MP112, MP113 flow in the current control part CRA and the data line DLjt is electrically charged.

Although not shown in FIG. 38, the read control signal REB, the control signals REFBj, SEBj are controlled by the array control circuit. The array control circuit is composed of address input signal terminals and an address decoder, wherein the inputted address signal is decoded by the address decoder and a decode signal is generated. Each of the read control signal REB and the control signals REFBj, SEBj is activated to specify the data line pairs (DR, DW) containing the memory cell therein.

Reading operation in the memory cell array in the embodiment configured as above will be described. The assumption used in the seventh embodiment is basically applied to this embodiment, the dummy cell pairs connected to the read data line DR11 in the block BLK1 are driven and the stored information in the memory cell connected to the read data line DR21 in the block BLK2 is read out.

In the current mirror circuit CMA1, the control signal REFB1 kept at the power supply voltage VDD is driven to the ground potential VSS together with the read control signal REB in a state in which the control signal SELB1 is held at the power supply voltage VDD. Then, a current mirror circuit with a mirror ratio of 2:1 is formed at the PMOS transistors MP111, MP112, and the data line DL1t is electrically charged with a current value of $(I(1)+I(0))/2$.

On the other hand, in the current mirror circuit CMA2, the control signal SELB 2 kept at the power supply voltage VDD is driven to the ground potential VSS together with the read control signal REB in a state in which the control signal REFB2 is held at the power supply voltage VDD. Then, a current mirror circuit with a mirror ratio of 1:1 is formed at the PMOS transistors MP111, MP113, and the data line DL2t is electrically charged with a current value of $I(1)$ or $I(0)$ corresponding to the stored information in the memory cell. Accordingly, the read signal indicated in the equation (15) and the equation (16) is generated.

With the configuration, it is possible to generate a reference voltage to the intermediate potential of the data line potential corresponding to the stored information and to perform an accurate reading of the stored information by using dummy cell pairs connected in parallel with the read data line and further by using the current mirror circuit having a different mirror ratio.

Up to now in the specification, the configuration using the dummy cell pairs has been described on an assumption that the read NMOS transistor in the memory cell holding the stored information "0" is brought into conduction. However, the current mirror circuit of the embodiment is also applicable to the case where the threshold voltage variations in the read NMOS transistor are small and the read NMOS transistor in the memory cell holding the stored information "0" is kept in its off-state. In this case, it can be described that a similar effect can be obtained on an assumption that the dummy cell has the same configuration as that of the memory cell to hold the stored information "1" and a relation of I(0)=0 is applied in the equation (15) and the equation (16). In accordance with this description, it is also possible to apply the structure shown in FIG. 19 to the memory cell.

Figure 39:
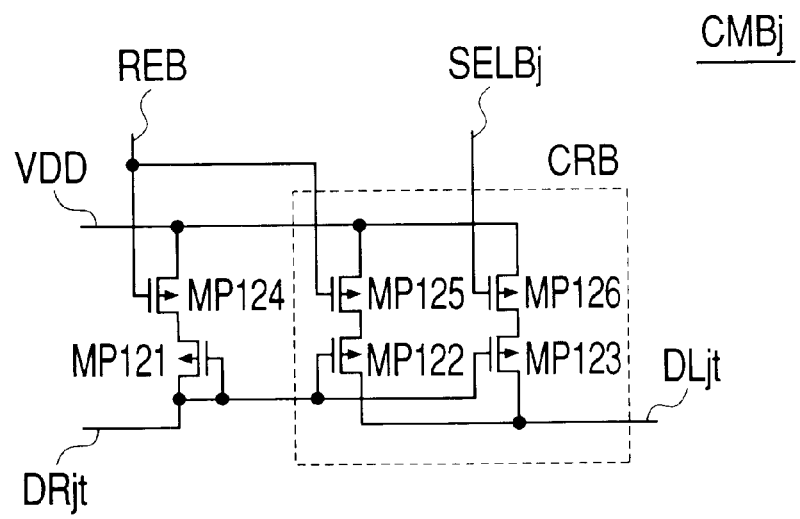
FIG. 39 is a diagram of another configuration of a current mirror circuit used for the semiconductor device according to the ninth embodiment of the present invention.

Further, the current mirror circuit is not limited to that shown in FIG. 38, but various kinds of configuration can be obtained. As one example, in FIG. 39 is shown a current mirror circuit CMBj. MP121, MP122 and MP123 denote PMOS transistors for delivering current and their gate widths are designed to have a relation of 2:1:1. The gate and the drain of the PMOS transistor MP121 are connected to each other, in which they are connected to each of the gates of MP122, MP123 and the read data line DRjt, wherein j=1, 2 indicating the number of block BLK, and t=1, 2, ..., m is applied to denote the column number in the memory cell array.

The read/write control signal REB is connected to each of the gates of PMOS transistors MP124, MP125 and the control signal SELBj is connected to each of the gates of PMOS transistor MP126 so as to control supplying of the power supply voltage VDD. Each of the drains of PMOS transistors MP125, MP126 is connected to the data line DLjt, and the gate widths of PMOS transistors MP124, MP125 and MP126 are also designed to have a relation of 2:1:1. Accordingly, as current flows in PMOS transistor MP121, current corresponding to the number of current paths controlled under the potentials of the read control signal REB and the control signal SELBj flows in the current control part CRB and the data line DLjt is electrically charged. That is, as the control signal REB kept at the power supply voltage VDD is driven to the ground potential VSS in a state in which the control signal SELBj is kept at the power supply voltage VDD, a current mirror circuit with a mirror ratio of 2:1 is formed at the PMOS transistors MP121, MP122.

On the other hand, when the control signal SELBj kept at the power supply voltage VDD is driven to the ground potential VSS together with the read control signal REB, a current mirror circuit with a mirror ratio of 2:1:1 is formed at PMOS transistors MP121, MP122, MP123.

With the configuration, the control signal REFBj can be eliminated as compared with the configuration shown in FIG. 38 and further a layout area can be reduced in correspondence with a small size of PMOS transistors MP123, MP126.

With the foregoing, although some preferred embodiments of the present invention have been described, it is of course apparent that the present invention is not limited to the aforesaid examples of the preferred embodiments and various kinds of modification in design can be carried out within a scope not departing from the spirit of the present invention. For example, although an open data-line structure has been described in reference to the embodiments, a folded data-line structure can be provided. It may also be applicable that the data line connected to the capacitance coupled type two-transistor cells has common reading action and writing operation. In addition, the write transistor QW in the memory cell which has been described up to now in this specification is not limited to the transistor utilizing a tunnel effect indicated in FIG. 3, but all the types of transistor where conductive charge is electron as represented in the normal NMOS transistor, for example.

As apparent from the aforesaid embodiments, according to the present invention, it is possible to provide a semiconductor device capable of reading out stored information held in each of the memory cell arrays in the memory cell array constituted by the memory cells having amplifying action by generating a positive or negative minimum signal difference at the read data line pairs. That is, DRAM of an open data-line structure using the gain cell can be realized.

What is claimed is:

1. A semiconductor device comprising:
   a plurality of data lines;
   a plurality of word lines crossing said data lines;
   dummy word lines crossing with said data lines;
   a memory cell array including a plurality of memory cells arranged at cross-points of said plurality of word lines and data lines;
   dummy cells arranged at cross-points of said dummy word lines and said data lines; and
   a sense amplifier connected to said data lines;
   wherein said memory cell requires a refreshing operation, and said memory cell array is arranged between said dummy cells and said sense amplifier.

2. A semiconductor device according to claim 1, wherein said data line includes a read data line and a write data line, and said dummy cell is arranged for every said read data line.

3. A semiconductor device according to claim 1, wherein
   said memory cell includes a read MOS transistor and a write MOS transistor;
   said dummy cell includes a dummy read MOS transistor and a dummy write MOS transistor; and
   a resistance value in a source-drain path of the read MOS transistor in said dummy cell is substantially twice of a resistance value of a source-drain path of the read MOS transistor in said memory cell.

4. A semiconductor device according to claim 3, wherein the write MOS transistor in said memory cell has at least one-layer insulation film capable of flowing a tunnel current in a channel region.

5. A semiconductor device according to claim 3, wherein a voltage in the source-drain path in said dummy cell is a reference voltage for reading out a signal stored in said memory cell.

6. A semiconductor device according to claim 1, wherein said memory cell includes a read MOS transistor and a write MOS transistor;
   said dummy cell includes a dummy read MOS transistor and a dummy write MOS transistor;
   a current mirror circuit with a different mirror ratio for receiving a current flowing in the read MOS transistor of each of said dummy cell and said memory cell when read out and for electrically charging an input terminal of said sense amplifier is arranged between said sense amplifier and said data line.

7. A semiconductor device according to claim 1, wherein said memory cell has a size of area in a range of $4F^2$ to $8F^2$ when a feature size is defined as F.

8. A semiconductor device according to claim 1, wherein said memory cell has a size of area in a range of $4F^2$ to $6F^2$ when a feature size is defined as F.

9. A semiconductor device comprising:
   a plurality of data lines where a first data line and a second data line are alternately arranged;
   a plurality of word lines crossing with said plurality of data lines;
   a first dummy word line crossing said first data line;

a second dummy word line crossing said second data line;

a memory cell array including a plurality of memory cells arranged at cross-points of said plurality of word lines and said plurality of data lines;

a first dummy cell arranged at a cross-point of said first dummy word line and said first data line;

a second dummy cell arranged at a cross-point of said second dummy word line and said second data line;

a first sense amplifier connected to said first data line;

a second sense amplifier connected to said second data line; and wherein said memory cell requires a refreshing operation;

said memory cell array is arranged between said dummy cell and said sense amplifier, said first dummy word line is arranged at one end of said memory cell array, and said second dummy word line is arranged at the other end of said memory cell array; and said first sense amplifier is arranged at the other end of said memory cell array and said second sense amplifier is arranged at one end of said memory cell array.

10. A semiconductor device according to claim 9, wherein said memory cell includes a read MOS transistor and a write MOS transistor;

said first and second data lines are a read data line and a write data line, respectively;

each of said first and second dummy cells is arranged for every said read data line and each of them includes a dummy read MOS transistor and a dummy write MOS transistor;

a resistance value in each of source-drain paths of said first and second dummy cell read MOS transistors is substantially twice a resistance value of a source-drain path of the read MOS transistor in said memory cell.

11. A semiconductor device according to claim 10, wherein the write MOS transistor of said memory cell has at least one layer insulation film capable of flowing a tunnel current to a channel region.

12. A semiconductor device comprising:

a plurality of data lines where a first data line and a second data line are alternately arranged;

a read data line connecting switch for connecting between said first and second data lines adjoining to each other;

a switch control line crossing said first data line to control said read data line connecting switch;

a plurality of word lines crossing said plurality of data lines;

a dummy word line crossing said first data line;

a memory cell array including a plurality of memory cells arranged at cross-points of said plurality of word lines and said plurality of data lines;

a dummy cell arranged at a cross-point of said dummy word line and said first data line;

a first sense amplifier connected to said first data line; and a second sense amplifier connected to said second data line;

wherein said memory cell requires refreshing operation; and said memory cell array is arranged between said dummy cell and said first sense amplifier, said dummy word line and said second sense amplifier are arranged at one end of said memory cell array, and said read data line connecting switch is arranged at the other end of said memory cell array.

13. A semiconductor device according to claim 12, wherein said memory cell includes a read MOS transistor and a write MOS transistor;

said first and second data lines are a read data line and a write data line, respectively; and said dummy cell is arranged for every said first read data line and includes a dummy read MOS transistor and a dummy write MOS transistor having the substantial same size and same configuration as those of said memory cell.

14. A semiconductor device according to claim 13, wherein the write MOS transistor in said memory cell has at least one layer insulating film capable of flowing a tunnel current in a channel region.

15. A semiconductor device comprising:

a plurality of data lines;

a plurality of read data line connecting switches for connecting adjoining data lines of said plurality of data lines;

a switch control line crossing said data line to control said read data line connecting switch;

a plurality of word lines crossing said data lines;

a dummy word line crossing said data line ;

a memory cell array including a plurality of memory cells arranged at cross-points of said plurality of word lines and said plurality of data lines;

dummy cells arranged at cross-points of said dummy word line and said plurality of data lines;

a sense amplifier connected to said data line;

wherein said memory cell requires refreshing operation; and said memory cell array is arranged between said dummy cell and said sense amplifier, said dummy word line is arranged at one end of said memory cell array, and said read data line connecting switch is arranged at the other end of said memory cell array.

16. A semiconductor device according to claim 15, wherein said memory cell includes a read MOS transistor and a write MOS transistor;

each of said data lines includes a read data line and a write data line; and said dummy cell is arranged for every said read data line and includes a dummy read MOS transistor and a dummy write MOS transistor having the substantial same size and same configuration as those of said memory cell.

17. A semiconductor device according to claim 16, wherein a current mirror circuit for receiving a current flowed in the read MOS transistor of each of said dummy cell and said memory cell connected through said read data line connecting switch when read out is arranged between said sense amplifier and said data line.

18. A semiconductor device according to claim 16, wherein the write MOS transistor in said memory cell has at least one layer insulating film capable of flowing a tunnel current in a channel region.

* * * * *